US010310150B2

(12) United States Patent
Sugiyama et al.

(10) Patent No.: US 10,310,150 B2
(45) Date of Patent: Jun. 4, 2019

(54) NEAR-INFRARED CUT FILTER AND SOLID-STATE IMAGING DEVICE

(71) Applicant: AGC Inc., Chiyoda-ku (JP)

(72) Inventors: Takashi Sugiyama, Koriyama (JP); Katsumasa Hosoi, Koriyama (JP); Atsushi Komori, Koriyama (JP); Yoshiharu Ooi, Chiyoda-ku (JP); Makoto Hasegawa, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 307 days.

(21) Appl. No.: 15/279,688

(22) Filed: Sep. 29, 2016

(65) Prior Publication Data

US 2017/0017023 A1 Jan. 19, 2017

Related U.S. Application Data

(63) Continuation of application No. PCT/JP2016/051020, filed on Jan. 14, 2016.

(30) Foreign Application Priority Data

Jan. 14, 2015 (JP) .................................. 2015-005382
May 29, 2015 (JP) .................................. 2015-110617

(Continued)

(51) Int. Cl.
*G02B 5/20* (2006.01)
*G02B 5/26* (2006.01)
(Continued)

(52) U.S. Cl.
CPC ............. *G02B 5/208* (2013.01); *G02B 5/223* (2013.01); *G02B 5/226* (2013.01); *G02B 5/26* (2013.01);
(Continued)

(58) Field of Classification Search
CPC .......... G02B 5/208; G02B 1/04; G02B 5/223; G02B 5/226; G02B 5/281; G02B 5/0833;
(Continued)

(56) References Cited

U.S. PATENT DOCUMENTS 4,333,983 A * 6/1982 Allen ................. B29D 11/0073
428/336
5,282,084 A * 1/1994 Hatano .................. G02B 1/116
359/360

(Continued)

FOREIGN PATENT DOCUMENTS

CN 102985856 A 3/2013
CN 104204873 A 12/2014
(Continued)

OTHER PUBLICATIONS

International Search Report dated Apr. 19, 2016 in PCT/JP2016/051020, filed on Jan. 14, 2016 ( with English Translation).
(Continued)

*Primary Examiner* — William R Alexander
*Assistant Examiner* — Balram T Parbadia
(74) *Attorney, Agent, or Firm* — Oblon, McClelland, Maier & Neustadt, L.L.P.

(57) ABSTRACT

There are provided a near-infrared cut filter having a sufficient near-infrared blocking property and being capable of reducing or preventing, in a solid-state imaging device using the near-infrared cut filter, occurrence of a phenomenon that an object which did not exist on the original subject appears in a taken image, and also a highly sensitive solid-state imaging device having the near-infrared cut filter. A near-infrared cut filter includes a stack having a near-infrared absorbing glass substrate and a near-infrared absorbing layer containing a near-infrared absorbing dye and a transparent resin on at least one main surface of the near-infrared
(Continued)

absorbing glass substrate, and a dielectric multilayer film formed on at least one main surface of the stack, wherein maximum transmittance at an incident angle of 31 to 60 degrees with respect to light with a wavelength of from 775 to 900 nm is 50% or less.

19 Claims, 10 Drawing Sheets

(30) Foreign Application Priority Data

Jul. 15, 2015 (JP) ................................. 2015-141205
Oct. 27, 2015 (JP) ................................. 2015-210820

(51) Int. Cl.
*G02B 5/22* (2006.01)
*G02B 5/28* (2006.01)
*H01L 27/146* (2006.01)

(52) U.S. Cl.
CPC ........ *G02B 5/281* (2013.01); *H01L 27/14618* (2013.01); *H01L 27/14625* (2013.01)

(58) Field of Classification Search
CPC ... G02B 5/22; G02B 5/26; G02B 5/28; G02B 5/282; G02B 5/20; H01L 31/02162; H04N 5/335; C03C 2204/00; C03C 2217/70
See application file for complete search history.

(56) References Cited

U.S. PATENT DOCUMENTS

| | | | |
|---|---|---|---|
| 8,159,596 B2 | 4/2012 | Yamano | |
| 8,693,089 B2 | 4/2014 | Saitoh et al. | |
| 2004/0033640 A1* | 2/2004 | Izumi | H01L 27/1462 438/59 |
| 2009/0136730 A1* | 5/2009 | Nakano | C08K 3/38 428/220 |
| 2009/0294634 A1* | 12/2009 | Kurahashi | G03B 11/00 250/208.1 |
| 2012/0145901 A1* | 6/2012 | Kakiuchi | G02B 5/208 250/330 |
| 2012/0243077 A1* | 9/2012 | Osawa | G02B 3/0056 359/356 |
| 2012/0251803 A1* | 10/2012 | Shibuya | G02B 1/11 428/212 |
| 2013/0094075 A1 | 4/2013 | Saitoh et al. | |
| 2014/0063597 A1 | 3/2014 | Shimmo et al. | |
| 2014/0091419 A1 | 4/2014 | Hasegawa et al. | |
| 2014/0264202 A1* | 9/2014 | Nagaya | G02B 5/208 252/587 |
| 2015/0085354 A1 | 3/2015 | Tatemura | |
| 2015/0146057 A1 | 5/2015 | Konishi et al. | |
| 2015/0293284 A1 | 10/2015 | Tatemura | |
| 2016/0011348 A1 | 1/2016 | Hirakoso et al. | |

FOREIGN PATENT DOCUMENTS

| | | |
|---|---|---|
| CN | 104755969 A | 7/2015 |
| CN | 104871047 A | 8/2015 |
| EP | 2 584 385 A1 | 4/2013 |
| JP | 5-313111 A | 11/1993 |
| JP | 2006-106570 | 4/2006 |
| JP | 2006-301489 | 11/2006 |
| JP | 2008-51985 | 3/2008 |
| JP | 2008-181028 | 8/2008 |
| JP | 2011-100084 | 5/2011 |
| JP | 2012-103340 | 5/2012 |
| JP | 2012-137645 | 7/2012 |
| JP | 2012-137646 | 7/2012 |
| JP | 2012-137647 | 7/2012 |
| JP | 2012-137648 | 7/2012 |
| JP | 2012-137649 | 7/2012 |
| JP | 2012-137650 | 7/2012 |
| JP | 2012-137651 | 7/2012 |
| JP | 5013022 | 8/2012 |
| JP | 2013-50593 A | 3/2013 |
| JP | 2013-178338 A | 9/2013 |
| JP | 2013-190553 | 9/2013 |
| JP | 2014-048402 | 3/2014 |
| JP | 2014-59550 | 4/2014 |
| JP | 2014-126642 | 7/2014 |
| JP | 2014-177365 A | 9/2014 |
| JP | 5617063 | 10/2014 |
| KR | 10-2013-0018803 | 2/2013 |
| KR | 10-2015-0046016 | 4/2015 |
| KR | 10-2015-0100618 | 9/2015 |
| TW | 201224533 A1 | 6/2012 |
| WO | WO 2011/158635 A1 | 12/2011 |
| WO | WO 2013/054864 A1 | 4/2013 |
| WO | WO 2013/183557 A1 | 12/2013 |
| WO | WO 2014/002864 A1 | 1/2014 |
| WO | WO 2014/030628 A1 | 2/2014 |
| WO | WO 2014/088063 A1 | 6/2014 |
| WO | WO 2014/104370 A1 | 7/2014 |
| WO | WO 2014/163405 A1 | 10/2014 |
| WO | WO 2014/168189 A1 | 10/2014 |
| WO | WO 2014/192714 A1 | 12/2014 |
| WO | WO 2014/192715 A1 | 12/2014 |
| WO | WO 2015/022892 A1 | 2/2015 |
| WO | WO 2015/034211 A1 | 3/2015 |
| WO | WO 2015/034217 A1 | 3/2015 |
| WO | WO 2015/099060 A1 | 7/2015 |
| WO | WO 2015/122595 A1 | 8/2015 |

OTHER PUBLICATIONS

Written Opinion dated Apr. 19, 2016 in PCT/JP2016/051020, filed on Jan. 14, 2016.
Office Action dated Nov. 7, 2016 in Korean Patent Application No. 10-2016-7020557.
Office Action dated Mar. 16, 2017 in Korean Patent Application No. 10-2016-7020557 (with English language translation).

\* cited by examiner

NEAR-INFRARED CUT FILTER AND SOLID-STATE IMAGING DEVICE

CROSS REFERENCE TO RELATED APPLICATION

This application is a continuation of prior International Application No. PCT/JP2016/051020, filed on Jan. 14, 2016 which is based upon and claims the benefit of priority from Japanese Patent Applications No. 2015-005382, filed on Jan. 14, 2015, No. 2015-110617, filed on May 29, 2015, No. 2015-141205, filed on Jul. 15, 2015 and No. 2015-210820, filed on Oct. 27, 2015; the entire contents of all of which are incorporated herein by reference.

FIELD

The present invention relates to a near-infrared cut filter having a near-infrared blocking effect and a solid-state imaging device having the near-infrared cut filter.

BACKGROUND ART

In late years, optical filters which sufficiently transmit light in a visible wavelength region and block light in a near-infrared region have been used for various purposes.

For example, a solid-state image sensing device (such as CCD or CMOS) is used in an imaging device, such as a digital still camera. In order to make the sensitivity of the solid-state image sensor close to the visibility of a human, an optical filter is disposed between an imaging lens and the solid-state image sensing device.

As optical filters for imaging devices, a near-infrared absorbing glass and a glass filter using the glass have been known, in which a CuO or the like is added to a fluoro-phosphate-based glass or a phosphate-based glass so as to enable selective absorption of light in the near-infrared wavelength region (hereinafter referred to as "near-infrared light"). However, a glass filter of light-absorbing type has insufficient performance of blocking the near-infrared light and an insufficient transmitting property in a wavelength band (630 to 700 nm) needed for imaging a dark part brighter. Moreover, it also has a constraint in formation of layers as to not inhibit the function of a solid-state image sensing device. Thus, in the current situation, an optical filter having a sufficient near-infrared cut filter function has not been obtained.

Accordingly, in order to solve the above-described problems, there have been developed, for example, a reflective-type interference filter in which an $SiO_2$ layer and a $TiO_2$ layer are stacked alternately on a s substrate so as to block the near-infrared light by reflection by interference of light, a film containing a dye which absorbs the near-infrared light in a transparent resin, and the like. Further, by combining the interference filter and the film, there has been developed an optical filter in which a resin layer containing a dye which absorbs near-infrared rays and a layer which reflects the near-infrared rays are stacked.

Among the above-described optical filters, a near-infrared cut filter in which a transparent resin layer containing a near-infrared absorbing dye and a near-infrared reflecting dielectric multilayer film are provided on a substrate constituted of the near-infrared absorbing glass is known to have a quite high near-infrared cut function. However, when a solid-state imaging device using this near-infrared cut filter is used to image a subject partially containing a very bright light source, an object which did not exist on the original subject may appear in a portion of the taken image, and the appearance of this object is a problem in the solid-state imaging device which is required to have higher precision of reproducibility of a subject image. This phenomenon is due to stray light which occurred by reflection or scattering in the optical system of the solid-state imaging device, and it is conceivable that all the stray lights incident at various angles affect the near-infrared cut filter.

However, in the design of the optical system of the conventional solid-state imaging device, only transmittance at up to about 30 degrees at most is considered as the incident angle of light to be incident on the near-infrared cut filter from a designed optical path. As the near-infrared cut filter having a similar structure, for example, there are only near-infrared cut filters in which, as the incident angle of light, only 0 degree and 30 degrees are considered (Patent Reference 1 (International Publication No. WO2014/030628)), or only 0 degree and 26 degrees are considered (Patent Reference 2 (International Publication No. WO2014/168189)). In other words, with respect to the stray light incident at various angles, although a relatively small range of incident angles is considered, there has been no attempt to effectively obtain imaging with high precision by considering a larger incident angle.

SUMMARY

It is an object of the present invention to provide a near-infrared cut filter having a sufficient near-infrared blocking property and being capable of reducing or preventing, in a solid-state imaging device using the near-infrared cut filter, occurrence of a phenomenon that an object which did not exist on the original subject appears in a taken image, and also to provide a highly sensitive solid-state imaging device having the near-infrared cut filter.

The present invention provides a near-infrared cut filter and a solid-state imaging device having following structures.

A near-infrared cut filter including a stack having a near-infrared absorbing glass substrate and a near-infrared absorbing layer containing a near-infrared absorbing dye and a transparent resin on at least one main surface of the near-infrared absorbing glass substrate, and a dielectric multilayer film on at least one main surface of the stack, wherein maximum transmittance at an incident angle of 31 to 60 degrees with respect to light with a wavelength of from 775 to 900 nm is 50% or less.

A solid-state imaging device having the near-infrared cut filter and an optical member including a solid-state image sensing device, wherein the near-infrared cut filter and the solid-state image sensing device are disposed in order from a subject side or a side through which light of a light source enters.

According to the present invention, a near-infrared cut filter having a sufficient near-infrared blocking property and being capable of reducing or preventing, in a solid-state imaging device using the near-infrared cut filter, occurrence of a phenomenon that an object which did not exist on the original subject appears in a taken image, and also a highly sensitive solid-state imaging device having the near-infrared cut filter can be provided.

DETAILED DESCRIPTION

Figure 1:
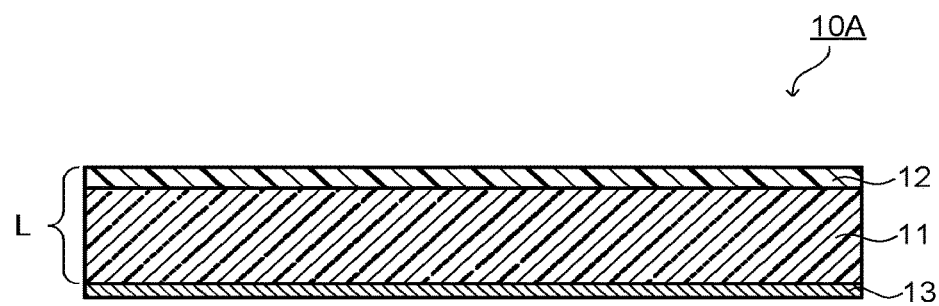
FIG. 1 is a cross-sectional view schematically illustrating an example of a near-infrared cut filter according to an embodiment of the present invention.

An embodiment of the present invention will be explained below.

[Near-Infrared Cut Filter]

A near-infrared cut filter according to the present invention (hereinafter also referred to as an NIR filter) has a stack having a near-infrared absorbing glass substrate and a near-infrared absorbing layer containing a near-infrared absorbing dye and a transparent resin on at least one main surface of the near-infrared absorbing glass substrate, and a dielectric multilayer film formed on at least one main surface of the stack.

Having the near-infrared absorbing layer on a main surface of the near-infrared absorbing glass substrate means that, as long as it is above the main surface, the near-infrared absorbing layer need not always be in the form in contact with the main surface. That is, another member may exist between the main surface and the near-infrared absorbing layer, and further a space may exist therebetween. Similarly, having the dielectric multilayer film on a main surface of the stack means that the dielectric multilayer film need not always be provided in the form in contact with the main surface.

This NIR filter has maximum transmittance of 50% or less at an incident angle of 31 to 60 degrees with respect to light with a wavelength of from 775 to 900 nm. The maximum transmittance with this wavelength and at this incident angle are preferred to be low for suppressing causes of occurrence of stray light, in-plane unevenness of color or intensity, and the like. Here, in the NIR filter, the maximum transmittance at an incident angle of 31 to 60 degrees with respect to light with a wavelength of from 775 to 900 nm is preferably 30% or less, more preferably 10% or less, furthermore preferably 5% or less, furthermore preferably 3% or less, furthermore preferably 1% or less, furthermore preferably 0.5% or less, furthermore preferably 0.3% or less, particularly preferably 0.2% or less. Note that the requirement mentioned here "maximum transmittance of 50% or less at an incident angle of 31 to 60 degrees with respect to light with a wavelength of from 775 to 900 nm is 50% or less" (called "requirement A") is construed as including the following cases.

Specifically, even when having a wavelength with which the maximum transmittance of light with a wavelength of from 775 to 900 nm incident at 31 to 60 degrees exceeds 50%, the "requirement A" is satisfied if a full width at half maximum wavelength including this wavelength is 1 nm or less. Further, even when having a wavelength with which the maximum transmittance exceeds 50% due to the incident angle in the range of 31 to 60 degrees, the "requirement A" is satisfied if a full width at half maximum incident angle including this incident angle is 0.5 degree or less. For example, when the average transmittance of light in each of any 10-nm bands of the wavelength of from 775 to 900 nm is obtained, and the maximum transmittance is obtained from plural values obtained, the "requirement A" is satisfied if the maximum transmittance is 50% or less. Further, for example, when the average transmittance of light in each of any one-degree angle ranges of 31 to 60 degrees is obtained, and the maximum transmittance is obtained from plural values obtained, the "requirement A" is satisfied if the maximum transmittance is 50% or less. When the "requirement A" is satisfied, it can be said that a cause of image deterioration cannot easily occur. Note that when the full width at half maximum wavelength is 1 nm or less, and the full width at half maximum incident angle is 0.5 degree or less in the light with a wavelength of from 775 to 900 nm, the maximum transmittance is more preferably 50% or less.

Further, when a requirement "the maximum transmittance at an incident angle of 31 to 60 degrees with respect to light with a wavelength of from 775 to 900 nm is X % or less" is employed (hereinafter called "requirement X"), X is 50, but is given as a value preferred in the order of 30, 10, 5, 3, 1, 0.5, 0.3 and 0.2 as above, specific examples being given below. For example, when the "requirement X" is X=1 in the "requirement X", even when having a wavelength with which the maximum transmittance at incident angles of 31 to 60 degrees in the light with a wavelength of from 775 to 900 nm exceeds 1% (over X %), the above "requirement X" is satisfied if the full width at half maximum wavelength including this wavelength is 1 nm or less. Moreover, given X=1, for example, when the average transmittance of light in each of any 10-nm bands at incident angles of 31 to 60 degrees in the light with a wavelength of from 775 to 900 nm is obtained, and the maximum transmittance is obtained from plural values obtained, the "requirement X" is satisfied if the maximum transmittance is 1% or less (X % or less). Further, given X=1, for example, when the average transmittance of light in each of any one-degree angle ranges of incident angles of 31 to 60 degrees in the light with a wavelength of from 775 to 900 nm is obtained, and the maximum transmittance is obtained from plural values obtained, the "requirement X" is satisfied if the maximum transmittance is 1% or less (X % or less). That is, the NIR filter according to the present invention is given a preferred specification in steps according to the value of X.

Regarding optical properties of a visible wavelength region (hereinafter referred to as a "visible range") in the NIR filter according to the present invention, an average value of transmittance at the incident angle of 0 degree in light with a wavelength of from 450 to 550 nm is preferably 80% or more, more preferably 90% or more. Further, in the NIR filter according to the present invention, in a near-infrared wavelength region (hereinafter referred to as a "near-infrared region"), an average value of transmittance at the incident angle of 0 degree in light with a wavelength of from 650 to 720 nm is preferably 15% or less.

Further, in the NIR filter according to the present invention, an average value of transmittance at the incident angle of 0 degree in light with a wavelength of from 650 to 700 nm is preferably 35% or less, more preferably 30% or less, furthermore preferably 25% or less. Moreover, in the NIR filter according to the present invention, an average value of transmittance at the incident angle of 0 degree in light with a wavelength of from 690 to 720 nm is more preferably 3% or less.

The NIR filter according to the present invention has a wavelength $\lambda_0$(NIR) with which transmittance at an incident angle of 0 degree becomes 50% and a wavelength $\lambda_{30}$(NIR) with which transmittance at an incident angle of 30 degrees becomes 50% in a region of a wavelength longer than 600 nm, and an absolute value of a difference between the wavelengths |$\lambda_0$(NIR)−$\lambda_{30}$(NIR)| is preferably 5 nm or less. The absolute value of the difference between the wavelengths |$\lambda_0$(NIR)−$\lambda_{30}$(NIR)| is more preferably 3 nm or less.

In the NIR filter according to the present invention, preferably, an average of an absolute value of a difference between transmittance at an incident angle of 0 degree and transmittance at an incident angle of 30 degrees is preferably 3% or less, the average value of the absolute value is more preferably 2% or less, in light with a wavelength of from 600 to 750 nm.

In the NIR filter according to the present invention, on a surface of a side having the near-infrared absorbing layer of the near-infrared absorbing glass substrate, reflectance at an incident angle of 5 degrees with respect to light with a wavelength of from 430 to 600 nm is preferably 2.0% or less, more preferably 1.2% or less, the reflectance being measured excluding reflection of an interface and a surface opposite to the side having the near-infrared absorbing layer of the near-infrared absorbing glass substrate.

In the present invention, absorptance, transmittance, and reflectance are values measured by using a spectrophotometer. In this specification, transmittance of 70% or more in a specific wavelength region means that transmittance is 70% or more in light of the entire wavelength region, and transmittance of 10% or less means that transmittance is 10% or less in light of the entire wavelength region. The same applies to absorptance and reflectance. Note that the measurement of optical properties is, unless described otherwise, performed with respect to light (incident angle of 0 degree) incident from a direction orthogonal to a main surface of a specimen. Note that the incident angle is an angle formed by a straight line indicating a direction of incident light with respect to a normal line of a main surface.

The NIR filter according to the present invention is a near-infrared cut filter with an excellent near-infrared blocking property, in which the near-infrared absorbing glass, the near-infrared absorbing layer containing the near-infrared absorbing dye, and the dielectric multilayer film are effectively used. The near-infrared cut filter having a structure, in which maximum transmittance at a relatively large incident angle of 31 to 60 degrees of 50% or less with respect to light of a specific wavelength region (775 to 900 nm) of a near-infrared region, is capable of reducing or preventing occurrence of a phenomenon that an object which did not exist on an original subject appears in a taken image in a solid-state imaging device using the near-infrared cut filter.

Further, an NIR filter according to a preferred mode of the present invention is a near-infrared cut filter having high average transmittance of the visible range due to that a spectral transmittance curve has a steep inclination in the vicinity of a boundary between the visible range and the near-infrared region, and further having a sufficient near-infrared blocking property without depending on an incident angle of light.

In the NIR filter, specifically, an average value of transmittance at an incident angle of 0 degree of light in the visible range of wavelength of from 450 to 550 nm is preferably 80% or more, more preferably 85% or more, further preferably 90% or more.

In the NIR filter, moreover, when wavelengths with which transmittance at an incident angle of 0 degree of light with a wavelength of from 550 to 720 nm becomes 85%, 45%, 5% are $\lambda$(T85%), $\lambda$(T45%), $\lambda$(T5%), they preferably satisfy the relation of following formula (2).

$$\{\lambda(T45\%)-\lambda(T85\%)\} \geq \{\lambda(T5\%)-\lambda(T45\%)\} \qquad (2)$$

Because of having the near-infrared absorbing layer, the NIR cut filter can suppress a change in a spectral transmittance curve of a near-infrared reflection band generated by the dielectric multilayer film with respect to light at an incident angle of 0 to 30 degrees. The formula (2) indicates a light blocking property in which an inclination reaching transmittance of 45 to 5% is steeper than an inclination reaching transmittance of 85 to 45% because of having the near-infrared absorbing layer.

In the NIR filter according to the present invention, preferably, the near-infrared absorbing layer further contains an ultraviolet absorber. With this structure, the NIR filter according to the present invention can achieve an optical property such that an average value of transmittance at an incident angle of 0 degree is 70% or more in light with a wavelength of from 430 to 450 nm, and an average value of transmittance at an incident angle of 0 degree is 5% or less in light with a wavelength of from 350 to 390 nm.

Thus, in the NIR filter according to the present invention, when the near-infrared absorbing layer contains the ultraviolet absorber, when a wavelength with which transmittance at an incident angle of 0 degree becomes 50% is $\lambda_0$(UV) and a wavelength with which transmittance at an incident angle of 30 degrees becomes 50% is $\lambda_{30}$(UV) in a region where the wavelengths are shorter than 450 nm, an absolute value of the difference between the wavelengths |$\lambda_0$(UV)-$\lambda_{30}$(UV)| can be made small. |$\lambda_0$(UV)-$\lambda_{30}$(UV)| is preferably 5 nm or less, more preferably 3 nm or less.

Further, in the NIR filter according to the present invention, the near-infrared absorbing layer preferably contains an ultraviolet absorber, and an average of absolute values of differences between transmittance at an incident angle of 0 degree and transmittance at an incident angle of 30 degrees in light with a wavelength of from 380 to 430 nm is preferably 8% or less, more preferably 5% or less.

The NIR filter according to the present invention in which the near-infrared absorbing layer contains an ultraviolet absorber as an optional component has the above-described near-infrared blocking property and is capable of suppressing or preventing occurrence of a phenomenon that an object which did not exist on an original subject appears in a taken image in the solid-state imaging device. In addition, due to that the spectral transmittance curve has a steep inclination in the vicinity of a boundary between the visible range and an ultraviolet wavelength region (hereinafter referred to as an "ultraviolet region"), and moreover that incident angle dependence of transmittance of light with a wavelength of from 500 nm or less is small, a near-infrared cut filter in which average transmittance of the visible range is made higher can be achieved.

Figure 2:
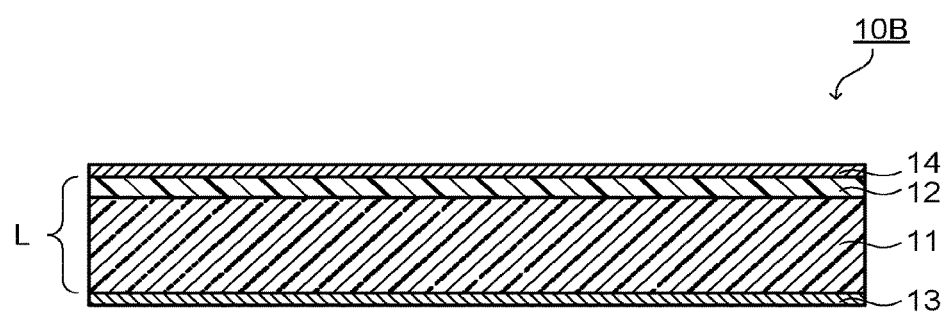
FIG. 2 is a cross-sectional view schematically illustrating another example of a near-infrared cut filter according to an embodiment of the present invention.
Figure 3:
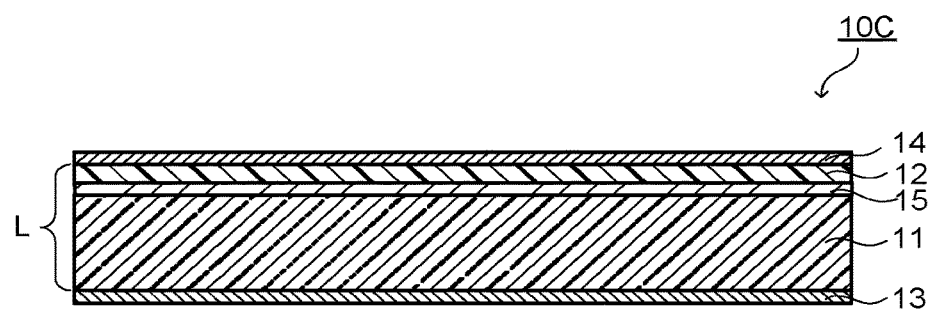
FIG. 3 is a cross-sectional view schematically illustrating still another example of a near-infrared cut filter according to an embodiment of the present invention.

Hereinafter, an embodiment of the NIR filter according to the present invention will be explained by using drawings. FIG. 1 to FIG. 3 are cross-sectional views schematically illustrating an example, another example, and still another example of the NIR filter according to the embodiment of the present invention.

An NIR filter 10A according to the embodiment illustrated in FIG. 1 has a stack L constituted of a near-infrared absorbing glass substrate 11 and a near-infrared absorbing layer 12, which contains a near-infrared absorbing dye and a transparent resin which are stacked on one main surface of the near-infrared absorbing glass substrate 11, and a first dielectric multilayer film 13 stacked on the main surface on the near-infrared absorbing glass substrate 11 side of the stack L.

Note that a modification example of the NIR filter 10A may be structured such that the stack L has the near-infrared absorbing layer 12 on both main surfaces of the near-infrared absorbing glass substrate 11, and has a dielectric multilayer film on one or both main surfaces of the stack L. Further, one modification example of the NIR filter 10A is a structure having a dielectric layer between the near-infrared absorbing glass substrate 11 and the near-infrared absorbing layer 12.

An NIR filter 10B illustrated in FIG. 2 as another example of the NIR filter according to the embodiment has a near-infrared absorbing glass substrate 11, a near-infrared absorbing layer 12, which contains a near-infrared absorbing dye and a transparent resin which are stacked on one main surface of the near-infrared absorbing glass substrate 11, a first dielectric multilayer film 13 stacked on another main surface of the near-infrared absorbing glass substrate 11, and a second dielectric multilayer film 14 stacked on a main surface of the near-infrared absorbing layer 12, the main surface being opposite to the near-infrared absorbing glass substrate 11. The NIR filter 10B has a structure in which a second dielectric multilayer film 14 is stacked on a main surface of the near-infrared absorbing layer 12 of the NIR filter 10A, the main surface being opposite to the near-infrared absorbing glass substrate 11.

An NIR filter 10C illustrated in FIG. 3 which is still another example of the NIR filter according to the embodiment has a structure similar to the NIR filter 10B except having a dielectric layer 15 between the near-infrared absorbing glass substrate 11 and the near-infrared absorbing layer 12 in the NIR filter 10B.

The NIR filters according to this embodiment can all achieve the maximum transmittance of 50% or less at an incident angle of 31 to 60 degrees with respect to light with a wavelength of from 775 to 900 nm. Hereinafter, this optical property will be referred to as an optical property of the present invention. Here, among the NIR filters according to the present invention, in addition to the optical property, the structure of the NIR filter 10B is preferred in view of ability to effectively block near-infrared rays, and the structure of the NIR filter 10C is more preferred in view of durability or the like. Note that, as long as satisfying the optical property, the NIR filter according to each embodiment may further include a layer or layers other than the above ones.

Hereinafter, respective structural layers having the NIR filters 10A, 10B, 10C according to this embodiment will be explained.

(Near-Infrared Absorbing Glass Substrate)

The near-infrared absorbing glass substrate 11 (hereinafter, the near-infrared absorbing glass substrate will simply be referred to as a "glass substrate") is constituted of a glass having an ability to transmit light in the visible range (450 to 600 nm), and to absorb light in a near infrared region (700 to 1100 nm), for example, a CuO-containing fluorophosphate glass or a CuO-containing phosphate glass (hereinafter, they will also be referred to collectively as to as a "CuO-containing glass"). Taking a CuO-containing glass substrate constituted of a CuO-containing glass as a typical example, the glass substrate 11 will be explained below.

The CuO-containing glass substrate has a maximum absorption wavelength $\lambda_{Gmax}$ in a wavelength of from 775 to 900 nm in an absorption spectrum of light with a wavelength of from 400 to 1100 nm. The CuO-containing glass substrate effectively blocks near-infrared light, and thus the CuO content and the thickness may be adjusted so that transmittance T ($\lambda_{Gmax}$) excluding a surface reflection loss is 50% or less, preferably 30% or less in the maximum absorption wavelength $\lambda_{Gmax}$. Further, in the CuO-containing glass substrate, because of having a wide absorption wavelength band, absorption of visible light of a wavelength of from 600 to 650 nm may occur. The CuO-containing glass substrate may be adjusted in the CuO content and the thickness to a degree not leading to a significant transmittance loss due to absorption of visible light, for example, may be adjusted so that T ($\lambda_{Gmax}$) is 5% or more.

The glass substrate 11, due to being constituted of the CuO-containing glass, has high transmittance with respect to visible light and has a high blocking property with respect to near-infrared light. Note that the "phosphate glass" also includes a siliconphosphate glass in which part of the skeleton of the glass is constituted of $SiO_2$. Examples of the CuO-containing glass used in the glass substrate 11 include ones having following compositions.

(1) A glass containing CuO of from 0.5 to 7 parts by mass in outer percentage relative to 100 parts by mass of a base glass containing, in mass %, $P_2O_5$ of from 46 to 70%, $AlF_3$ 0.2 to 20%, LiF+NaF+KF 0 to 25%, and $MgF_2+CaF_2+SrF_2+BaF_2+PbF_2$ 1 to 50%, where F is from 0.5 to 32%, O is from 26 to 54%.

(2) A glass constituted of, in mass %, $P_2O_5$ of from 25 to 60%, $Al_2OF_3$ 1 to 13%, MgO 1 to 10%, CaO 1 to 16%, BaO 1 to 26%, SrO 0 to 16%, ZnO 0 to 16%, $Li_2O$ 0 to 13%, $Na_2O$ 0 to 10%, $K_2O$ 0 to 11%, CuO 1 to 7%, ΣRO (R=Mg, Ca, Sr, Ba) 15 to 40%, and $ΣR'_2O$ (R'=Li, Na, K) 3 to 18% (where $O^{2-}$ ions up to 39 mol % amount are substituted by $F^-$ ions).

(3) A glass containing, in mass %, $P_2O_5$ of from 5 to 45%, $AlF_3$ 1 to 35%, RF (where R is Li, Na, K) 0 to 40%, $R'F_2$ (where R' is Mg, Ca, Sr, Ba, Pb, Zn) 10 to 75%, $R''F_m$ (where R" is La, Y, Cd, Si, B, Zr, Ta, and m is a number equivalent to the atomic value of R") 0 to 15% (where up to 70% of the total amount of fluoride can be substituted by an oxide), and CuO 0.2 to 15%.

(4) A glass containing, in cation %, $P^{5+}$ of from 11 to 43%, $Al^{3+}$ 1 to 29%, R cations (total amount of Mg, Ca, Sr, Ba, Pb, and Zn ions) 14 to 50%, R' cations (total amount of Li, Na, and K ions) 0 to 43%, R" cations (total amount of La, Y, Gd, Si, B, Zr, and Ta ions) 0 to 8%, and $Cu^{2'}$ 0.5 to 13%, and further containing $F^-$ 17 to 80% in anion %.

(5) A glass containing, in cation %, $P^{5+}$ of from 23 to 41%, 4 to 16%, Li 11 to 40%, $Na^+3$ to 13%, $R^{2+}$ (total amount of $Mg^{2+}$, $Ca^{2+}$, $Sr^{2+}$, $Ba^{2+}$, and $Zn^{2+}$) 12 to 53%, and $Cu^{2+}$ 2.6 to 4.7%, and further containing, in anion %, $F^-$ 25 to 48% and $O^{2-}$ 52 to 75%.

(6) A glass containing CuO of from 0.1 to 5 parts by mass in outer percentage relative to 100 parts by mass of a base glass constituted of, in mass %, $P_2O_5$ of from 70 to 85%, $Al_2O_3$ 8 to 17%, $B_2O_3$ 1 to 10%, $Li_2O$ 0 to 3%, $Na_2O$ 0 to 5%, and $K_2O$ 0 to 5%, where $Li_2O+Na_2O+K_2O$ 0.1 to 5%, and $SiO_2$ 0 to 3%.

Exemplifying commercial products, there are NF-50E, NF-50EX, NF-50T, NF-50TX (product name made by Asahi Glass Co., Ltd.), or the like for the glass of (1), BG-60, BG-61 (product name made by Schott AG), or the like for the glass of (2), and CD 5000 (product name made by HOYA), or the like for the glass of (5).

Further, the above-described CuO-containing glasses may further contain a metal oxide. For example, when one kind or two or more kinds of $Fe_2O_3$, $MoO_3$, $WO_3$, $CeO_2$, $Sb_2O_3$, $V_2O_5$, and the like are contained as the metal oxide, the CuO-containing glasses have an ultraviolet absorbing property. The content of the metal oxide is preferably such that at least one kind selected from the group consisting of $Fe_2O_3$, $MoO_3$, $WO_3$, and $CeO_2$ is contained by $Fe_2O_3$ of from 0.6 to 5 parts by mass, $MoO_3$ 0.5 to 5 parts by mass, $WO_3$ 1 to 6 parts by mass, and $CeO_2$ 2.5 to 6 parts by mass, or two kinds of $Fe_2O_3$ and $Sb_2O_3$ are contained by $Fe_2O_3$ of from 0.6 to 5 parts by mass+$Sb_2O_3$ of from 0.1 to 5 parts by mass, or two kinds of $V_2O_5$ and $CeO_2$ are contained by $V_2O_5$ of from 0.01 to 0.5 parts by mass+$CeO_2$ of from 1 to 6 parts by mass, relative to the CuO-containing glass 100 parts by mass.

The near-infrared blocking performance of the glass substrate 11 may be ones having the optical property of the present invention, that is, the maximum transmittance of 50% or less at an incident angle of 31 to 60 degrees with respect to light with a wavelength of from 775 to 900 nm, as the NIR filters 10A, 10B, 10C obtained by stacking the near-infrared absorbing layer 12 and the first dielectric multilayer film 13, the second dielectric multilayer film 14, and the dielectric layer 15, and the like which will be explained below.

The glass substrate 11 preferably has absorptance of 75% or more, more preferably 85% or more at an incident angle of 0 degree with respect to light with a wavelength of from 775 to 900 nm in a single state. The thickness of the glass substrate 11 is preferably 0.03 to 5 mm from the points of size-reduction and thickness reduction of the device, and prevention of breakage while handled, more preferably 0.05 to 1 mm from the point of weight reduction and strength.

Further, the optical property of the glass substrate 11 is preferably such that transmittance of light at an incident angle of 0 degree in a wavelength of from 450 to 550 nm is 80% or more in a thickness of 0.03 to 5 mm.

One material other than the CuO-containing glass for the substrate is a near-infrared absorbing substrate including a near-infrared absorbing dye which absorbs a specific near-infrared and a transparent resin. Among them, particularly the CuO-containing glass substrate has a characteristic that absorption of light with a wavelength of from 400 to 450 nm is slight, and an absorption ratio of absorption of light with a wavelength of from 400 to 450 nm with respect to light with a wavelength of from 775 to 900 nm is low. Consequently, the CuO-containing glass substrate is useful because significant reduction in transmittance of visible light would not occur when the CuO content is increased so as to sufficiently block light with a wavelength of from 775 to 900 nm by absorption, so as to increase absorptance.

The NIR filters 10A, 10B, 10C can contribute to, for example, size reduction and thickness reduction of the solid-state imaging device when they are used as a cover to be tightly sealed so as to protect the solid-state image sensing device in the solid-state imaging device. Here, when α-ray emitting elements (radioactive isotopes) are contained as impurities in the cover, they may emit α-rays and cause a transient erroneous operation (software error) in the solid-state image sensing device. Therefore, in the CuO-containing glass constituting the glass substrate 11 in such an application, the content of α-ray emitting elements is preferred to be as small as possible. Among the α-ray emitting elements, the contents of U and Th are preferably 20 ppb or less, more preferably 5 ppb or less.

When the near-infrared absorbing layer 12 is stacked on a main surface of the glass substrate 11, a surface treatment with a silane coupling agent may be performed on the surface on which the layer is stacked. By using the glass substrate 11 having a surface treated with the silane coupling agent, adhesion with the near-infrared absorbing layer 12 may be increased. As the silane coupling agent, for example, the same one as the following one which will be used for the near-infrared absorbing layer 12 can be used.

(Near-Infrared Absorption Layer)

The near-infrared absorbing layer 12 is a layer containing a near-infrared absorbing dye (A) and a transparent resin (B), and typically is a layer in which the near-infrared absorbing dye (A) is dispersed evenly through the transparent resin (B). The near-infrared absorbing layer 12 is preferred to further contain an ultraviolet absorber (U).

Note that in FIG. 1 to FIG. 3, the near-infrared absorbing layer 12 is illustrated as being constituted of one layer, but is not limited to this structure when the ultraviolet absorber (U) is further contained. For example, when the near-infrared absorbing layer 12 contains the near-infrared absorbing dye (A) and the transparent resin (B) and does not contain the ultraviolet absorber (U), it may be of a structure separately provided with an ultraviolet absorbing layer not-illustrated in FIG. 1 to FIG. 3. That is, the ultraviolet absorbing layer may contain the ultraviolet absorber (U) and a transparent resin, and may be provided as an independent layer.

In this case, the ultraviolet absorbing layer may be provided on the near-infrared absorbing layer 12 side out of the both main surfaces of the glass substrate 11, or provided opposite to the near-infrared absorbing layer 12 side. The positional relation therebetween is not limited. However, even when having the structure separately provided with the ultraviolet absorbing layer in this manner, the NIR filters according to the present invention can obtain the same optical property as an optical property of a structure in which the near-infrared absorbing layer 12 further contains the ultraviolet absorber (U). Further, when the near-infrared absorbing layer 12 contains the near-infrared absorbing dye (A), the transparent resin (B), and moreover the ultraviolet absorber (U), an ultraviolet absorbing layer containing the ultraviolet absorber (U) and a transparent resin may be provided separately. The structure in which the ultraviolet absorber (U) is contained in the near-infrared absorbing layer 12 when the NIR filter according to the present invention contains the ultraviolet absorber (U) may be explained below.

<Near-Infrared Absorbing Dye (A)>

The near-infrared absorbing dye (A) (hereinafter referred to as a dye (A)) is not limited in particular as long as it is a near-infrared absorbing dye having an ability to transmit light in the visible range (wavelength of from 450 to 600 nm), and to absorb light in the near-infrared region (wavelength of from 700 to 1100 nm). Note that the dye in the present invention may be a pigment, that is, may be in a state of being an aggregate of molecules. Hereinafter, the near-infrared absorbing dye may be referred to as a "NIR absorbing dye" as necessary.

Further, the dye (A) is preferably a material having the maximum absorption wavelength $\lambda_{max}$ at a wavelength of from 650 to 750 nm, further preferably a material having the $\lambda_{max}$ at a wavelength of from 680 to 720 nm. Further, the near-infrared absorbing layer containing the dye (A) has a high freedom in selection of type and content of the material which can narrow the absorption wavelength bandwidth, as compared to the near-infrared absorbing glass. Accordingly, adjusting the transmittance T ($\lambda_{max}$) at its maximum absorption wavelength $\lambda_{max}$ to be lower than the transmittance T ($\lambda_{Gmax}$) in the maximum absorption wavelength $\lambda_{Gmax}$ of the near-infrared absorbing glass substrate enables the near-infrared absorbing layer to achieve a steep light blocking property in the vicinity of the $\lambda_{max}$ while preventing decrease in transmittance of the visible wavelength region. Note that the maximum absorption wavelength in the near-infrared absorbing layer containing the dye (A) having the maximum absorption wavelength $\lambda_{max}$ matches the maximum absorption wavelength $\lambda_{max}$ of the dye (A).

The reason why the spectral transmittance curve of the near-infrared absorbing layer prefers to have small absorption of visible light and to have a steeper inclination on the visible light (short wavelength) side than the $\lambda_{max}$ is to achieve a spectral transmittance curve close to the visibility by the near-infrared absorbing layer. That is, in the near-infrared absorbing layer, the dye (A) and the content thereof in the transparent resin (B) are adjusted so that its absorption of light with a wavelength of from about 550 to 600 nm with high visibility is small and maintains high transmittance, the transmittance with respect to light with a wavelength of from about 600 to 650 nm with gradually decreasing visibility decreases to about 40 to 60%, and transmittance with respect to light with a wavelength of from about 650 to 700 nm with from a level of low visibility to a level of almost no visibility decreases to 5% or less. Specifically, the dye (A) and the content thereof are adjusted so that the transmittance T ($\lambda_{max}$) at the $\lambda_{max}$ in the near-infrared absorbing layer becomes 5% or less.

The absorption wavelength band, which yields low transmittance with near-infrared light more than or equal to about 700 nm as a result of adjusting the dye (A) so that the transmittance with respect to light with a wavelength of from 550 to 700 nm is in the above preferred range, is preferred to be wider. In the near-infrared absorbing layer, the absorption wavelength bandwidth in which the transmittance becomes 20% or less in the vicinity of the $\lambda_{max}$ is preferably 30 nm or more, more preferably 40 nm or more. When the near-infrared absorbing layer has the above-described absorption wavelength bandwidth, it is possible to increase the effect to block transmitted light in the near-infrared region, which cannot be blocked sufficiently by absorption by the near-infrared absorbing glass substrate and the near-infrared absorbing layer, by using a dielectric multilayer film with a near-infrared reflective property, which will be described later. That is, even when the wavelength of 50% transmittance on the near-infrared reflective wavelength side within the spectral transmittance curve of the dielectric multilayer film is shifted to the short wavelength side due to angular dependence of light at an incident angle of 0 to 30 degrees, it can be set to fall within changes in the absorption wavelength bandwidth of the near-infrared absorbing layer. Therefore, the NIR filter based on this design can prevent incident angle dependence of the dielectric multilayer film affecting the spectral transmittance curve particularly in a near-infrared absorbing region.

The dye (A) is preferably one exhibiting the maximum absorption wavelength in the wavelength of from 650 to 750 nm in the absorption spectrum of light with a wavelength of from 400 to 850 nm measured by using a resin film obtained by dispersing the dye (A) through the transparent resin (B). The near-infrared absorbing dye having this absorbing property is called a dye (A1) The maximum absorption wavelength in this absorption spectrum is called $\lambda_{max}$ of the dye (A1). In addition, the absorption spectrum of the dye (A1) has an absorption peak having an apex of absorption at a wavelength $\lambda_{max}$ (hereinafter referred to as an "absorption peak of $\lambda_{max}$"). In the absorption spectrum of the dye (A1), in addition to having the $\lambda_{max}$ in the wavelength of from 650 to 750 nm, preferably, absorption of visible light is small, and the inclination on the visible light side of the absorption peak of $\lambda_{max}$ is steep. Moreover, the absorption peak of the $\lambda_{max}$ preferably has a gradual inclination on the long wavelength side.

Examples of the dye (A1) include a cyanine-based compound, a phthalocyanine-based compound, a naphthalocyanine-based compound, a dithiol metal complex-based compound, a diimonium-based compound, a polymethine-based compound, a phthalide compound, a naphthoquinone-based compound, an anthraquinone-based compound, an indophenol-based compound, a squarylium-based compound, and the like.

Among them, the squarylium-based compound, the cyanine-based compound, and the phthalocyanine-based compound are more preferred, and the squarylium-based compound is particularly preferred. The dye (A1) constituted of the squarylium-based compound is preferred because its absorption of visible light is small in the absorption spectrum, the absorption peak of the $\lambda_{max}$ has a steep inclination on the visible light side, and storage stability and stability with respect to light are high. The dye (A1) constituted of the cyanine-based compound is preferred because its absorption of visible light is small in the absorption spectrum, and absorptance of light on the long wavelength side is high in a wavelength region in the vicinity of the $\lambda_{max}$. Further, the cyanine-based compound is of low costs, and is known to secure long-term stability by forming salt. The dye (A1) constituted of the phthalocyanine-based compound is preferred because of its excellence in heat resistance and weather resistance.

One example of the dye (A1) which is the squarylium-based compound is, specifically, at least one kind selected from squarylium-based compounds represented by a formula (F1) In this specification, a chemical compound represented by the formula (F1) will also be called a chemical compound (F1) The same applies to any other chemical compound.

The chemical compound (F1) is a squarylium-based compound having a structure in which benzene rings are bonded to the left and right sides of a squarylium skeleton, nitrogen atoms are further bonded to fourth positions of the benzene rings, and saturated heterocycles including the nitrogen atoms are formed, and is a chemical compound having a light absorbing property as the dye (A1). In the chemical compound (F1), substituents of the benzene rings can be adjusted appropriately in the following ranges according to other required properties such as increasing solubility to a solvent used when the near-infrared absorbing layer is formed (hereinafter may be referred to as a "host solvent") or to the transparent resin (B), or the like.

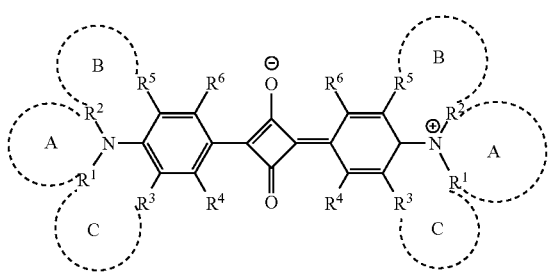

(F1)

Here, symbols in the formula (F1) are as follows.

Each of $R^5$ and $R^6$ independently represents a hydrogen atom, a halogen atom, a hydroxyl group, an alkyl group or an alkoxy group having 1 to 6 carbon atoms, an acyloxy group having 1 to 10 carbon atoms, or —$NR^7R^8$ ($R^7$ and $R^8$ each independently represent a hydrogen atom, an alkyl group having 1 to 20 carbon atoms, or —C(=O)—$R^9$ ($R^9$ is a hydrogen atom, an alkyl group having 1 to 20 carbon atoms or an aryl group having 6 to 11 carbon atoms which may have a substituent, or an alaryl group having 7 to 18 carbon atoms which may have a substituent and may have an oxygen atom between carbon atoms)).

At least one group of $R^1$ and $R^2$, $R^2$ and $R^5$, and $R^1$ and $R^3$ couple together to form a heterocycle A, a heterocycle B, and a heterocycle C having 5 or 6 members including a nitrogen atom.

$R^1$ and $R^2$ when the heterocycle A is formed represent, as a bivalent group -Q- in which they are bonded, an alkylene group or an alkyleneoxy group, in which hydrogen atoms may be substituted by an alkyl group having 1 to 6 carbon atoms, an awl group having 6 to 10 carbon atoms, or an acyloxy group having 1 to 10 carbon atoms which may have a substituent.

$R^2$ and $R^5$ when the heterocycle B is formed and $R^1$ and $R^3$ when the heterocycle C is formed represent, each as a bivalent group —$X^1$—$Y^1$— and —$X^2$—$Y^2$— in which they are bonded (the side bonded to nitrogen is $X^1$ or $X^2$), a group in which each of $X^1$ and $X^2$ is represented by following formulae (1x) or (2x) and a group in which each of $Y^1$ and $Y^2$ is represented by one selected from following formulae (1y) to (5y). When each of $X^1$ and $X^2$ is a group represented by a following formula (2x), $Y^1$ and $Y^2$ may each be a single bond.

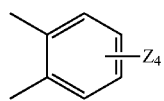

(1x)

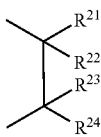

(2x)

(1y)

(2y)

(3y)

(4y)

(5y)

In formula (1x), four Zs each independently represent a hydrogen atom, a hydroxyl group, an alkyl group or an alkoxy group having 1 to 6 carbon atoms, or an alkoxy group, or —$NR^{28}R^{29}$ ($R^{28}$ and $R^{29}$ each independently represent a hydrogen atom or an alkyl group having 1 to 20 carbon atoms). $R^{21}$ to $R^{26}$ each independently represent a hydrogen atom, an alkyl group having 1 to 6 carbon atoms or an aryl group having 6 to 10 carbon atoms, and $R^{27}$ represents an alkyl group having 1 to 6 carbon atoms or an aryl group having 6 to 10 carbon atoms.

$R^7$, $R^8$, $R^9$, $R^4$, $R^6$, $R^{21}$ to $R^{27}$, $R^1$ to $R^3$ when the heterocycles are not formed, and $R^5$ may be bonded to another one of them to form a five-membered ring or a six-membered ring. $R^{21}$ and $R^{26}$, and $R^{21}$ and $R^{27}$ may be bonded directly.

$R^1$ and $R^2$ when the heterocycles are not formed each independently represent a hydrogen atom, an alkyl group or an allyl group having 1 to 6 carbon atoms which may have a substituent, or an aryl group or an alaryl group having 6 to 11 carbon atoms. $R^3$ and $R^5$ when the heterocycles are not formed each independently represent a hydrogen atom, a halogen atom, or an alkyl group or an alkoxy group having 1 to 6 carbon atoms. Hereinafter, the heterocycle A may simply be referred to as a ring A. The same applies to the heterocycle B and the heterocycle C.

In the chemical compound (F1), $R^4$ and $R^6$ each independently represent the above atoms or groups. Examples of the halogen atom include a fluorine atom, a chlorine atom, a bromine atom, or the like. The alkyl group may be any of linear chain, branched chain, and cyclic. $R^4$ and $R^6$ are preferably of a combination in which one of them is a hydrogen atom and the other is —$NR^7R^8$.

When the chemical compound (F1) has only the ring A, only the ring B and the ring C, or the ring A to the ring C out of the ring A to the ring C, —$NR^7R^8$ may be introduced into either of $R^4$ and $R^6$. When the chemical compound (F1) has only the ring B, or only the ring A and the ring B, —$NR^7R^8$ is preferably introduced into $R^4$. Similarly, when the chemical compound has only the ring C, or only the ring A and the ring C, —$NR^7R^8$ is preferably introduced into $R^6$.

As the —$NR^7R^8$, from the viewpoint of solubility to a host solvent or to the transparent resin (B), —NH—C(=O)—$R^9$ is preferred. $R^9$ is preferably an alkyl group having 1 to 20 carbon atoms which may have a substituent, an aryl group having 6 to 10 carbon atoms which may have a substituent, or an alaryl group having 7 to 18 carbon atoms which may have a substituent and may have an oxygen atom between carbon atoms. Examples of the substituent include a halogen atom such as a fluorine atom, a hydroxyl group, a carboxy group, a sulfo group, a cyano group, an alkyl group having 1 to 6 carbon atoms, a fluoroalkyl group having 1 to 6 carbon atoms, an alkoxy group having 1 to 6 carbon atoms, an acyloxy group having 1 to 6 carbon atoms, and the like.

Among them, $R^9$ is preferably a group selected from a linear, branched, or cyclic alkyl group having 1 to 17 carbon atoms which may be substituted by a fluorine atom, a phenyl group which may be substituted by a fluoroalkyl group having 1 to 6 carbon atoms, and/or an alkoxy group having 1 to 6 carbon atoms, and an alaryl group having 7 to 18 carbon atoms which may have an oxygen atom between carbon atoms and has, on its terminal, an alkyl group having 1 to 6 carbon atoms which may be substituted by a fluorine atom and/or a phenyl group which may be substituted by an alkoxy group having 1 to 6 carbon atoms.

As $R^9$, a group can be preferably used which is a hydrocarbon group having 5 to 25 carbon atoms and having at least one or more branches, in which one or more hydrogen atoms may be independently substituted by a halogen atom, a hydroxyl group, a carboxy group, a sulfo group, or a cyano group, and which may include an unsaturated bond, an oxygen atom, or a saturated or unsaturated ring structure between carbon atoms. Examples of such $R^9$ include groups represented by formulae (1a), (1b), (2a) to (2e), (3a) to (3e).

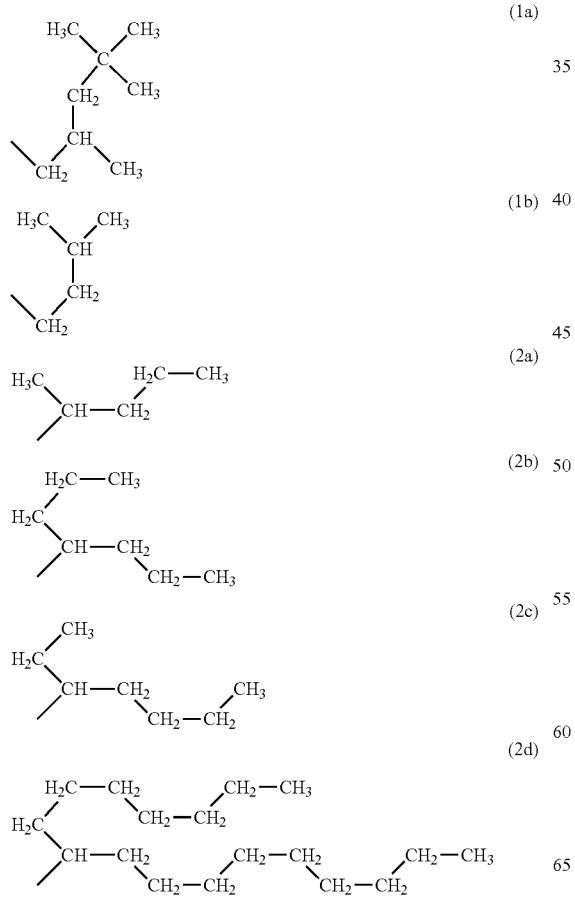

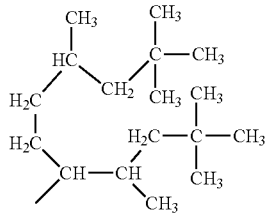

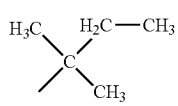

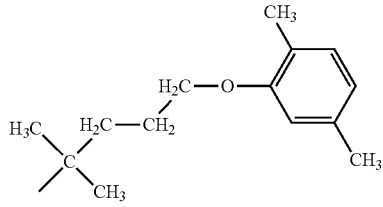

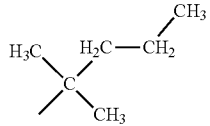

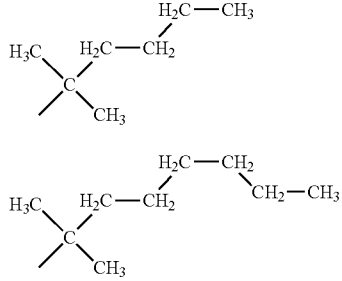

In the chemical compound (F1), regarding the ring A, the ring B, and the ring C having 5 or 6 members, formed of $R^1$ and $R^2$, $R^2$ and $R^5$, and $R^1$ and $R^3$ coupled to each other, at least one of them may be formed, or two or three of them may be formed.

$R^1$ and $R^2$ when the rings are not formed each independently represent a hydrogen atom, an alkyl group or allyl group having 1 to 6 carbon atoms which may have a substituent, or an aryl group or alaryl group having 6 to 11 carbon atoms. The alkyl group may be any of linear chain, branched chain, and cyclic. Examples of the substituent include a hydroxyl group, an alkoxy group having 1 to 3 carbon atoms, and an acyloxy group having 1 to 3 carbon atoms. $R^3$ and $R^5$ when the rings are not formed each independently represent a hydrogen atom, a halogen atom, or an alkyl group or alkoxy group having 1 to 6 carbon atoms. Among them, as $R^1$, $R^2$, $R^3$, $R^5$, from the viewpoint of solubility to the host solvent or the transparent resin (B), an alkyl group having 1 to 3 carbon atoms is preferred, and a methyl group, an ethyl group, or a 2-propyl group is particularly preferred.

Further, in the chemical compound (F1), $R^1$ to $R^6$ which the benzene rings bonded to the left and right sides of a squarylium skeleton have may be different on the left and right sides, but is preferred to be the same on the left and right sides. Note that the chemical compound (F1) contains a chemical compound (F1-1) expressed by a formula (F1-1) having a resonance structure of the structure expressed by the formula (F1)

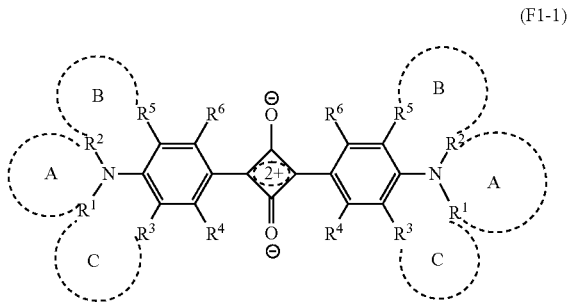

(F1-1)

Where, the symbols in the formula (F1-1) are the same as those defined in the formula (F1).

Examples of the chemical compound (F1) more specifically include the chemical compound expressed by a formula (F11) having only the ring B as a ring structure, the chemical compound expressed by a formula (F12) having only the ring A as a ring structure, and the chemical compound expressed by a formula (F13) having two of the ring B and the ring C as ring structures. Note that the chemical compound represented by the formula (F11) is the same chemical compound as the chemical compound having only the ring C as a ring structure in the chemical compound (F1) with $R^6$ being —$NR^7R^8$. Further, the chemical compound expressed by the formula (F11) and the chemical compound expressed by the formula (F13) are chemical compounds described in the U.S. Pat. No. 5,543,086.

The symbols in the formulae (11) to (F13) are the same as those defined in the formula (F1), and the same applies to preferred modes.

In the chemical compound (F11), as $X^1$, an ethylene group in which the hydrogen atom may be substituted by an alkyl group having 1 to 6 carbon atoms or an aryl group having 6 to 10 carbon atoms expressed in the above (2x) is preferred. In this case, as the substituent, an alkyl group having 1 to 3 carbon atoms is preferred, and a methyl group is more preferred. Examples of $X^1$ specifically include —$(CH_2)_2$—, —$CH_2$—$C(CH_3)_2$—, —$CH(CH_3)$—$C(CH_3)_2$—, —$C(CH_3)_2$—$C(CH_3)_2$—, and the like. As the —$NR^7R^8$ in chemical compound (F11), —NH—C(=O)—$CH_3$, —NH—C(=O)—$C_6H_{13}$, —NH—C(=O)—$C_6H_5$, —NH—C(=O)—$CH(C_2H_5)$—$C_4H_9$, —NH—C(=O)—$C(CH_3)_2$—$C_2H_5$, —NH—C(=O)—$C(CH_3)_2$—$C_3H_7$, —NH—C(=O)—$C(CH_3)_2$—$(CH_2)_3$—O—$C_6H_3(CH_3)_2$, or the like is preferred.

Examples of the chemical compound (F11) include chemical compounds expressed by formula (F11-1), formula (11-2), formula (F11-3), formula (F11-4), formula (F11-5), formula (F11-6), formula (F11-7), and the like. Among them, due to high solubility to the host solvent and the transparent resin (B), the chemical compound (F11-2), the chemical compound (F11-3), the chemical compound (F11-4), the chemical compound (F11-5), and the chemical compound (F11-6) are more preferred.

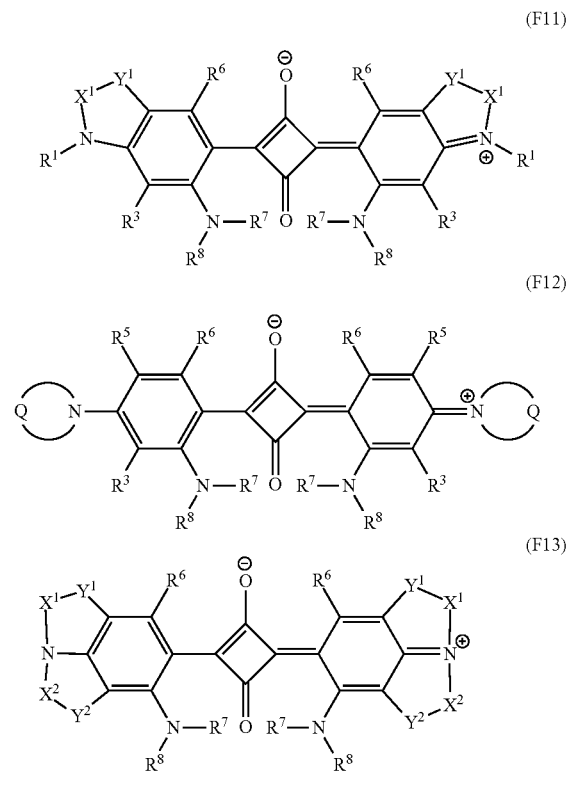

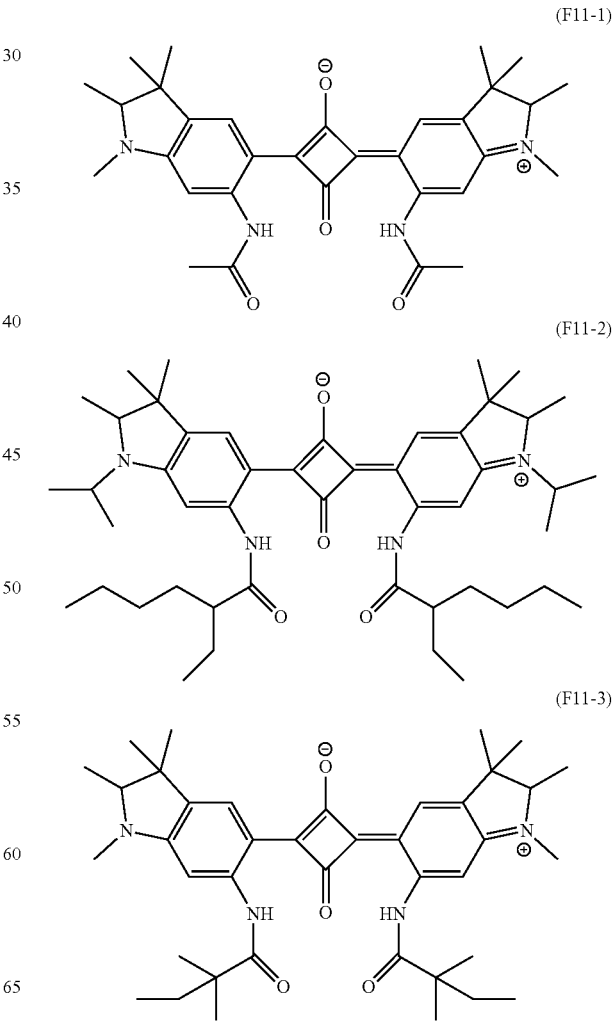

-continued

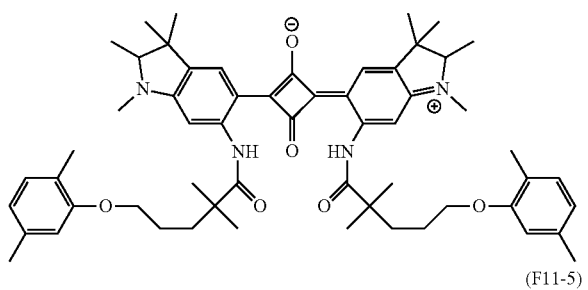
(F11-4)

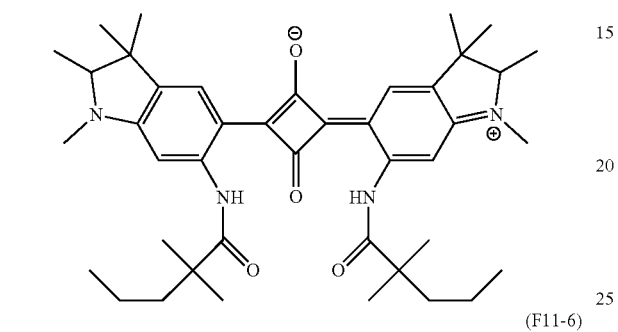
(F11-5)

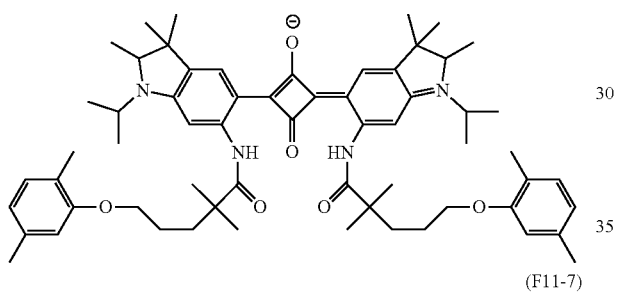
(F11-6)

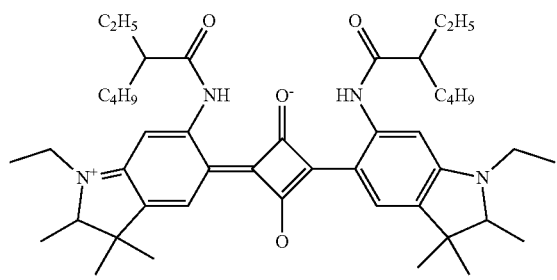
(F11-7)

In the chemical compound (F12), Q is an alkylene group having 4 or 5 carbon atoms or an alkyleneoxy group having 3 or 4 carbon atoms, in which hydrogen atoms may be substituted by an alkyl group having 1 to 6 carbon atoms, an aryl group having 6 to 10 carbon atoms, or an acyloxy group having 1 to 10 carbon atoms which may have a substituent. The position of oxygen atom in the case of the alkyleneoxy group is preferably other than where it is adjacent to N. Note that as Q, a butylene group which may be substituted by an alkyl group having 1 to 3 carbon atoms, particularly a methyl group is preferred.

In the chemical compound (F12), as —NR$^7$R$^8$, —NH—C(=O)—(CH$_2$)$_m$—CH$_3$ (m is 0 to 19), —NH—C(=O)-Ph-R$^{10}$ (-Ph- represents a phenylene group, and R$^{10}$ represents a hydrogen atom, an alkyl group having 1 to 3 carbon atoms in which a hydrogen atom may be substituted by a fluorine atom, or an alkoxy group having 1 to 3 carbon atoms), or the like is preferred.

Here, since the $\lambda_{max}$ of the chemical compound (F12) is on the relatively long wavelength side in the above-described wavelength region, using the chemical compound (F12) can widen the transmission region of the visible wavelength band. Examples of the chemical compound (F12) include chemical compounds represented by formula (F12-1), formula (F12-2), formula (F12-3), and the like.

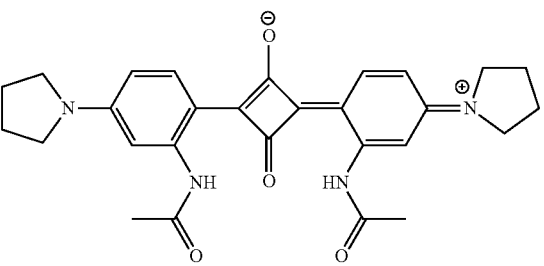
(F12-1)

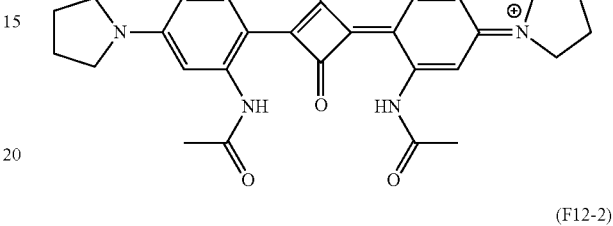
(F12-2)

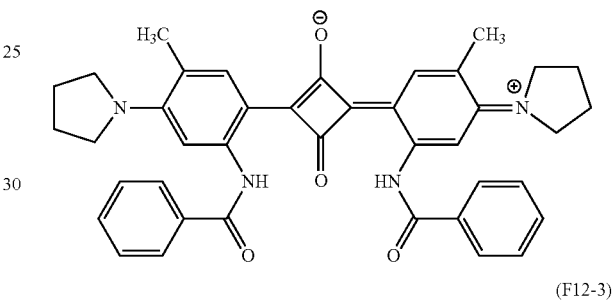
(F12-3)

In the chemical compound (F13), X$^1$ and X$^2$ are independently preferably an ethylene group in which the hydrogen atom expressed by the above (2x) may be substituted by an alkyl group having 1 to 6 carbon atoms or an aryl group having 6 to 10 carbon atoms. In this case, the substituent is preferably an alkyl group having 1 to 3 carbon atoms, more preferably a methyl group. X$^1$ and X$^2$ may be, specifically, —(CH$_2$)$_2$—, —CH$_2$—C(CH$_3$)$_2$—, —CH(CH$_3$)—C(CH$_3$)$_2$—, —C(CH$_3$)$_2$—C(CH$_3$)$_2$—, and the like. Y$^1$ and Y$^2$ may be, independently, —CH$_2$—, —C(CH$_3$)$_2$—, —CH(C$_6$H$_5$)—, —CH((CH$_2$)$_m$CH$_3$)— (m is 0 to 5), and the like. In the chemical compound (F13), —NR$^7$R$^8$ is preferably —NH—C(=O)—C$_m$H$_{2m+1}$ (m is 1 to 20, and C$_m$H$_{2m+1}$ may be any of linear chain, branched chain, and cyclic), —NH—C(=O)-Ph-R$^{10}$ (-Ph- represents a phenylene group, and R$^{10}$ represents a hydrogen atom, an alkyl group having 1 to 3 carbon atoms, an alkoxy group having 1 to 3 carbon atoms, or a perfluoroalkyl group having 1 to 3 carbon atoms), or the like. Examples of the chemical compound (F13) include chemical compounds expressed by a following formula (F13-1), formula (F13-2), and the like.

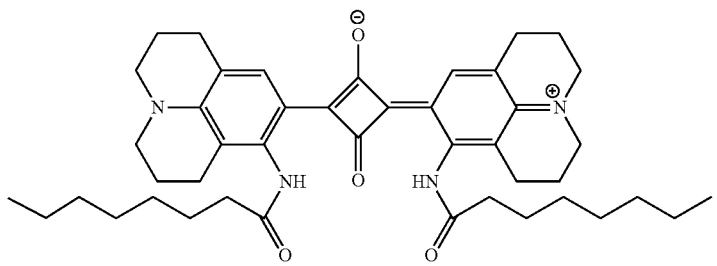

(F13-1)

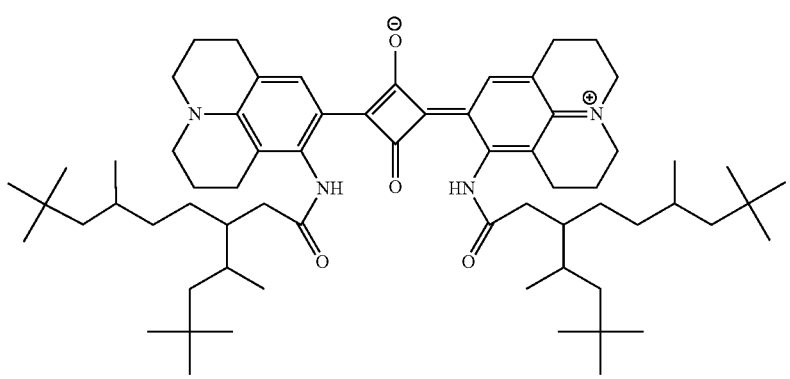

(F13-2)

Further, as a dye (A1), it is also possible to use a squarylium-based compound represented by a formula (F6). The formula (F6) expresses a chemical compound in which none of the ring A, the ring B, and the ring C is formed in the formula (F1) (where $R^1$ to $R^6$ are as follows).

atoms which may have a substituent and may have an oxygen atom between carbon atoms)). Examples of the chemical compound (F6) include chemical compounds expressed by a formula (F6-1), formula (F6-2), and the like.

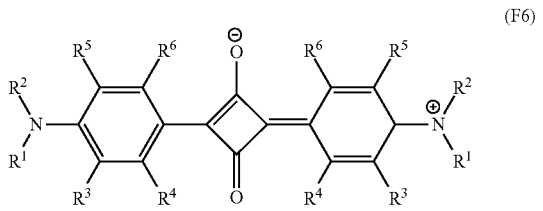

(F6)

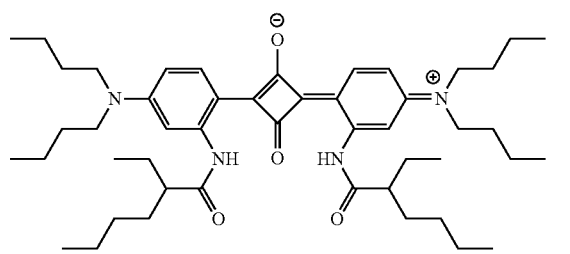

(F6-1)

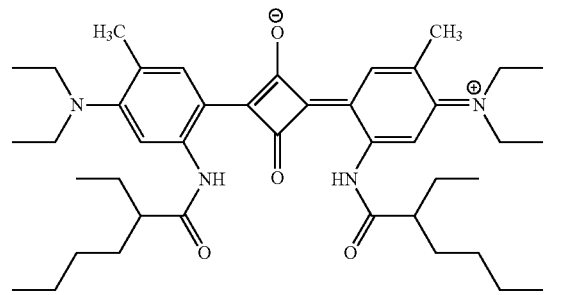

(F6-2)

Symbols in the formula (F6) are as follows.

$R^1$ and $R^2$ each independently represent a hydrogen atom, an alkyl group or an allyl group having 1 to 12 carbon atoms which may have a substituent, or an aryl group or an alaryl group having 6 to 11 carbon atoms. $R^3$ and $R^5$ each independently represent a hydrogen atom, a halogen atom, or an alkyl group or an alkoxy group having 1 to 6 carbon atoms. $R^4$ and $R^6$ each independently represent a hydrogen atom, a halogen atom, a hydroxyl group, or an alkyl group or an alkoxy group having 1 to 6 carbon atoms, an acyloxy group having 1 to 10 carbon atoms, or —$NR^7R^8$ ($R^7$ and $R^8$ each independently represent a hydrogen atom, an alkyl group having 1 to 20 carbon atoms, or —C(=O)—$R^9$ ($R^9$ is a hydrogen atom, an alkyl group having 1 to 20 carbon atoms or an aryl group having 6 to 11 carbon atoms which may have a substituent, or an alaryl group having 7 to 18 carbon Moreover, as the dye (A1), a squarylium-based chemical compound expressed by a formula (F7) can also be used.

(F7)

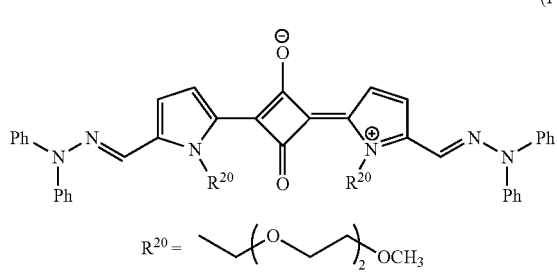

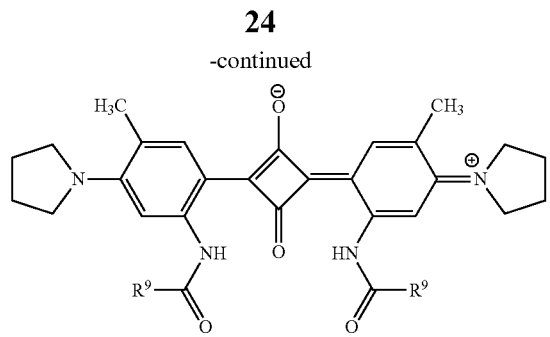

The above-described chemical compound (F1) such as the chemical compound (F11), the chemical compound (F12), or the chemical compound (F13), as well as the chemical compound (F6) and the chemical compound (F7) can be produced by a conventionally known method. The chemical compound (F11) such as the chemical compound (F11-1) can be produced by a method described in, for example, U.S. Pat. No. 5,543,086. Further, the chemical compound (F12) can be produced by a method described in, for example, J. Org. Chem. 2005, 70 (13), 5164-5173.

Among them, the chemical compound (F12-1), the chemical compound (F12-2), and the like can be produced according to, for example, a synthetic pathway expressed in a reaction formula (F3). In the reaction formula (F3), an amino group of 1-methyl-2-iodine-4-amino benzene is brought into reaction with a carboxylic acid chloride having a desired substituent $R^9$ to form an amide. Then, it is brought into reaction with pyrrolidine and further into reaction with 3,4-dihydroxy-3-cyclobutene-1,2-dione (hereinafter referred to as squaric acid), thereby obtaining the chemical compound (F12-1), the chemical compound (F12-2), or the like.

In the reaction formula (F3), $R^9$ represents -Ph or —$(CH_2)_5$—$CH_3$. -Ph represents a phenyl group. Et represents an ethyl group, and THF represents a tetrahydrofuran.

Further, the chemical compound (F13-1), the chemical compound (F13-2), and the like can be produced according to, for example, a synthetic pathway expressed in a reaction formula (F4). In the reaction formula (F4), first, 8-hydroxyjulolidine is brought into reaction with trifluoromethanesulfonic acid anhydride ($Tf_2O$) to make 8-julolidine trifluoromethanesulfonate, and then it is brought into reaction with benzylamine ($BnNH_2$) to obtain 8-benzylamino julolidine, and then it is further reduced to produce 8-amino julolidine. Then, an amino group of the 8-amino julolidine is brought into reaction with a carboxylic acid chloride having a desired substituent $R^9$ (—$(CH_2)_6$—$CH_3$ in the case of the chemical compound (F13-1), or —$CH(CH(CH_3))$—$CH_2$—$C(CH_3)_3$)—$(CH_2)_2$—$CH(CH_3)$—$CH_2$—$C(CH_3)_3$ in the case of the chemical compound (F13-2)), thereby obtaining a chemical compound having —NH—C(=O)$R^9$ at an eighth position of the julolidine. Next, 2 moles of this chemical compound is brought into reaction with one mole of squaric acid, thereby obtaining the chemical compound (F13-1), the chemical compound (F13-2), or the like.

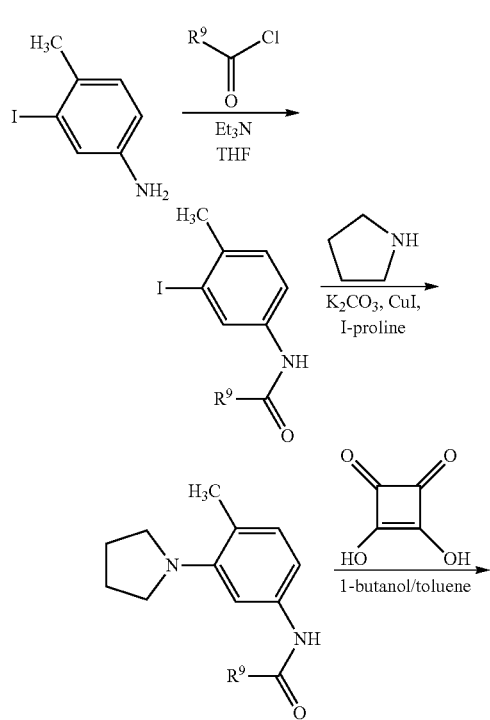

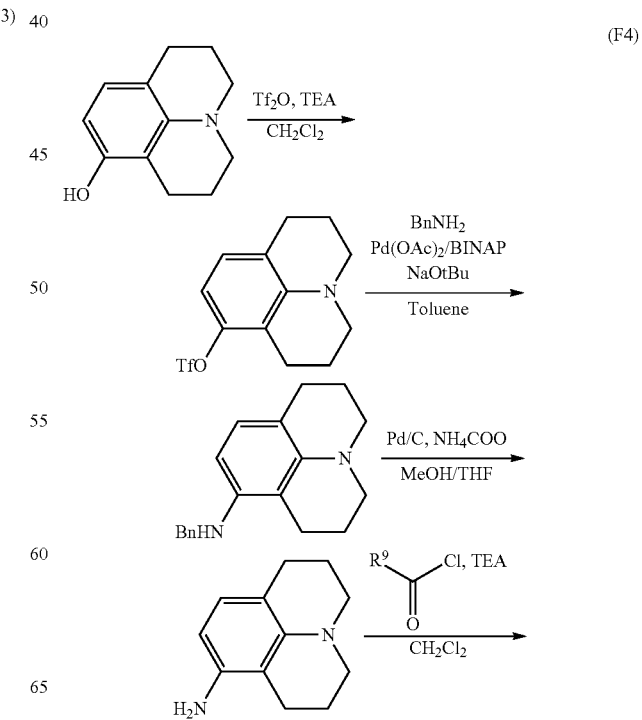

-continued

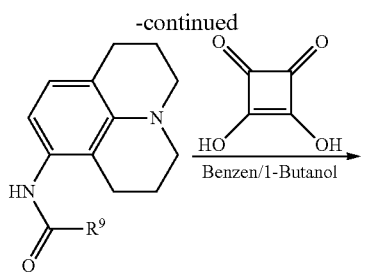

Benzen/1-Butanol

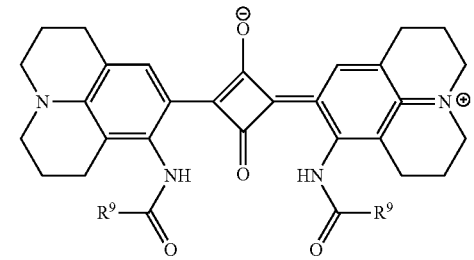

In the reaction formula (F4), Me represents a methyl group, TEA represents triethylamine, Ac represents an acetyl group, BINAP represents (2,2'-bis(diphenylphosphino)-1,1'-binaphthyl), and NaOtBu represents sodium-t-butoxide.

As the dye (A1) which is a squarylium-based compound, a commercial product may be used. Examples of the commercial product include S2098, S2084 (product names, made by FEW Chemicals), and the like.

The dye (A1) which is a cyanine-based compound may be, specifically, at least one selected from cyanine-based compounds expressed by a formula (F5).

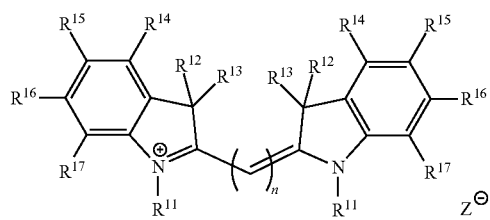

(F5)

Here, symbols in the formula (F5) are as follows.

$R^{11}$ each independently represents an alkyl group, alkoxy group or alkyl sulfone group having 1 to 20 carbon atoms, or an anion species thereof. $R^{12}$ and $R^{13}$ each independently represent a hydrogen atom or an alkyl group having 1 to 20 carbon atoms.

Z represents a $PF_6$, $ClO_4$, $R^f$—$SO_2$, $(R^f$—$SO_2)_2$—N ($R^f$ represents an alkyl group having 1 to 8 carbon atoms in which at least one hydrogen atom is substituted by a fluorine atom), or $BF_4$. $R^{14}$, $R^{15}$, $R^{16}$ and $R^{17}$ each independently represent a hydrogen atom, a halogen atom, or an alkyl group having 1 to 6 carbon atoms. n represents an integer of 1 to 6.

Note that $R^{11}$ in the chemical compound (F5) is preferably an alkyl group having 1 to 20 carbon atoms, and $R^{12}$ and $R^{13}$ are each independently preferably a hydrogen atom or an alkyl group having 1 to 6 carbon atoms. $R^{14}$, $R^{15}$, $R^{16}$ and $R^{17}$ are each independently preferably a hydrogen atom, and the number of n is preferably 1 to 4. The structure of the left and right sides across n repetitive units may be different, but is preferably the same structure.

As the chemical compound (F5), more specifically, a chemical compound expressed by a formula (F51), a chemical compound expressed by a formula (F52), and the like are exemplified. The anion represented by $Z^-$ is similar to $Z^-$ in (F5).

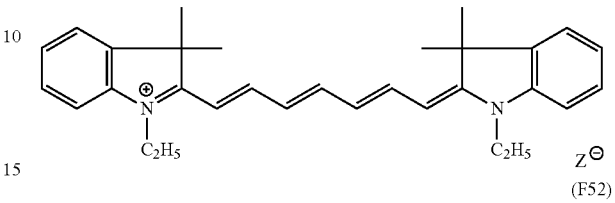

(F51)

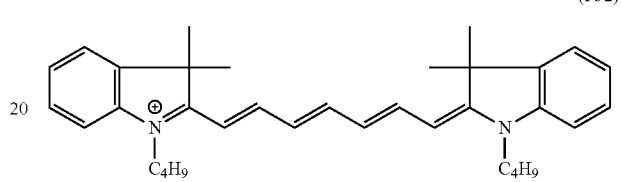

(F52)

As the dye (A1) which is a cyanine-based compound, a commercial product may be used. Examples of the commercial product include ADS680HO (product name, made by American Dye), S0830 (product name, made by FEW Chemicals), S2137 (product name, made by FEW Chemicals), and the like.

Further, examples of a phthalocyanine-based chemical compound usable as the dye (A1) include commercial products such as FB22 (product name, made by Yamada Chemical Co, Ltd.), TXEX720 (product name, made by Nippon Shokubai Co, Ltd.), PC142c (product name, made by Yamada Chemical Co., Ltd.), and the like.

The $\lambda_{max}$ of chemical compounds used as the dye (A1) exemplified above are presented in Table 1 together with the types of the transparent resins (B) used at the time of measurement.

TABLE 1

| Dye type | Chemical compound abbreviation or product name | Structure formula | Transparent resin (B) or product name | λmax [nm] |
| --- | --- | --- | --- | --- |
| Squarylium-based chemical compound | F11-1 | F11-1 | B-OKP2 | 711 |
| | F11-2 | F11-2 | B-OKP2 | 715 |
| | F11-3 | F11-3 | B-OKP2 | 706 |
| | F11-4 | F11-4 | B-OKP2 | 705 |
| | F11-4 | F11-4 | SP3810 | 704 |
| | F12-1 | F12-1 | B-OKP2 | 686 |
| | F12-2 | F12-2 | B-OKP2 | 715 |
| | F12-3 | F12-3 | B-OKP2 | 711 |
| | F13-1 | F13-1 | B-OKP2 | 715 |
| | F13-2 | F13-2 | B-OKP2 | 715 |
| | F7 | F7 | B-OKP2 | 734 |
| | S2084 | — | EA-F5003 | 679 |
| Cyanine-based compound | F51 | F51 | B-OKP2 | 740 |
| | F52 | F52 | B-OKP2 | 747 |
| | ADS680HO | — | EA-F5003 | 694 |
| Phthalocyanine-based compound | FB22 | — | Vylon103 | 681 |

Note that the B-OKP2 and Vylon (registered trademark) 103 used above as the transparent resin (B) are polyester resins, SP3810 is a polycarbonate resin, and EA-F5003 is an acrylic resin, details of which are as will be described later.

In this embodiment, as the dye (A1), one kind selected from a plurality of chemical compounds having a light absorbing property as the dye (A1) may be used solely, or two kinds or more selected therefrom may be used together. The dye (A) preferably contains one kind or two or more kinds of the dye (A1). Note that the dye (A) may contain any NIR absorbing dye as necessary other than the dye (A1). When a plurality of NIR absorbing dyes are used as the dye (A), it is preferred to use the NIR absorbing dyes in combination so that the maximum absorption wavelength appears in the wavelength of from 650 to 750 nm in an absorption spectrum of light with a wavelength of from 400 to 850 nm measured with respect to a resin film produced by dispersing the dyes in the transparent resin (B). Moreover, it is preferred to use the NIR absorbing dyes in combination so that absorption of visible light is small, an inclination on the visible light side of the absorption peak of $\lambda_{max}$ is steep, and the inclination is gradual on the long wavelength side in this absorption spectrum.

<Ultraviolet Absorber (U)>

The ultraviolet absorber (U) (hereinafter may also be referred to as an absorber (U)) is a chemical compound absorbing light with a wavelength of 430 nm or less. As the absorber (U), a chemical compound (hereinafter referred to as an absorber (U1)) satisfying requirements (iv-1) and (iv-2) is preferred.

(iv-1) The absorber has at least one maximum absorption wavelength at a wavelength of 415 nm or less in a light absorption spectrum of a wavelength of from 350 to 800 nm measured after dissolved in dichloromethane, and the maximum absorption wavelength $\lambda_{max}$(UV) on the longest-wavelength side in the maximum absorption in light with a wavelength of 415 nm or less is in a wavelength of from 360 to 415 nm.

(iv-2) When transmittance in the maximum absorption wavelength $\lambda_{max}$(UV) is 10% in a spectral transmittance curve measured after dissolved in dichloromethane, a difference $\lambda_{L90}-\lambda_{L50}$ between a wavelength $\lambda_{L90}$ with which transmittance becomes 90% at a longer wavelength than the maximum absorption wavelength $\lambda_{max}$(UV) and a wavelength $\lambda_{L50}$ with which transmittance becomes 50% at a longer wavelength than the maximum absorption wavelength $\lambda_{max}$(UV) is 13 nm or less.

The maximum absorption wavelength of the absorber (U) satisfying (iv-1) does not change largely in the transparent resin. That is, the absorber (U) satisfying (iv-1) is preferred because the maximum absorption wavelength $\lambda_{max\text{-}P}$(UV) in an in-resin absorption spectrum exists approximately within a wavelength of from 360 to 415 nm when this absorber (U) is dissolved or dispersed in the transparent resin.

The absorber (U) satisfying (iv-2) exhibits excellent steepness when contained in the transparent resin. That is, also when the absorber (U) is dissolved or dispersed in the transparent resin, the absorber (U) satisfying (iv-2) is preferred because the difference ($\lambda_{P90}-\lambda_{P50}$) between the wavelength $\lambda_{P50}$ with which transmittance becomes 50% at a longer wavelength than the maximum absorption wavelength $\lambda_{max\text{-}P}$(UV) and the wavelength $\lambda_{P90}$ with which the transmittance becomes 90% is approximately 14 nm or less, thereby exhibiting steepness equal to that in dichloromethane. Note that $\lambda_{P90}-\lambda_{P50}$ when the absorber (U) is dissolved or dispersed in the transparent resin is preferably 13 nm or less, more preferably 12 nm or less.

When the absorber (U) satisfying (iv-1) is used, a wavelength $\lambda_0$(UV) and a wavelength $\lambda_{30}$(UV) of the NIR filter in the embodiment obtained as the near-infrared absorbing layer 12 by dissolving or dispersing it into the transparent resin can both be made to exist in a shorter region than the wavelength of 450 nm, preferably, at a wavelength of from 400 to 425 nm. When the absorber (U) satisfying (iv-2) is used, in the NIR filter in the embodiment obtained as the near-infrared absorbing layer 12 by dissolving or dispersing it into the transparent resin, the difference between the wavelength with which transmittance becomes 50% on the long-wavelength side of the maximum absorption wavelength by the absorber (U) and the wavelength with which the transmittance becomes 90% can be made small. That is, in this wavelength region, a change in the spectral transmittance curve can be made steep.

When the absorber (U1) satisfying (iv-1) and (iv-2) is used, it is easy to make the wavelength $\lambda_0$(UV) and the wavelength $\lambda_{30}$(UV) exist in a region shorter than the wavelength 450 nm in the NIR filter of the embodiment, preferably a wavelength of from 400 to 425 nm, and a steep change of the spectral transmittance curve in a shorter region than the wavelength 450 nm can be obtained easily.

In this specification, the absorption spectrum of light with a wavelength of from 350 to 800 nm measured when the absorber (U) is dissolved in dichloromethane will also be referred to as an "absorption spectrum of the absorber (U)". The maximum absorption wavelength $\lambda_{max}$(UV) in the absorption spectrum of the absorber (U) will be referred to as the "$\lambda_{max}$(UV) of the absorber (U)". The spectral transmittance curve measured when the absorber (U) is dissolved in dichloromethane will be referred to as a "spectral transmittance curve of the absorber (U)". In the spectral transmittance curve of the absorber (U), when contained by an amount that makes transmittance at $\lambda_{max}$(UV) of the absorber (U) be 10%, the wavelength with which the transmittance becomes 90% at a longer wavelength than the $\lambda_{max}$(UV) of the absorber (U) will be referred to as "$\lambda_{L90}$", and the wavelength with which the transmittance becomes 50% at a longer wavelength than the $\lambda_{max}$(UV) of the absorber (U) will be referred to as "$\lambda_{L50}$".

Further, in this specification, the absorption spectrum of light with a wavelength of from 350 to 800 nm measured in an absorption layer produced by dissolving the absorber (U) in the transparent resin will also be referred to as an "in-resin absorption spectrum of the absorber (U)". The maximum absorption wavelength $\lambda_{max\text{-}p}$(UV) in the in-resin absorption spectrum of the absorber (U) will be referred to as the $\lambda_{max\text{-}p}$(UV) of the absorber (U)". A spectral transmittance curve measured in an absorption layer produced by dissolving the absorber (U) in the transparent resin will be referred to as an "in-resin spectral transmittance curve of the absorber (U)". In the in-resin spectral transmittance curve of the absorber (U), when contained by an amount that makes transmittance at $\lambda_{max\text{-}P}$(UV) of the absorber (U) be 10%, the wavelength with which the transmittance becomes 90% at a longer wavelength than the $\lambda_{max}$ (UV) of the absorber (U) will be referred to as "$\lambda_{P90}$", and the wavelength with which the transmittance becomes 50% at a longer wavelength than the $\lambda_{max\text{-}P}$(UV) of the absorber (U) will be referred to as "$\lambda_{P50}$".

The wavelength $\lambda_{max}$(UV) of the absorber (U) is preferably at a wavelength of from 365 to 415 nm, more preferably at a wavelength of from 370 to 410 nm. The wavelength $\lambda_{max}$(UV) of the absorber (U) being in this region makes it easy to obtain the above-described effect, namely, the steep change of the spectral transmittance curve at a wavelength of from 400 to 425 nm. Further, the difference ($\lambda_{L90}-\lambda_{L50}$) between $\lambda_{L90}$ and $\lambda_{L50}$ of the absorber (U) is preferably 12 nm or less, more preferably 11 nm or less, furthermore preferably 9 nm or less. The $\lambda_{L90}$-$\lambda_{L50}$ being in this region makes it easy to obtain the above-described effect.

Specific examples of the absorber (U1) which satisfies (iv-1) and (iv-2) include dyes of oxazole-based, merocyanine-based, cyanine-based, naphthalimide-based, oxadiazole-based, oxazine-based, oxazolidine-based, naphthalic acid-based, styryl-based, anthracene-based, cyclic carbonyl-based, triazole-based, and the like.

Examples of commercial products include, as the oxazole-based dye, Uvitex (registered trademark) OB (product name made by Ciba), Hakkol (registered trademark) RF-K (product name made by Showa Chemical Industry Co., Ltd.), Nikkafluor EFS, Nikkafluor SB-conc (product names both being made by Nippon Chemical Industrial CO., LTD.), and the like. Examples of the merocyanine-based dye include S0511 (product name made by FEW Chemicals), and the like. Examples of the cyanine-based dye include SMP370, SMP416 (both being product names made by Hayashibara Co., Ltd.), and the like. Examples of the naphthalimide-based dye include Lumogen (registered trademark) F violet 570 (product name made by BASF), and the like.

Examples of the absorber (U1) include dyes expressed by a formula (N). Note that in this specification, unless otherwise particularly mentioned, the dye expressed by a formula (N) will be described as a dye (N). A dye expressed by another formula is also described similarly. Further, a group expressed by a formula (In) will be described as a group (1n). Any group expressed by another formula will be described similarly.

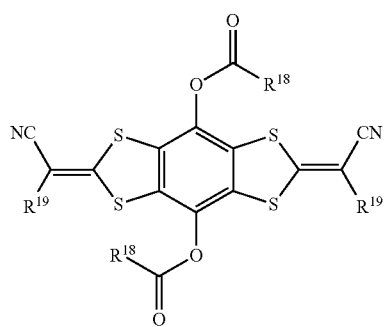

(N)

$R^{18}$ in the formula (N) may each independently represent a hydrocarbon group having 1 to 20 carbon atoms which may contain a saturated or unsaturated ring structure, and may have a branch. Specific examples include an alkyl group, an alkenyl group, a saturated cyclic hydrocarbon group, an awl group, and an alaryl group of linear chain or branched chain, and the like. Further, in the formula (N), $R^{19}$ are each independently a cyano group or a group expressed by a formula (n).

—COOR$^{30}$ (n)

In the formula (n), $R^{30}$ represents a hydrocarbon group having 1 to 20 carbon atoms which may contain a saturated or unsaturated ring structure, and may have a branch. Specific examples include an alkyl group, an alkenyl group, a saturated cyclic hydrocarbon group, an awl group, and an alaryl group of linear chain or branched chain, and the like.

$R^{18}$ in the dye (N) are preferably, among others, a group expressed by formulae (1n) to (4n). Further, $R^{19}$ in the dye (N) are preferably, among others, a group expressed by a formula (5n).

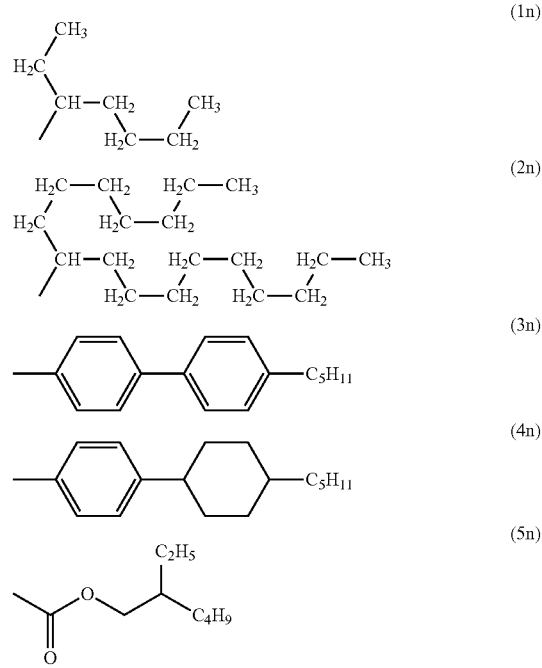

As specific examples of the dye (N), dyes (N-1) to (N-4) of structures presented in Table 2 can be exemplified. Note that specific structures of $R^{18}$ and $R^{19}$ in Table 2 correspond to formulae (1n) to (5n). Corresponding dye abbreviations are also presented in Table 2. Note that in the dyes (N-1) to (N-4), two $R^{18}$ present are the same, and $R^{19}$ are the same as well.

TABLE 2

| Dye abbreviation | $R^{18}$ | $R^{19}$ |
|---|---|---|
| N-1 | 1n | 5n |
| N-2 | 2n | 5n |
| N-3 | 3n | 5n |
| N-4 | 4n | 5n |

Among the absorbers (U1) exemplified above, the dyes of oxazole-based and merocyanine-based are preferred, and examples of commercial products thereof include Uvitex (registered trademark) OB, Haldol (registered trademark) RF-K, and S0511.

(Merocyanine-Based Dyes)

As the absorber (U1), merocyanine-based dyes expressed by a formula (M) are particularly preferred.

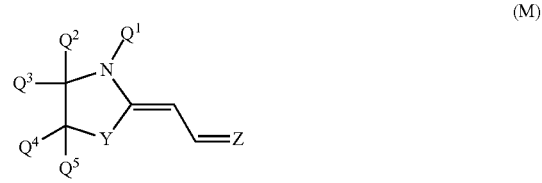

(M)

In the formula (M), Y represents an oxygen atom or a methylene group substituted by $Q^6$ and $Q^7$. Here, $Q^6$ and $Q^7$ each independently represent a hydrogen atom, a halogen atom, or an alkyl group or an alkoxy group having 1 to 10 carbon atoms. $Q^6$ and $Q^7$ are preferably each independently a hydrogen atom or an alkyl group or an alkoxy group having 1 to 10 carbon atoms, and more preferably are both a hydrogen atom or at least one of them is a hydrogen atom and the other is an alkyl group having 1 to 4 carbon atoms. Particularly preferably, $Q^6$ and $Q^7$ are both a hydrogen atom.

$Q^1$ represents a monovalent hydrocarbon group having 1 to 12 carbon atoms which may have a substituent. The monovalent hydrocarbon group is preferably an alkyl group having 1 to 12 carbon atoms in which part of hydrogen atoms may be substituted by an aliphatic ring, an aromatic ring or an alkenyl group, a cycloalkyl group having 3 to 8 carbon atoms in which part of hydrogen atoms may be substituted by an aromatic ring, an alkyl group or an alkenyl group, and an aryl group having 6 to 12 carbon atoms in which part of hydrogen atoms may be substituted by an aliphatic ring, an alkyl group or an alkenyl group. When $Q^1$ is an alkyl group having no substituent, this alkyl group may be of either linear chain or branched chain, and a number of carbon atoms thereof is more preferably 1 to 6.

As the alkyl group having 1 to 12 carbon atoms in which part of hydrogen atoms are substituted by an aliphatic ring, an aromatic ring or an alkenyl group, an alkyl group having 1 to 4 carbon atoms having a cycloalkyl group having 3 to 6 carbon atoms and an alkyl group having 1 to 4 carbon atoms which is substituted by a phenyl group are more preferred, and an alkyl group having 1 or 2 carbon atoms which is substituted by a phenyl group is particularly preferred. Note that the alkyl group substituted by an alkenyl group means one which is an alkenyl group in its entirety but has no unsaturated bond between a first position and a second position, for example, an allyl group or 3-butenyl group, or the like. As the hydrocarbon group having a substituent, a hydrocarbon group having one or more of an alkoxy group, an acyl group, an acyloxy group, a cyano group, a dialkylamino group or a chlorine atom is preferred. The number of carbon atoms of these alkoxy group, acyl group, acyloxy group and dialkylamino group is preferably 1 to 6.

Preferred $Q^1$ is an alkyl group having 1 to 6 carbon atoms in which part of hydrogen atoms may be substituted by a cycloalkyl group or a phenyl group. Particularly preferred $Q^1$ is an alkyl group having 1 to 6 carbon atoms, and specific example include a methyl group, an ethyl group, a propyl group, an isopropyl group, a butyl group, an isobutyl group, a t-butyl group, and the like.

$Q^2$ to $Q^5$ each independently represent a hydrogen atom, a halogen atom, or an alkyl group or an alkoxy group having 1 to 10 carbon atoms. The number of carbon atoms of the alkyl group and the alkoxy group is preferably 1 to 6, more preferably 1 to 4. At least one of $Q^2$ and $Q^3$ is preferably an alkyl group, and both of them are more preferably an alkyl group. When $Q^2$ or $Q^3$ is not an alkyl group, a hydrogen atom is more preferred. Both $Q^2$ and $Q^3$ are particularly preferably an alkyl group having 1 to 6 carbon atoms. At least one of $Q^4$ and $Q^5$ is preferably a hydrogen atom, and more preferably both of them are a hydrogen atom. When $Q^4$ or $Q^5$ is not a hydrogen atom, alkyl group having 1 to 6 carbon atoms is preferred.

Z represents any of bivalent groups expressed by formulae (Z1) to (Z5).

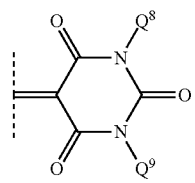
(Z1)

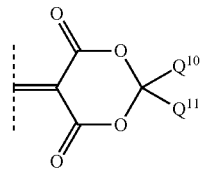
(Z2)

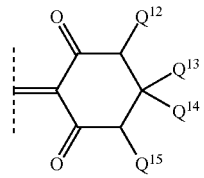
(Z3)

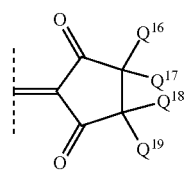
(Z4)

(Z5)

In formulae (Z1) to (Z5), $Q^8$ and $Q^9$ each independently represent a monovalent hydrocarbon group having 1 to 12 carbon atoms which may have a substituent. $Q^8$ and $Q^9$ may be different groups but preferably are the same groups.

As the monovalent hydrocarbon group, an alkyl group having 1 to 12 carbon atoms in which part of hydrogen atoms may be substituted by an aliphatic ring, an aromatic ring or an alkenyl group, a cycloalkyl group having 3 to 8 carbon atoms in which part of hydrogen atoms may be substituted by an aromatic ring, an alkyl group or an alkenyl group, and an aryl group having 6 to 12 carbon atoms in which part of hydrogen atoms may be substituted by an aliphatic ring, an alkyl group or an alkenyl group are preferred.

When $Q^8$ and $Q^9$ are an alkyl group having no substituent, this alkyl group may be of either linear chain or branched chain, and a number of carbon atoms thereof is more preferably 1 to 6. As the alkyl group having 1 to 12 carbon atoms in which part of hydrogen atoms are substituted by an aliphatic ring, an aromatic ring or an alkenyl group, an alkyl group having 1 to 4 carbon atoms having a cycloalkyl group having 3 to 6 carbon atoms and an alkyl group having 1 to 4 carbon atoms which is substituted by a phenyl group are more preferred, and an alkyl group having 1 or 2 carbon atoms which is substituted by a phenyl group is particularly preferred. Note that the alkyl group substituted by an alkenyl group means one which is an alkenyl group in its entirety but has no unsaturated bond between a first position and a second position, for example, an allyl group or 3-butenyl group, or the like.

As the monovalent hydrocarbon group having a substituent, a hydrocarbon group having one or more of an alkoxy group, an acyl group, an acyloxy group, a cyano group, a dialkylamino group or a chlorine atom is preferred. The number of carbon atoms of these alkoxy group, acyl group, acyloxy group and dialkylamino group is preferably 1 to 6.

Preferred $Q^8$ and $Q^9$ are both an alkyl group having 1 to 6 carbon atoms in which part of hydrogen atoms may be substituted by a cycloalkyl group or a phenyl group. Particularly preferred $Q^8$ and $Q^9$ are both an alkyl group having 1 to 6 carbon atoms, and specific examples include a methyl group, an ethyl group, a propyl group, an isopropyl group, a butyl group, an isobutyl group, a t-butyl group, and the like.

$Q^{10}$ to $Q^{19}$ each independently represent a hydrogen atom or a monovalent hydrocarbon group having 1 to 12 carbon atoms which may have a substituent. The monovalent hydrocarbon group having 1 to 12 carbon atoms which may have a substituent is a hydrocarbon group similar to the above-described $Q^8$ and $Q^9$. As the monovalent hydrocarbon group having 1 to 12 carbon atoms which may have a substituent, an alkyl group having 1 to 6 carbon atoms which has no substituent is preferred.

$Q^{10}$ and $Q^{11}$ are both more preferably an alkyl group having 1 to 6 carbon atoms, and particularly preferably are the same alkyl group. $Q^{12}$ and $Q^{15}$ are preferably a hydrogen atom or an alkyl group having 1 to 6 carbon atoms which has no substituent. Any two groups bonded to the same carbon atom ($Q^{13}$ and $Q^{14}$, $Q^{16}$ and $Q^{17}$, $Q^{18}$ and $Q^{19}$) are preferably a hydrogen atom or an alkyl group having 1 to 6 carbon atoms.

As the chemical compound expressed by the formula (M), a chemical compound in which Y is an oxygen atom and Z is a group (Z1) or group (Z2), and a chemical compound in which Y is a methylene group substituted by $Q^6$ and $Q^7$ and Z is a group (Z1) or group (Z5) are preferred. As Z when Y is an oxygen atom, the group (Z1) or group (Z2) is more preferred in which $Q^1$ is an alkyl group having 1 to 6 carbon atoms, $Q^2$ and $Q^3$ are a hydrogen atom or an alkyl group having 1 to 6 carbon atoms, and $Q^4$ and $Q^5$ are both a hydrogen atom. The group (Z1) or group (Z2) in which $Q^1$ is an alkyl group having 1 to 6 carbon atoms, $Q^2$ and $Q^3$ are both an alkyl group having 1 to 6 carbon atoms, and $Q^4$ and $Q^5$ are both a hydrogen atom is particularly preferred.

As the chemical compound in which Y is a methylene group substituted by $Q^6$ and $Q^7$ and Z is the group (Z1) or group (Z5), the group (Z1) or group (Z5) is preferred in which $Q^1$ is an alkyl group having 1 to 6 carbon atoms, $Q^2$ and $Q^3$ are both a hydrogen atom or an alkyl group having 1 to 6 carbon atoms, and $Q^4$ to $Q^7$ are all a hydrogen atom, and the group (Z1) or group (Z5) in which $Q^1$ is an alkyl group having 1 to 6 carbon atoms and $Q^2$ to $Q^7$ are all a hydrogen atom is more preferred. As the chemical compound expressed by the formula (M), a chemical compound in which Y is an oxygen atom and Z is the group (Z1) or group (Z2) is preferred, and a chemical compound in which Y is an oxygen atom and Z is the group (Z1) is particularly preferred.

Specific examples of the dye (M) include chemical compounds expressed by formulae (M-1) to (M-11).

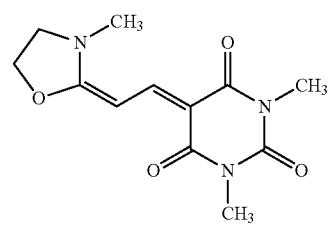
(M-1)

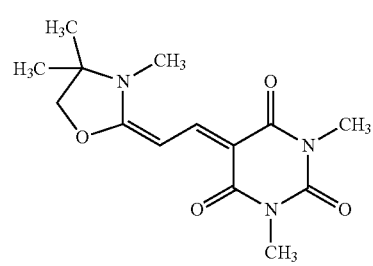
(M-2)

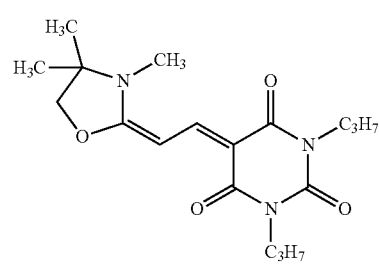
(M-3)

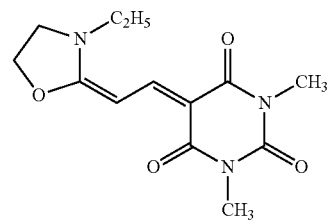
(M-4)

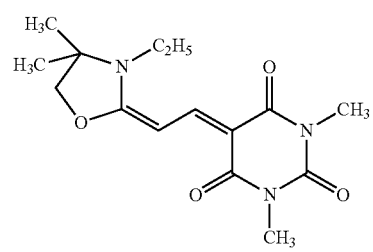
(M-5)

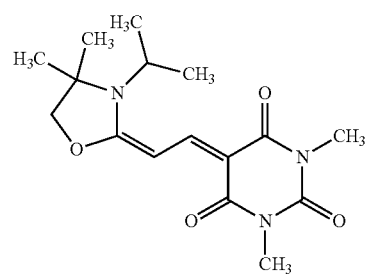
(M-6)

-continued

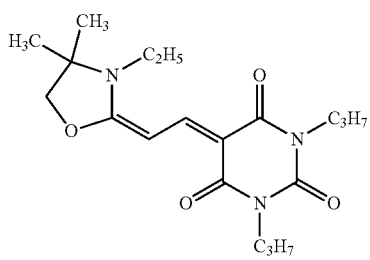
(M-7)

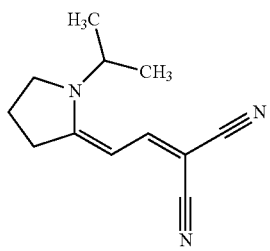
(M-8)

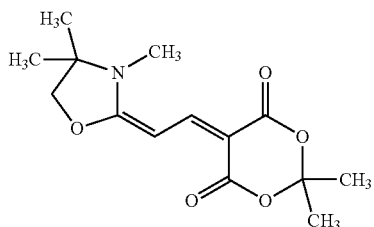
(M-9)

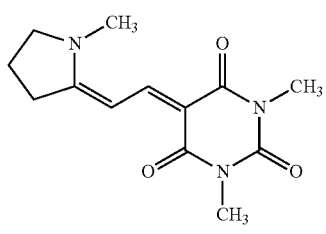
(M-10)

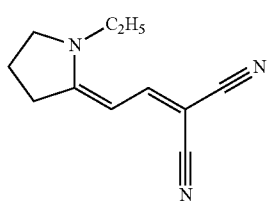
(M-11)

Further, as the absorber (U1), ABS 407 made by Exiton, UV381A, UV381B, UV382A, UV386A, VIS404A made by QCR Solutions Corp., ADA1225, ADA3209, ADA3216, ADA3217, ADA3218, ADA3230, ADA5205, ADA2055, ADA6798, ADA3102, ADA3204, ADA3210, ADA2041, ADA3201, ADA3202, ADA3215, ADA3219, ADA3225, ADA3232, ADA4160, ADA5278, ADA5762, ADA6826, ADA7226, ADA4634, ADA3213, ADA3227, ADA5922, ADA5950, ADA6752, ADA7130, ADA8212, ADA2984, ADA2999, ADA3220, ADA3228, ADA3235, ADA3240, ADA3211, ADA3221, ADA5220, and ADA7158 made by HW Sand Corp., DLS 381B, DLS 381C, DLS 382A, DLS 386A, DLS 404A, DLS 405A, DLS 405C, and DLS 403A, made by Crysta-Lyn Chemical Company, or the like may be used.

The above-exemplified product names, or formula number of the chemical compounds used as the absorber (U1) and $\lambda_{max}$(UV), wavelength $\lambda_{L90}$, wavelength $\lambda_{L50}$ and $\lambda_{L90}$-$\lambda_{L50}$ which are measured after dissolved in dichloromethane are presented in Table 3.

TABLE 3

| Ultraviolet absorber (U1) | $\lambda max$ (UV) [nm] | $\lambda_{L50}$ [nm] | $\lambda_{L90}$ [nm] | $\lambda_{L90} - \lambda_{L50}$ [nm] |
|---|---|---|---|---|
| Uvitex OB | 396 | 408 | 415 | 7 |
| S0511 | 396 | 408 | 417 | 9 |
| SMP370 | 403 | 414 | 423 | 9 |
| Hakkol RF-K | 372 | 404 | 413 | 9 |
| Nikkafluor EFS | 377 | 411 | 420 | 9 |
| Nikkafluor SB-conc | 395 | 408 | 415 | 7 |
| Lumogen F violet 570 | 393 | 406 | 413 | 7 |
| N-1 | 384 | 393 | 400 | 7 |
| N-2 | 384 | 393 | 401 | 8 |
| N-3 | 385 | 394 | 401 | 7 |
| N-4 | 385 | 394 | 401 | 7 |
| M-2 | 396 | 409 | 418 | 9 |
| M-9 | 379 | 392 | 401 | 9 |
| M-8 | 390 | 404 | 413 | 9 |

In this embodiment, as the absorber (U1), one kind selected from a plurality of chemical compounds having light absorbing properties as the absorber (U1) may be used solely or two or more kinds thereof may be used in combination.

The absorber (U) preferably contains one kind or two or more kinds of absorbers (U1). Note that the absorber (U) may contain any ultraviolet absorber other than the absorber (U1) as necessary in the range not impairing the effects of the absorber (U1).

<Transparent Resin (B)>

As the transparent resin (B), a transparent resin with a refractive index of 1.45 or more is preferred. The refractive index is more preferably 1.5 or more, particularly preferably 1.6 or more. The refractive index of the transparent resin (B) has no particular upper limit, but is preferably about 1.72 for availability or the like. The refractive index in this specification means a refractive index at a wavelength of 588 nm at 20° C., and the refractive index means this refractive index unless particularly described otherwise.

Examples of the transparent resin (B) include an acrylic resin, an epoxy resin, an ene-thiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide-imide resin, a polyolefin resin, a cyclic olefin resin, and a polyester resin. As the transparent resin (B), one kind may be selected and used solely from these resins, or two or more kinds may be mixed and used. Further, when the transparent resin (B) with a refractive index of 1.45 or more is used, one kind may be selected and used solely from these resins, or two or more kinds may be mixed and used if the refractive index is 1.45 or more in their entirety.

From the above resins, from the viewpoint of solubility of the dye (A) or the absorber (U) to the transparent resin (B), the transparent resin is preferably one or more kinds selected from an acrylic resin, a polyester resin, a polycarbonate resin, an ene-thiol resin, an epoxy resin, and a cyclic olefin resin. Moreover, the transparent resin is more preferably one or more kinds selected from an acrylic resin, a polyester resin, a polycarbonate resin, and a cyclic olefin resin. The polyester resin is preferably a polyethylene terephthalate resin, a polyethylene naphthalate resin, and the like.

The refractive index of the transparent resin (B) can be adjusted in the above range by, for example, adjusting a molecule structure of raw material components so as to have a specific structure in a main chain or side chains of a polymer. One example of a structure to have in the polymer so as to adjust the refractive index in the above range is a fluorene skeleton expressed by a formula (B1). Note that among fluorene skeletons, 9,9-bisphenylfluorene skeleton expressed by a formula (B2) is preferred in the point that higher refractive index and heat resistance can be obtained.

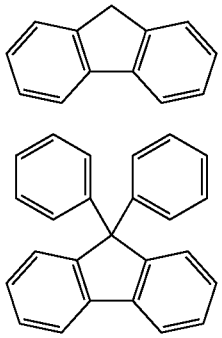

(B1)

(B2)

As resins having the above fluorene skeleton or 9,9-bisphenylfluorene skeleton, an acrylic resin, a polycarbonate resin and a polyester resin are preferred.

One example of the acrylic resin having a fluorene skeleton is an acrylic resin obtained by polymerizing raw material components containing a 9,9-bisphenylfluorene derivative in which one substituent having a (meth)acryloyl group is introduced at least to a terminal of two phenyl groups of 9,9-bisphenylfluorene. Note that "(meth) acryloyl . . . " in this specification is a generic term of "methacryloyl . . . " and "acryloyl . . . ".

Further, an acrylic resin obtained by polymerizing a chemical compound in which a hydroxyl group is introduced into a 9,9-bisphenylfluorene derivative having the above (meth)acryloyl group with a urethane (meth)acrylate chemical compound may be used. One example of the urethane (meth)acrylate chemical compound is a chemical compound obtained as a reaction product of a (meth)acrylate chemical compound having a hydroxyl group and a polyisocyanate compound, or a chemical compound obtained as a reaction product of a (meth)acrylate chemical compound having a hydroxyl group, a polyisocyanate compound, and a polyol compound.

One example of the polyester resin in which the fluorene skeleton is introduced is a polyester resin in which a 9,9-bisphenylfluorene derivative expressed by a formula (B2-1) is introduced as an aromatic diol. In this case, the type of a dicarboxylic acid to react with the aromatic diol is not particularly limited. Such a polyester resin is preferably used as the transparent resin (B) in the point of a refractive index value or transparency in the visible wavelength region.

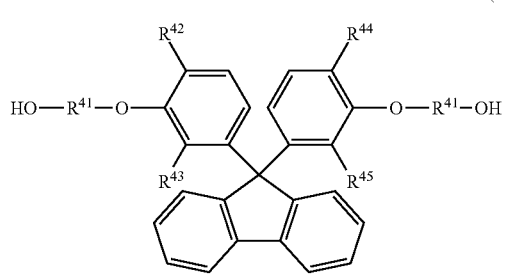

(B2-1)

In the formula (B2-1), $R^{41}$ represents an alkylene group having 2 to 4 carbon atoms, $R^{42}$, $R^{43}$, $R^{44}$ and $R^{45}$ each independently represent a hydrogen atom, a saturated hydrocarbon group having 1 to 7 carbon atoms, or an aryl group having 6 to 7 carbon atoms.

As the transparent resin (B), a commercial product may be used. One commercial product of the acrylic resin is a resin obtained by curing OGSOL (registered trademark) EA-F5003 (product name made by Osaka Gas Chemicals Co., Ltd., refractive index: 1.59). Further, one example of an acrylic resin already available as a polymer is a polymethyl methacrylate (refractive index: 1.49) and a polyisobutyl methacrylate (refractive index: 1.48) made by Tokyo Chemical Industry Co., Ltd.

Further, examples of commercial products of the polyester resin include OKPH4HT (refractive index: 1.64), OKPH4 (refractive index: 1.61), B-OKP2 (refractive index: 1.63), OKP-850 (refractive index: 1.65) made by Osaka Gas Chemicals Co., Ltd., and Vylon (registered trademark) 103 (made by Toyobo Co., Ltd., refractive index: 1.58). Examples of commercial products of the polycarbonate resin include SP3810 (mad by Teijin Chemicals Ltd., refractive index: 1.64), and LeXan (registered trademark) ML9103 (made by Sabic, refractive index: 1.59). Examples of polymer alloys include Panlite (registered trademark) AM-8 series (mad by Teijin Chemicals Ltd.), which is an alloy of polycarbonate and polyester, xylex (registered trademark) 7507 (made by Sabic), and the like.

<Near-Infrared Absorbing Layer>

The near-infrared absorbing layer 12 is a layer containing a dye (A) and a transparent resin (B). Preferably, the near-infrared absorbing layer 12 further contains the absorber (U).

The near-infrared absorbing layer 12, by containing the dye (A), preferably has an optical property of (a1) and an optical property of (a2).

(a1)) Having the maximum absorption wavelength $\lambda_{max}$ at a wavelength of from 650 to 750 nm in an absorption spectrum.

(a2) Transmittance being 80% or more in light with a wavelength of from 450 nm to 550 nm.

The near-infrared absorbing layer 12 may be structured to have optical properties (i-1) and (i-2) in NIR filters 10A, 10B, 10C obtained by combining and stacking the near-infrared absorbing layer 12, the glass substrate 11, and at least one dielectric multilayer film selected from the first dielectric multilayer film 13 and the second dielectric multilayer film 14.

(i-1) Average value of transmittance of light at an incident angle of 0 degree in a wavelength of from 450 to 550 nm is 80% or more.

(i-2) Average value of transmittance of light at an incident angle of 0 degree in a wavelength of from 650 to 720 nm is 15% or less.

Here, the near-infrared absorbing layer 12 having the optical properties (a1) and (a2) is preferred because the optical properties of (i-1) and (i-2) for the NIR filters 10A, 10B, 10C can be obtained easily. Thus, when the NIR filters 10A to 10C are used as, for example, an NIR filter of a digital still camera or the like, efficiency of use of visible light can be improved while blocking near-infrared light, which is advantageous in noise suppression in imaging of a dark part.

The content of the dye (A) in the near-infrared absorbing layer 12 is preferably the amount which makes the near-infrared absorbing layer 12 satisfy the optical properties (a1) and (a2). Moreover, the content of the dye (A) in the near-infrared absorbing layer 12 is preferably adjusted so as to have a wavelength with which transmittance becomes 50% in a region where the wavelength is longer than the wavelength of 600 nm of the spectral transmittance curve at an incident angle of 0 degree of the NIR filter of the embodiment, preferably a wavelength of from 610 to 640 nm. Specifically, the dye (A) is preferably 0.1 to 30 parts by mass, more preferably 0.5 to 25 parts by mass, particularly preferably 1 to 20 parts by mass, relative to 100 parts by mass of the transparent resin (B) in the near-infrared absorbing layer 12.

When the near-infrared absorbing layer 12 contains the absorber (U), the near-infrared absorbing layer 12 may be structured to have optical properties (ii-1) and (ii-2) in NIR filters 10A to 10C obtained by combining and stacking the near-infrared absorbing layer 12, the glass substrate 11, and at least one dielectric multilayer film selected from the first dielectric multilayer film 13 and the second dielectric multilayer film 14.

(ii-1) Average value of transmittance of light at an incident angle of 0 degree is 70% or more in a wavelength of from 430 to 450 nm.

(ii-2) Average value of transmittance of light at an incident angle of 0 degree is 5% or less in a wavelength of from 350 to 390 nm.

The content of the absorber (U) in the near-infrared absorbing layer 12 is preferably the amount which makes the NIR filter of the embodiment having the near-infrared absorbing layer 12 satisfy the optical properties (ii-1) and (ii-2). Moreover, the content of the absorber (U) in the near-infrared absorbing layer 12 is preferably set so as to have a wavelength with which transmittance becomes 50% in a region where the wavelength is shorter than the wavelength of 450 nm of the spectral transmittance curve at an incident angle of 0 degree of the NIR filter of the embodiment, preferably, light with a wavelength of from 400 to 425 nm. The absorber (U) is preferably contained by 0.01 to 30 parts by mass, more preferably 0.05 to 25 parts by mass, furthermore preferably 0.1 to 20 parts by mass, relative to 100 parts by mass of the transparent resin (B) in the near-infrared absorbing layer 12.

The near-infrared absorbing layer 12 may contain, within the range not impairing the effects of the present invention, any other optional components as necessary, besides the dye (A) and the transparent resin (B), and the absorber (U) as an optional component. Specific examples of these other optional components include a near-infrared and/or infrared absorbent, a color tone correcting dye, an ultraviolet absorbent, a leveling agent, an antistatic agent, a heat stabilizer, a light stabilizer, an antioxidant, a dispersing agent, a flame retardant, a lubricant, a plasticizer, and the like. Further, examples of components added to a coating liquid used when a near-infrared absorbing layer which will be described later is formed include, for example, components derived from a silane coupling agent, a thermal polymerization initiator or photopolymerization initiator, polymerization catalyst, and the like. The contents of each of these other optional components in the near-infrared absorbing layer is preferably 15 parts by mass or less relative to 100 parts by mass of the transparent resin (B).

The film thickness of the near-infrared absorbing layer 12 is set appropriately depending on an arrangement space in the device in which it is used, a required absorbing property, and so on. The film thickness is preferably from 0.1 to 100 μm. When the film thickness is less than 0.1 μm, it is possible that a near-infrared absorbing capability cannot be exhibited sufficiently. Further, when the film thickness exceeds 100 μm, flatness of the film decreases, and it is possible that a dispersion in absorptance occurs. The film thickness is preferably from 0.5 to 50 μm. In this range, both the sufficient near-infrared absorbing capability and the flatness of the film thickness can be achieved. Note that when the ultraviolet absorbing layer is provided separately, the film thickness of the ultraviolet absorbing layer just need to satisfy the above range.

As the near-infrared and/or infrared absorbent, one which does not impair the effect by the optical properties of the dye (A), preferably the dye (A1) will be used. As such a near-infrared absorbent and/or infrared absorbent, inorganic particles can be used preferably, and specific examples include particles of ITO (Indium Tin Oxide), ATO (Antimony-doped Tin Oxide), cesium tungstate, lanthanum boride, and the like. Among them, the ITO particles and the cesium tungstate particles have high transmittance of visible light and have a light absorbing property in a wide range including light in an infrared region exceeding 1200 nm. Thus, they are particularly preferred when an infrared light blocking property is needed.

The number average aggregated particle size of the ITO particles and the cesium tungstate particles are preferably 5 to 200 nm, more preferably 5 to 100 nm, furthermore preferably 5 to 70 nm, from the point of suppressing scattering and maintaining transparency. Here, in this specification, the number average aggregated particle size refers to a value measured in a dispersion liquid for particle size measurement obtained by dispersing specimen particles in a dispersion medium such as water, alcohol, or the like by using a dynamic light scattering particle size distribution analyzer.

The content of the near-infrared absorbent and/or infrared absorbent is preferably 0.1 to 15 parts by mass, more preferably 0.3 to 10 parts by mass relative to 100 parts by mass of the transparent resin (B). This secures other physical properties required in the near-infrared absorbing layer, and meanwhile the near-infrared absorbent and/or infrared absorbent can exhibit its function.

Examples of the ultraviolet absorber preferably include a benzotriazole-based ultraviolet absorbent, a benzophenone-based ultraviolet absorbent, a salicylate-based ultraviolet absorbent, a cyanoacrylate-based ultraviolet absorbent, triazine-based ultraviolet absorbent, an okizanirido-based ultraviolet absorbent, a nickel complex salt-based ultraviolet absorbent, an inorganic ultraviolet absorbent, and the like. One example of commercial product is a product named "TINUVTN 479" made by Ciba, or the like.

Examples of the inorganic ultraviolet absorbent include particles of zinc oxide, titanium oxide, cerium oxide, zirconium oxide, mica, kaoline, sericite, and the like. The number average aggregated particle size of the inorganic ultraviolet absorbent is preferably 5 to 200 nm, more preferably 5 to 100 nm, furthermore preferably 5 to 70 nm, from the point of transparency. The content of the ultraviolet absorbent is preferably 0.01 to 10 parts by mass, more preferably 0.05 to 5 parts by mass relative to 100 parts by mass of the transparent resin (B). This secures other physical properties required in the near-infrared absorbing layer, and meanwhile the ultraviolet absorbent can exhibit its function.

Examples of the light stabilizer include hindered amines and nickel complexes such as nickelbis(octylphenyl)sulfide, nickel complex-3,5-di-tert-butyl-4-hydroxybenzyl phosphate monoethylate, nickel dibutyldithiocarbamate, and the like. One kind of them may be used solely or two or more kinds of them may be used in combination. The content of the light stabilizer is preferably 0.01 to 10 parts by mass, more preferably 0.5 to 5 parts by mass relative to 100 parts by mass of the transparent resin (B).

Examples of the silane coupling agent include aminosilanes such as 3-aminopropyltriethoxysilane, N-2-(aminoethyl)-3-aminopropyltrimethoxysilane, N-2-(aminoethyl)-N'-2-(aminoethyl)-3-aminopropyltriethoxysilane, and 3-anilinopropyltrimethoxysilane; epoxysilanes such as 3-glycidoxypropyltrimethoxysilane, and 2-(3,4-epoxycyclohexyl)ethyltrimethoxysilane; vinylsilanes such as vinyltrimethoxysilane, N-2-(N-vinylbenzylaminoethyl)-3-aminopropyltrimethoxysilane; and 3-methacryloxypropyltrimethoxysilane, 3-chloropropyltrimethoxysilane, 3-mercaptopropyltrimethoxysilane, (3-ureidopropyl)trimethoxysilane, and the like.

The type of the silane coupling agent used can be selected appropriately according to the transparent resin (B) used in combination. The content of the silane coupling agent is preferably 1 to 20 parts by mass, more preferably 5 to 15 parts by mass relative to 100 parts by mass of the transparent resin (B) in a coating liquid which will be explained below.

Examples of the photopolymerization initiator include acetophenones, benzophenones, benzoins, benzyls, Michler's ketones, benzoin alkylethers, benzyl dimethyl ketals, and thioxanthones, and the like. Further, examples of the thermal polymerization initiator include polymerization initiators of azobis-based and of peroxides. One kind of them may be used solely or two or more kinds of them may be used in combination. The content of photopolymerization initiator or thermal polymerization initiator is preferably 0.01 to 10 parts by mass, more preferably 0.5 to 5 parts by mass relative to 100 parts by mass of the transparent resin (B) in the coating liquid which will be described below.

The near-infrared absorbing layer 12 can be manufactured by, for example, applying a coating liquid, which is prepared by dispersing and dissolving the dye (A) and the transparent resin (B) or raw material components of the transparent resin (B), and moreover the absorber (U) as an option in a solvent, on the glass substrate 11 and drying it, and moreover curing it as necessary. Forming the near-infrared absorbing layer 12 in such a method, it can be produced evenly with a desired film thickness. When the near-infrared absorbing layer 12 contains the optional component, the coating liquid contains the optional component.

The solvent is not particularly limited as long as it is a dispersion medium in which the dye (A) and the transparent resin (B) or raw material components of the transparent resin (B), and moreover the absorber (U) contained optionally can be dispersed stably or a solvent in which they can be dissolved stably. Note that the "solvent" in this specification is used as a term which includes both the dispersion medium and the solvent. Specific examples of the solvent include ketone such as acetone and cyclohexanone; ether such as tetrahydrofuran, 1,4-dioxane, and 1,2-dimethoxyethane; esters such as ethyl acetate, butyl acetate, and methoxyethyl acetate; alcohols such as methanol, ethanol, 1-propanol, 2-propanol, 1-butanol, 2-butanol, 2-methyl-1-propanol, 2-methoxyethanol, 4-methyl-2-pentanol, 2-butoxyethanol, 1-methoxy-2-propanol, and diacetone alcohol; hydrocarbons such as n-hexane, n-heptane, isooctane, benzene, toluene, xylene, gasoline, diesel oil, and kerosene; acetonitrile, nitromethane, water, and the like. One kind of them may be used solely or two or more kinds of them may be used in combination.

The amount of the solvent is preferably 10 to 5000 parts by mass, particularly preferably 30 to 2000 parts by mass relative to 100 parts by mass of the transparent resin (B). Note that the content of nonvolatile components (solid content) in the coating liquid is preferably 2 to 50 mass %, particularly preferably 5 to 40 mass % relative to the entire amount of the coating liquid.

To prepare the coating liquid, a stirring device such as a magnetic stirrer, a rotating/revolving mixer, a bead mill, a planetary mill, or an ultrasonic homogenizer can be used. In order to secure high transparency, it is preferred to perform stirring sufficiently. The stirring may be performed sequentially or intermittently.

To apply the coating liquid, a coating method such as an immersion coating method, a cast coating method, a spray coating method, a spinner coating method, a bead coating method, a wire bar coating method, a blade coating method, a roller coating method, a curtain coating method, a slit die coater method, a gravure coater method, a slit reverse coater method, a microgravure method, an ink-jet method, or a comma coater method can be used. Besides them, a bar coater method, a screen printing method, a flexographic printing method, or the like can be used.

After the coating liquid is applied on the glass substrate 11, it is dried to form the near-infrared absorbing layer 12 on the glass substrate 11. When the coating liquid contains raw material components of the transparent resin (B), a curing treatment is further performed. When the reaction is thermosetting, it is possible to simultaneously perform drying and curing, but when it is photosetting, the curing treatment is provided separately from drying.

By thus forming the near-infrared absorbing layer 12 directly on the glass substrate 11, the stack L having the near-infrared absorbing layer 12 on one main surface of the glass substrate 11 can be obtained. As a method to produce such stack L, the above-described method to form the near-infrared absorbing layer 12 directly on the glass substrate 11 is preferred from the point of workability and from the point of performance of the NIR filters 10A, 10B obtained by using this method.

Note that in an NIR filter having the dielectric layer 15 between the near-infrared absorbing glass substrate 11 and the near-infrared absorbing layer 12 as in the NIR filter 10C, a dielectric layer is formed in advance by a method which will be described later on the main surface of the glass substrate 11 on which the near-infrared absorbing layer 12 is to be formed, and then the near-infrared absorbing layer 12 may be formed by a method similar to the above on this dielectric layer.

Further, in the NIR filter structured to have the first dielectric multilayer film 13 on the main surface opposite to that of the glass substrate 11 on which the near-infrared absorbing layer 12 is formed, a glass substrate 11 on which the first dielectric multilayer film 13 is formed by a method which will be described later in advance is prepared, and the near-infrared absorbing layer 12 may be formed by a method similar to the above on the main surface of the glass substrate 11 on which the first dielectric multilayer film 13 is not formed.

Here, it is possible to produce the near-infrared absorbing layer 12 in a film shape by extrusion molding depending on the type of the transparent resin (B), and moreover, it is also possible to stack a plurality of films produced in this manner and integrating them by thermocompression, or the like. Further, it can be produced by removing a near-infrared absorbing layer 12 formed on a releasable substrate. The near-infrared absorbing layer 12 obtained as a single body in this manner may be used to produce the stack L. In this case, the near-infrared absorbing layer 12 is bonded onto the glass substrate 11 by conventional means by using, for example, an adhesive or the like, so as to produce the stack L.

(Dielectric Multilayer Film)

The NIR filters according to the present invention have a dielectric multilayer film on at least one main surface of a stack having a near-infrared absorbing glass substrate and a near-infrared absorbing layer on at least one main surface of the substrate. The dielectric multilayer film is, for example, stacked as a first dielectric multilayer film 13 only on the main surface of the glass substrate 11 side of the stack L constituted of the glass substrate 11 and the near-infrared absorbing layer 12 in the NIR filter 10A illustrated in FIG. 1.

Further, the dielectric multilayer film in the NIR filter according to the present invention may be structured to include, as in the NIR filter 10B illustrated in FIG. 2 for example, a first dielectric multilayer film 13 stacked on the main surface of the glass substrate 11 side of the stack L constituted of the glass substrate 11 and the near-infrared absorbing layer 12, and a second dielectric multilayer film 14 stacked on the main surface of the near-infrared absorbing layer 12 side of the stack L.

Moreover, although not illustrated, the dielectric multilayer film may be structured to include as a second dielectric multilayer film 14 stacked only on the main surface of the near-infrared absorbing layer 12 side of the stack L constituted of the glass substrate 11 and the near-infrared absorbing layer 12.

In this specification, when the stack L constituted of the glass substrate 11 and the near-infrared absorbing layer 12 is used as a component of the NIR filter, there is included a dielectric multilayer film stacked on the main surface of the glass substrate 11 side of the stack L, that is, the main surface opposite to the main surface of the glass substrate 11 on which the near-infrared absorbing layer 12 is formed. This dielectric multilayer film will be referred to as a first dielectric multilayer film. Further, there is included a dielectric multilayer film stacked on the main surface of the near-infrared absorbing layer 12 side of the stack L, that is, the main surface of the near-infrared absorbing layer 12 opposite to the glass substrate 11 side. This dielectric multilayer film will be referred to as a second dielectric multilayer film. Note that the relation between the first dielectric multilayer film and the second dielectric multilayer film is the same in the case of the NIR filter 10C illustrated in FIG. 3, having a dielectric layer 15 between a glass substrate 11 and a near-infrared absorbing layer 12 in the stack L.

The first dielectric multilayer film and the second dielectric multilayer film are a film having an optical function which can be obtained by alternately stacking a dielectric film with a low refractive index (low-refractive index film) and a dielectric film with a high refractive index (high-refractive index film). The film can be used as an anti-reflection film, a reflection film, a selected wavelength blocking film, or the like which is designed to exhibit a function to control transmission and blocking of light in a specific wavelength region by using interference of light. Note that the low refractive index and the high refractive index mean to have a low refractive index and a high refractive index with respect to a refractive index of an adjacent layer.

With respect to a high-refractive index material constituting the high-refractive index film and a low-refractive index material constituting the low-refractive index film, two kinds of materials with different refractive indexes are prepared, and the material with a higher refractive index may be taken as the high-refractive index material and the material with a lower refractive index may be taken as the low-refractive index material.

Specifically, due to easiness of designing and easiness of manufacturing, it is preferred to form the dielectric multilayer film by using a material with a refractive index of 1.4 or more and 1.7 or less as a low-refractive index material, and a material with a refractive index of 2.0 or more and 2.6 or less as a high-refractive index material.

Examples of the low-refractive index film include, more specifically, $SiO_2$ (1.45), $SiO_xN_y$ (more than 1.45 and 1.7 or less), $MgF_2$ (1.38), and the like. Among them, in the present invention, a low-refractive index material in the above refractive index range is preferred, and $SiO_2$ is particularly preferred in the points of reproducibility, stability, economy, and so on in film formation. Note that the number in parentheses after a chemical compound indicates a refractive index. Hereinafter, with respect to the high-refractive index material, similarly, the number in parentheses after a chemical compound indicates a refractive index.

Further, examples of the high-refractive index material include, more specifically, $Ta_2O_5$ (2.22), $TiO_2$ (2.41), $Nb_2O_5$ (2.3), $ZrO_2$ (1.99), and so on. Among them, in the present invention, a high-refractive index material in the above refractive index range is preferred. $TiO_2$ or the like is used particularly preferably from a comprehensive judgment of film formability and refractive index, or the like including reproducibility and stability thereof.

For the first dielectric multilayer film 13 and the second dielectric multilayer film 14, the specific number of layers and film thicknesses thereof, and the refractive indexes of the high-refractive index material and the low-refractive index material to be used can be designed by using a conventional method depending on desired optical properties. Moreover, the dielectric multilayer film can be produced according to this design.

The number of layers of the dielectric multilayer film is preferably 2 to 100, more preferably 2 to 80, as the total number of stacks of a low-refractive index film and a high-refractive index film, although it depends on optical properties which the dielectric multilayer film has. When the total number of stacks increases, tact during production becomes long, and warping or the like of a dielectric multilayer film occurs, and also the film thickness of the dielectric multilayer film increases. Thus, it is preferred to be the above-described upper limit or lower. Note that the number of layers is preferred to be as small as possible as long as having desired optical properties. In the order of stacking of the low-refractive index film and the high-refractive index film, the first layer may either be the low-refractive index film or the high-refractive index film as long as they are alternate, but the first layer is preferably the high-refractive index film.

The film thickness of the dielectric multilayer film is preferred to be thin from the viewpoint of thinning of the NIR filter after satisfying the preferred number of stacks. The film thickness of such a dielectric multilayer film is preferably 2 to 10 μm, though depending on the optical properties which the dielectric multilayer film has. Note that when the dielectric multilayer film is used as an anti-reflection layer, the film thickness thereof is preferably 0.1 to 1 μm. Further, like the NIR filter 10B, when the first dielectric multilayer film 13 and the second dielectric multilayer film 14 are provided on the main surface of the glass substrate 11 side of the stack L and the main surface of the near-infrared absorbing layer 12 side, respectively, it is possible that warping occurs due to stress of the dielectric multilayer film. In order to suppress this warping, the difference in film thicknesses of the dielectric multilayer films formed on the respective surfaces is preferably as small as possible after they are formed to have a desired selected wavelength blocking property.

To form the dielectric multilayer film, for example, a dry film-forming process such as IAD (Ion Assisted Deposition) vapor deposition method, CVD method, sputtering method, vacuum deposition method, and the like or a wet film-forming process such as spray method, dip method, and the like can be used.

In the NIR filter according to the present invention, at least one of the dielectric multilayer films, for example, at least one of the first dielectric multilayer film and the second dielectric multilayer film is preferably a dielectric multilayer film with a near-infrared reflective property, the film having maximum transmittance of 1% or less at an incident angle of 0 degree with respect to light with a wavelength of from 800 to 900 nm, and maximum transmittance of 3% or more at an incident angle of 31 to 60 degrees with respect to light with a wavelength of from 775 to 900 nm.

In the dielectric multilayer film, the maximum transmittance at an incident angle of 0 degree being 1% or less with respect to light with a wavelength of from 800 to 900 nm is preferred because the freedom in composition and thickness of the stack having the glass substrate and the near-infrared absorbing layer becomes high. Further, in the dielectric multilayer film, the maximum transmittance of 3% or more at an incident angle of 31 to 60 degrees with respect to light with a wavelength of from 775 to 900 nm is preferred because designing and production of the dielectric multilayer film become easy.

Further, the dielectric multilayer film preferably has average transmittance of 90% or more, more preferably 95% or more, with respect to light with a wavelength of from 430 to 660 nm incident at an incident angle of 0 to 30 degrees. Moreover, the dielectric multilayer film preferably has a near-infrared reflecting band where transmittance with respect to light with a wavelength of from 700 to 1200 nm incident at an incident angle of 0 degree is 20% or less. Further, average transmittance with respect to light with a wavelength of from 750 to 1150 nm at an incident angle of 0 degree is preferably 5% or less, more preferably 3% or less.

Further, the dielectric multilayer film defines following respective parameters based on its spectral transmittance curve. Specifically, the wavelength with which transmittance of light at an incident angle of 0 degree becomes 50% on a short wavelength side of the near-infrared reflecting band is $\lambda Sh(R0\_T50\%)$, and the wavelength with which transmittance of s polarization component becomes 50% in light at an incident angle of 30 degrees is $\lambda Sh(R30\_Ts50\%)$. Further, the above-described near-infrared absorbing layer defines following parameters based on its spectral transmittance curve. Specifically, the wavelength with which transmittance becomes 20% on a short wavelength side of the maximum absorption wavelength $\lambda_{max}$ is $\lambda Sh(D\_T20\%)$, and the wavelength with which transmittance becomes 20% on a long wavelength side of $\lambda_{max}$ is $\lambda Lo(D\_T20\%)$. At this time, a relation of formula (1) below is preferably satisfied.

$$\lambda Sh(D\_T20\%) \leq \lambda Sh(R30\_Ts50\%) < \lambda Sh(R0\_T50\%) \leq \lambda Lo(D\_T20\%) \quad (1)$$

In the dielectric multilayer film having a near-infrared reflective property, the spectral transmittance curve of a boundary wavelength region changing from transmission to blocking (reflection) from a visible range toward an infrared region shifts to a short wavelength side as the incident angle of light increases. The amount of shift differs depending on incident polarization components, and s polarized light is larger than p polarized light. Thus, the formula (1) satisfies the relation such that even when the maximum shift amount obtained by further adding polarization dependence to incident angle dependence of light is considered, it comes within the absorption region of the near-infrared absorbing layer. That is, by satisfying the relation of the formula (1), changes of the spectral transmittance curve with respect to light at an incident angle of 0 to 30 degrees can be suppressed. Note that in the dielectric multilayer film, when transmittance relative to light with an incident angle of 0 degree on the short wavelength side of the near-infrared reflecting band is X % ($0 < X \leq 50$), the maximum shift amount in the boundary wavelength region in the transmittance X % is equivalent to the difference between the wavelength $\lambda Sh$ (R0_TX %) at an incident angle of 0 degree and the wavelength $\lambda Sh$ (R30_TsX %) of s polarized light at an incident angle of 30 degrees.

Further, regarding the near-infrared absorbing layer related to the formula (1), the wavelength with which transmission on the short wavelength side of $\lambda_{max}$ becomes Y % ($0 < Y \leq 50$) is $\lambda Sh$ (D_TY %), and the wavelength with which transmission on the long wavelength side of $\lambda_{max}$ becomes Y % is $\lambda Lo$ (D_TY %). Then, depending on the specification of the NIR filter, the transmission X with respect to the dielectric multilayer film and the transmission Y with respect to the near-infrared absorbing layer are set optionally, and the relation of formula (3) is satisfied.

$$\lambda Sh(D\_TY\%) \leq \lambda Sh(R30\_TsX\%) < \lambda Sh(R0\_TX\%) \leq \lambda Lo(D\_TY\%) \quad (3)$$

In an NIR filter having the dielectric multilayer film and the near-infrared absorbing layer in which the predetermined transmission X with respect to the dielectric multilayer film and the predetermined transmission Y with respect to the near-infrared absorbing layer satisfy the formula (3), even when changes of the spectral transmittance curve of the dielectric multilayer film with respect to light at an incident angle of 0 to 30 degrees occur, the wavelength of transmission X % comes within the absorption wavelength band which is equal to or less than the transmission Y % of the near-infrared absorbing layer. Accordingly, in the NIR filter, transmission in the wavelength region from $\lambda Sh$ (R30_TsX %) to $\lambda Sh$ (R0_TX %) is (X×Y)/100% or less, in which the transmittance change at an incident angle in the spectral transmittance curve has to be particularly suppressed. Here, setting X, Y to predetermined values allows achieving low transmittance in this wavelength region, and thus the incident angle dependence of transmittance occurring by the dielectric multilayer film can be reduced.

Note that the formula (1) is equivalent to the formula expressing the relation of light blocking property between the dielectric multilayer film and the near-infrared absorbing layer in the NIR filter when the transmission X with respect to the dielectric multilayer film is 50% and the transmission Y with respect to the near-infrared absorbing layer is 20% in the formula (3). That is, in the formula (1), transmission in the wavelength region of $\lambda Sh$(R30_Ts50%) to $\lambda Sh$ (R0_T50%) is (X×Y)/100=10% or less, and thus the transmission which changes along with the incident angle comes within a low value.

Further, in the case of an NIR filter in which the transmission X is set to 10% and the transmission Y is set to 10% in the formula (3), transmittance in the wavelength region becomes 1% or less, and the incident angle dependence is further reduced, which is preferred. Thus, the NIR filter in which the properties of the respective spectral transmittance curves which the dielectric multilayer film and the near-infrared absorbing layer have are combined so that the value of X×Y/100 in the formula (3) is low can control changes of the spectral transmittance curves which are dependent on the incident angle in a wavelength of 700 nm. Note that the "changes of the spectral transmittance curves which are dependent on the incident angle" mentioned here means changes of transmittance in light with the same wavelength and changes of wavelength in the same transmittance. Since the NIR filter according to the present invention has the near-infrared absorbing glass substrate, in consideration of absorption of the near-infrared absorbing glass substrate in the wavelength region, changes of the spectral transmittance curves which are dependent on the incident angle can be suppressed further.

Further, when the concentration of contained dye (A) is low for example, the absorption wavelength bandwidth {λLo (D_T20%)–λSh (D_T20%)} is narrow, and it is possible that the near-infrared absorbing layer does not satisfy the formula (1). At this time, the content of the dye (A) by which the transmittance T($\lambda_{max}$) of the near-infrared absorbing layer decreases may be increased to widen the absorption wavelength bandwidth, or the wavelength shift amount {λSh(R0_T50%)–λSh(R30_Ts50%)} of the dielectric multilayer film may be decreased, so as to satisfy the formula (1).

The structure of the dielectric multilayer film which decreases the wavelength shift amount which is dependent on the incident angle in the short wavelength region of the near-infrared reflection band is described in, for example, International Publication No. 2013/015303 or JP-A 2007-183525. The former discloses an example in which a difference in wavelength is 16 nm, the difference causing 50% transmittance at incident angles of 0 degree and 30 degrees in a cut-off band in the vicinity of 650 nm in the dielectric multilayer film having 15 or more stacks of pairs of a high-refractive index layer and a low-refractive index layer in which the optical film thickness ratio of each layer is different by 3 or more. The latter discloses an example in which the difference in wavelength which causes 50% transmittance at incident angles of 0 degree and 25 degrees is 15 nm by a dielectric multilayer film, which includes high-refractive index layers and middle-refractive index layers, and 27 layers are stacked alternately so that the optical film thickness of respective layers become approximately $\lambda_0/4$ of the reference wavelength $\lambda_0$.

Note that the transmittance of the dielectric multilayer film in this specification refers to a value excluding absorption and reflection in a stack having the glass substrate and the near-infrared absorbing layer. Transmittance with respect to light with a wavelength of from 775 to 900 nm of the dielectric multilayer film can be measured, specifically, by forming a dielectric multilayer film as a target of transmittance measurement on a substrate transmitting 100% of light with a wavelength of from 775 to 900 nm, for example, a borosilicate glass D263Teco glass substrate made by Schott, and by using a spectrophotometer, for example, spectrophotometer U4100 made by Hitachi High-Tech Science Corporation.

In the NIR filter having the first dielectric multilayer film 13, such as the NIR filters 10A, 10B, 10C, a dielectric multilayer film with a near-infrared reflective property is preferred in which at least the first dielectric multilayer film 13 has the above-described optical properties. When the NIR filter has the first dielectric multilayer film 13 and the second dielectric multilayer film 14 as the NIR filters 10B, 10C have, both of them may be the dielectric multilayer film with a near-infrared reflective property, or preferably only the first dielectric multilayer film 13 is the dielectric multilayer film with a near-infrared reflective property.

In the case of the NIR filters 10B, 10C, the second dielectric multilayer film 14 may be designed as a dielectric multilayer film with a low reflective property with respect to visible light as a film (anti-reflection film) having an anti-reflection function. When the second dielectric multilayer film 14 is the anti-reflection film, the dielectric multilayer film (anti-reflection film) has a function to improve transmittance by preventing reflection of visible light incident on the NIR filters 10B, 10C so as to efficiently use incident light, and can be designed by conventional means by using the above-described materials and formed by the above method according to the design.

In the NIR filter according to the present invention, in the NIR filter 10A which does not have the second dielectric multilayer film 14 and in the NIR filters 10B, 10C which have the second dielectric multilayer film 14, on the surface of the side having the near-infrared absorbing layer 12 of the glass substrate 11, reflectance at an incident angle of 5 degree with respect to light with a wavelength of from 430 to 600 nm is preferably 2% or less, which is measured excluding reflection on the interface opposite to the side of the glass substrate 11 having the near-infrared absorbing layer 12 and the surface.

The surface of the side of the glass substrate having the near-infrared absorbing layer in the NIR filter is, in the NIR filter 10A, the surface exposed to the atmosphere opposite to the glass substrate 11 side of the near-infrared absorbing layer 12, or in the NIR filters 10B, 10C, the surface exposed to the atmosphere opposite to the near-infrared absorbing layer 12 side of the second dielectric multilayer film 14. Here, in order to measure the reflectance on the above surface excluding reflection on the interface opposite to the side of the glass substrate 11 having the near-infrared absorbing layer 12 and the surface, for example, a measurement sample in which a black resin layer is formed instead of the first dielectric multilayer film 13 may be produced on the main surface opposite to the side of the glass substrate 11 having the near-infrared absorbing layer 12, and the reflectance may be measured on this surface. The reflectance is preferably 2% or less, more preferably 1.2% or less.

Note that in the second dielectric multilayer film 14 formed on the near-infrared absorbing layer 12, the dielectric film in the second dielectric multilayer film 14 in contact with the near-infrared absorbing layer 12 is preferably a dielectric material with a refractive index of 1.4 or more and 1.7 or less. A specific example of the dielectric material with a refractive index of 1.4 or more and 1.7 or less is as described above. When the refractive index of the dielectric film in the second dielectric multilayer film 14 in contact with the near-infrared absorbing layer 12 is in such range, occurrence of ripples which affect color reproducibility of an image taken with the solid-state imaging device can be easily suppressed.

(Dielectric Layer)

The dielectric layer 15 which the NIR filter 10C illustrated in FIG. 3 has is an optional layer in the NIR filter according to the present invention, and is formed between the glass substrate 11 and the near-infrared absorbing layer 12 mainly for the purpose of improving durability. Note that the dielectric layer is applicable irrespective of the structure of the NIR filter according to the present invention. For example, in the NIR filter structured similarly to the NIR filter 10A, the dielectric layer may be formed between the glass substrate 11 and the near-infrared absorbing layer 12.

The dielectric layer 15 is a layer constituted of a dielectric material, and preferably has a thickness of 5 nm or more. The dielectric layer 15 with the above-described structure can improve the durability of the near-infrared absorbing layer 12 in the NIR filter. The thickness of the dielectric layer 15 is preferably 30 nm or more, more preferably 100 nm or more, particularly preferably 150 nm or more. Although there is no particular upper limit for the thickness of the dielectric layer 15, in view of easiness of designing and production, the thickness of the dielectric layer 15 is preferably 1000 nm or less, more preferably 500 nm or less.

As described above, in the NIR filter having the dielectric multilayer films on both sides sandwiching the stack L as the NIR filter 10B has, warping may occur due to a difference particularly in thickness of both the dielectric multilayer films. It is possible to adjust the film thickness while maintaining the function of both the dielectric multilayer films. When the dielectric layer 15 is provided as in the NIR filter 10C, this gives an advantage that the balance of stress can be achieved easily by adjusting the thickness of the dielectric layer 15 in addition to the first dielectric multilayer film 13 and the second dielectric multilayer film 14, and occurrence of warping can be easily suppressed. Note that in the dielectric layer 15, the layer structure other than the kind and thickness of the dielectric material is not particularly limited.

When the glass substrate 11 contains, for example, alkaline atoms such as Na atoms and K atoms and these alkaline atoms diffuse through the near-infrared absorbing layer 12 and thereby adversely affect the optical property and weather resistance of the near-infrared absorbing layer 12, the dielectric layer 15 functions as an alkali barrier film, so as to increase the durability of the NIR filter. Further, reliability of the solid-state imaging device or the like having this NIR filter can be enhanced.

In the above-described case, the dielectric layer 15 is constituted of a single layer or a plurality of layers containing a dielectric material which functions as an alkaline barrier film. Examples of such a dielectric material preferably include $SiO_2$, $SiO_x$ (where $0.8 \leq x < 2$), $Al_2O_3$, and so on.

The dielectric layer 15 is preferably of when constituted of a single layer, a dielectric material having a refractive index of 1.4 or more and 1.7 or less in view of optical properties. The dielectric layer 15 is preferred when constituted of a single layer formed of a dielectric material with a refractive index in this range because reflection of light in the interface existing between the glass substrate 11 and the near-infrared absorbing layer 12 does not increase.

Examples of the material of the dielectric layers having the refractive index of 1.4 or more and 1.7 or less preferably include $SiO_2$ and $SiO_xN_y$ (where $0.5 \leq x \, 2$, $0 < y \leq 1$), $MgF_2$, $Al_2O_3$, and so on. Alternatively, it is likewise preferred to form a dielectric multilayer film with an optical structure such that the dielectric layer 15 makes reflection of the interface between the glass substrate 11 and the near-infrared absorbing layer 12 low. Note that the dielectric layer 15 may be constituted of an alkali barrier film (single film) constituted to include at least one material selected from, for example, $SiO_2$, $SiO_x$ (where $0.8 \leq x \, 2$) and $Al_2O_3$, or may be constituted of a plurality of layers including a layer formed of a material different from the alkali barrier film.

When the dielectric layer 15 is constituted of an alkali barrier single film containing $SiO_2$ and $Al_2O_3$, the mass ratio of $SiO_2$ and $Al_2O_3$ is in the range of 80:20 to 99:1, preferably in the range of 85:15 to 97.5:2.5, more preferably in the range of 90:10 to 97.5:2.5. When it is in the range of 80:20 to 99:1, adhesiveness to the near-infrared absorbing layer 12 becomes high and hence it is preferred. In detail, the single body of $Al_2O_3$ has low adhesiveness to the near-infrared absorbing layer 12 compared to $SiO_2$ and $SiO_x$ (where $0.8 \leq x < 2$). However, the alkali barrier film obtained by adding $Al_2O_3$ to $SiO_2$ by the above ratio, in which the surface of $SiO_2$ is improved by $Al_2O_3$, can enhance the adhesiveness to the near-infrared absorbing layer 12.

The NIR filter may further have an adhesive film between the glass substrate 11 and the near-infrared absorbing layer 12 for the purpose of improving adhesiveness of the both. That is, the adhesive film may be contained in the dielectric layer 15. When the dielectric layer 15 has the adhesive film, the adhesive film is preferably provided on the most glass substrate 11 side. Disposing the adhesive film provides, particularly when the glass constituting the glass substrate 11 contains fluorine, a large effect in improvement of adhesiveness thereof. The material constituting the adhesive film is selected appropriately from dielectric materials having adhesiveness to the glass substrate 11 mainly depending on the constituent materials of the glass substrate 11. For example, when the glass substrate 11 is a glass substrate containing fluorine, the adhesive film is preferably constituted of a dielectric material selected from at least one material selected from $MgF_2$, $CaF_2$, $LaF_3$, $NdF_3$, $CeF_3$, $Na_5Al_3F_{14}$, $Na_3AlF_6$, $AlF_3$, $BaF_2$, $YF_3$ and $Al_2O_3$. Thus, the dielectric layer 15 provided between the glass substrate 11 and the near-infrared absorbing layer 12 may be a single layer of the above-described alkali barrier film or a single layer of the adhesive film, or may have both the alkali barrier film and the adhesive film.

The film thickness of the adhesive film may be 5 to 100 nm, preferably 10 to 50 nm, more preferably 15 to 30 nm. Moreover, for example, when the glass substrate 11 is a glass substrate containing fluorine and the dielectric layer 15 includes both the adhesive film and the alkali barrier film, disposing the adhesive film containing fluorine, the alkali barrier film, and the near-infrared absorbing layer 12 in this order from the glass substrate 11 side containing fluorine increases the adhesive effect and the alkali barrier effect and hence is preferred. Thus, when the glass substrate 11 is a glass substrate containing fluorine and the dielectric layer 15 is structured to include the adhesive film and the alkali barrier film in this order from the glass substrate 11 side, the adhesive film is preferably structured to include at least one material selected from $MgF_2$, $CeF_3$ and $Al_2O_3$, and the alkali barrier film is preferably structured to include at least one material selected from $SiO_2$ and $SiO_x$ (where $0.8 \leq x < 2$) and $Al_2O_3$. Among them, a combination in which the adhesive film is constituted of $MgF_2$ and the alkali barrier film is constituted of $SiO_2$, or a combination in which the adhesive film is constituted of $Al_2O_3$ and the alkali barrier film is constituted of $SiO_2$ or $SiO_x$ is preferred from the point that the reflectance can be made low in the interface between the glass substrate 11 and the near-infrared absorbing layer 12.

Among them, the combination in which the adhesive film is constituted of $Al_2O_3$ and the alkali barrier film is constituted of $SiO_2$ or $SiO_x$ can make the reflectance between the glass substrate 11 and the near-infrared absorbing layer 12 low. Further, this combination is more preferred for the reasons that $Al_2O_3$ has high chemical affinity with both the materials of the glass substrate 11 and $SiO_2$ or $SiO_x$, such as forming aluminum phosphate with $P_2O_5$ as a main component of a CuO-containing fluorophosphate glass or a CuO-containing phosphate glass, which can be mentioned as a typical example of the glass substrate 11, or forming aluminosilicate with $SiO_2$ or $SiO_x$, and furthermore that $SiO_2$ or $SiO_x$ can be easily increased in chemical affinity with resin by mixing the silane coupling agent in the resin, increasing particularly adhesiveness with the both. Note that when the adhesive film is constituted of $Al_2O_3$ and the alkali barrier film is constituted of $SiO_2$ or $SiO_x$, the film thickness of the $Al_2O_3$ film may be 20 to 150 nm, preferably 20 to 100 nm, more preferably 30 to 50 nm, and the film thickness of the $SiO_2$ film or the $SiO_x$ film may be 100 to 350 nm, preferably 100 to 250 nm, more preferably 150 to 200 nm.

As the method to form the dielectric layer 15 on the glass substrate 11, a method similar to the formation method for the dielectric multilayer film can be applied. Specifically, a dry film-forming process such as IAD vapor deposition method, CVD method, sputtering method, vacuum deposition method, or the like or a wet film-forming process such as spray method, dip method, or the like may be used to form the dielectric layer 15. Note that the IAD vapor deposition method or the sputtering method can make the alkali barrier property of the dielectric layer 15 formed by it be favorable, and thus is a method preferred in formation of the dielectric layer 15.

By appropriately combining the respective components explained above, the NIR filters 10A to 10C can achieve the optical property of the present invention, the maximum transmittance of 50% or less at an incident angle of 31 to 60 degrees with respect to light with a wavelength of from 775 to 900 nm. Note that the maximum transmittance at an incident angle of 31 to 60 degrees is preferably 30% or less, more preferably 10% or less, furthermore preferably 5% or less, furthermore preferably 3% or less, furthermore preferably 1% or less, furthermore preferably 0.5% or less, furthermore preferably 0.3% or less, particularly preferably 0.2% or less with respect to light with a wavelength of from 775 to 900 nm. When the NIR filter according to the present invention having the optical property of the present invention is used for the solid-state imaging device, occurrence of a phenomenon that an object which did not exist on the original subject appears in a taken image can be reduced or prevented.

Regarding the respective components explained above of the NIR filters 10A to 10C, the respective spectral transmittance properties and the like are preferably adjusted so that the NIR filters 10A to 10C have the wavelength $\lambda_0$(NIR) with which transmittance at an incident angle of 0 degree becomes 50% and the wavelength $\lambda_{30}$(NIR) with which transmittance at an incident angle of 30 degree becomes 50% in a region where the wavelength is longer than the wavelength of 600 nm, and the absolute value of a difference between the wavelengths $|\lambda_0(NIR)-\lambda_{30}(NIR)|$ is preferably 5 nm or less. Note that the absolute value of a difference between the wavelengths $|\lambda_0(NIR)-\lambda_{30}(NIR)|$ is more preferably 3 nm or less.

When $|\lambda_0(NIR)-\lambda_{30}(NIR)|$ is in the above range, in the solid-state imaging device, the difference in changes in a region in the vicinity of the boundary of the visible range and the near-infrared region due to that light coming through the center and the outside of the lens is transmitted through the NIR filter is small, and a difference in color development within the plane of an image can be minimized. Thus, for example, the influence of angle dependence that a blocking wavelength shifts due to the angle of incidence of light which the dielectric multilayer film with the near-infrared reflective property has, can be mostly eliminated.

Further, regarding the respective components explained above of the NIR filters 10A to 10C, the respective spectral transmittance curves and the like are preferably adjusted so that the average of absolute value of the difference between transmittance of light at an incident angle of 0 degree and transmittance of light at an incident angle of 30 degrees becomes 3% or less in a wavelength of from 600 to 750 nm as an optical property as the NIR filter, and more preferably the average of the absolute value is 2% or less. When the average of the absolute value of the difference in transmittance is in the above range, a difference in color development within the plane of an image can be similarly minimized.

When the absorber (U) is contained in the near-infrared absorbing layer 12 in the NIR filters 10A to 10C, with respect to the above-described respective components, the respective spectral transmittance curves or the like are preferably adjusted so as to have, in a region where the wavelength is shorter than the wavelength of 450 nm, the wavelength $\lambda_0$(UV) with which transmittance at an incident angle of 0 degree becomes 50% and the wavelength $\lambda_{30}$(UV) with which transmittance at an incident angle of 30 degrees becomes 50% as optical properties as the NIR filter, and so that the absolute value of the difference between the wavelengths $|\lambda_0(UV)-\lambda_{30}(UV)|$ is 5 nm or less. Note that the absolute value of the difference between the wavelengths $|\lambda_0(UV)-\lambda_{30}(UV)|$ is preferably 3 nm or less.

When $|\lambda_0(UV)-\lambda_{30}(UV)|$ is in the above range, in the solid-state imaging device, the difference in changes in a region in the vicinity of the boundary of the visible range and the ultraviolet region due to that light coming through the center and the outside of the lens is transmitted through the NIR filter is small, and a difference in color development within the plane of an image can be minimized. Thus, for example, the incident angle dependence of light at a wavelength of 500 nm or less can be made small.

Further, when the absorber (U) is contained in the near-infrared absorbing layer 12 in the NIR filters 10A to 10C, with respect to the above-described respective components, the respective spectral transmittance curves or the like are preferably adjusted so that, the average of absolute value of the difference between transmittance of light at an incident angle of 0 degree and transmittance of light at an incident angle of 30 degrees becomes 8% or less in a wavelength of from 380 to 430 nm as an optical property as the NIR filter, and more preferably the average of the absolute value is 5% or less, furthermore preferably 3% or less. When the average of the absolute value of the difference in transmittance is in the above range, a difference in color development within the plane of an image can be similarly minimized.

The NIR filter according to the present invention may have any components other than the above-described ones, as long as having the optical property of the present invention. Examples of the other components include an anti-reflecting film, a reflective film reflecting light in a predetermined wavelength region, a selected wavelength blocking film controlling transmission and blocking of light in a predetermined wavelength region, a radiation blocking film blocking radiations such as α rays, and the like.

The NIR filter according to the present invention may be, for example, in the form of being adhered on a low-pass filter having an ultraviolet absorbing capability as a selected wavelength shielding film. Further, a black frame-shaped blocking member may be disposed in an end portion of a main surface of the NIR filter. The position where the blocking member will be disposed in the NIR filter may be one or both of the main surfaces, or may be a side surface.

When the NIR filter is adhered to the low-pass filter and used, for example, when the surface of the near-infrared absorbing layer 12 side is adhered onto the low-pass filter with an adhesive in the NIR filter 10A, a dielectric layer with a thickness of about 50 to 500 nm is provided on the near-infrared absorbing layer 12, and the low-pass filter may be adhered thereon.

Thus, fusing of the transparent resin (B) contained in the near-infrared absorbing layer 12 by the aforementioned adhesive can be prevented. The material of the dielectric layer may be selected appropriately from materials which does not impair a spectral property after adhering, such as $SiO_2$, $SiO_xN_y$, $MgF_2$, $ZrO_2$, $Ta_2O_5$, $TiO_2$, and the like.

Moreover, the NIR filter according to the present invention may be provided with a structure to reduce surface reflection, such as a moth-eye structure, so as to enhance light with use efficiency. The moth-eye structure is a structure in which a regular projection array is formed at cycles smaller than, for example, 400 nm, and its effective refractive index changes sequentially in a thickness direction. Thus, it is a structure in which surface reflectance of light with a wavelength longer than the cycle is suppressed, and can be formed on the surface of the NIR filter by molding or the like, for example, on the second dielectric multilayer film 14 when it is the NIR filter 10B illustrated in FIG. 2.

Further, the NIR filter according to the present invention may have, as a selected wavelength blocking film as necessary, for example, a light absorbing layer absorbing light with a particular wavelength, in which at least one kind selected from a near-infrared and/or infrared absorbent, a color tone correcting dye, and an ultraviolet absorbent is dispersed in a transparent resin by a conventionally known method. Examples of the transparent resin include a thermoplastic resin such as polyester resin, acrylic resin, polyolefin resin, polycarbonate resin, polyamide resin, alkyd resin, or the like, a resin curable by heat or light such as ene-thiol resin, epoxy resin, thermosetting acrylic resin, light-curing acrylic resin, silsesquioxane resin, or the like. The content of each absorbent in these light absorbing layers is adjusted appropriately within the range not impairing the effect of the present invention according to light absorbing capability of each absorbent.

As such a light absorbing layer, for example, an infrared absorbing layer in which ITO particles are dispersed in the transparent resin can be used. The content of the ITO particles can be the same as in the case of the near-infrared absorbing layer. Thus, it does not exhibit absorption of visible light and can maintain transparency.

When a dye is added for the purpose of absorbing near-infrared rays and/or infrared rays in a wide wavelength range as a light absorbing layer, typically this often accompanies absorption of visible light. For example, when the near-infrared absorbing glass substrate constituted of a CuO-containing fluorophosphate glass or a CuO-containing phosphate glass is used, this can absorb near-infrared light while suppressing absorption of visible light low and hence is preferred. Further, when a plurality of kinds of dyes are mixed in the same absorbing layer, deterioration due to heat or the like can occur more significantly. Also from this point, for example, the near-infrared absorbing glass substrate constituted of a CuO-containing fluorophosphate glass or a CuO-containing phosphate glass is preferably used.

The NIR filter according to the present invention can be used as an NIR filter of an imaging device, such as a digital still camera, a digital video camera, a surveillance camera, an on-vehicle camera, or a web camera, and an automatic exposure meter or the like, an NIR filter for PDP, and the like. The NIR filter according to the present invention is used preferably for a solid-state imaging device in the imaging device, and the NIR filter is disposed, for example, between an imaging lens and the solid-state image sensing device.

[Solid-State Imaging Device]

An example of a solid-state imaging device according to the present invention in which the NIR filter according to the present invention is disposed and used between an imaging lens and the solid-state image sensing device will be explained below with reference to FIG. 4.

Figure 4:
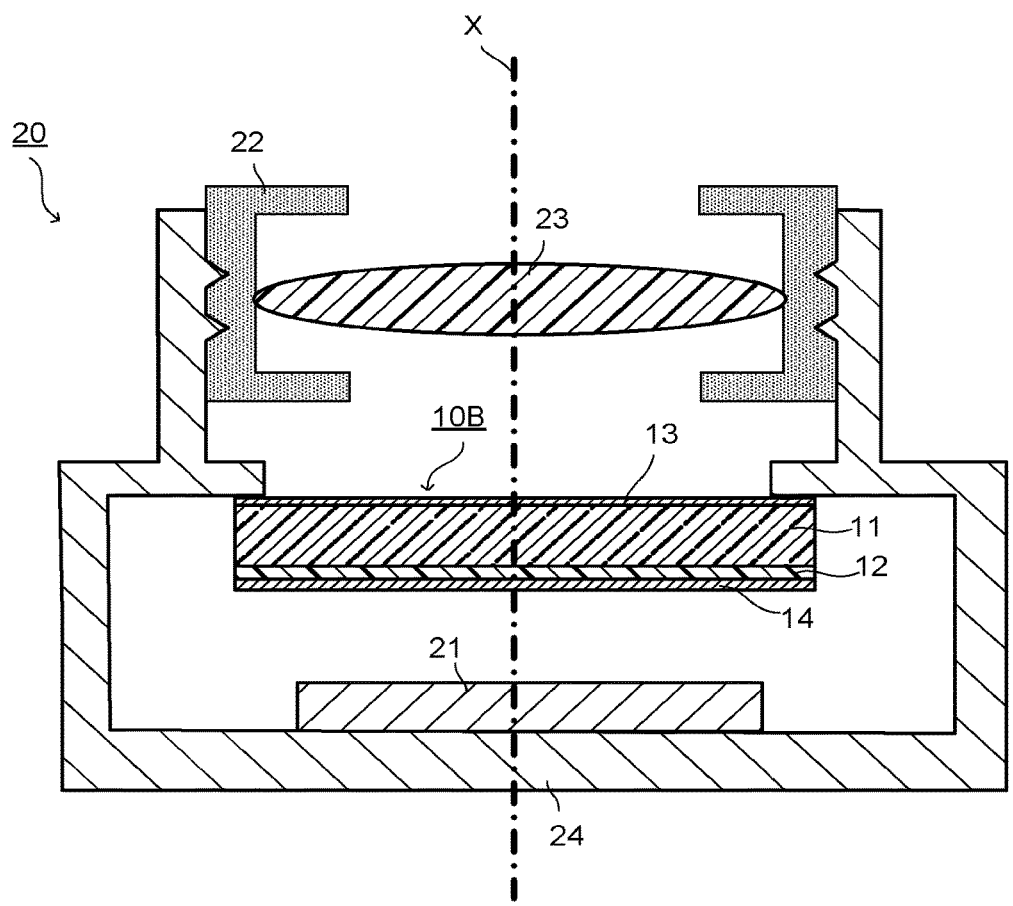
FIG. 4 is a cross-sectional view illustrating an example of an embodiment of a solid-state imaging device according to the present invention.

FIG. 4 is a cross-sectional view schematically illustrating a substantial part of an example of a solid-state imaging device using the NIR filter JOB. This solid-state imaging device 20 has, as illustrated in FIG. 4, a solid-state image sensing device 21 and on a front thereof the NIR filter 10B and an imaging lens 23 in this order, and further has a casing 24 fixing them. The imaging lens 23 is fixed by a lens unit 22 further provided inside the casing 24. The NIR filter 10B is disposed so that the second dielectric multilayer film 14 is located on the solid-state image sensing device 21 side and the first dielectric multilayer film 13 is located on the imaging lens 23 side. The solid-state image sensing device 21 and the imaging lens 23 are disposed along an optical axis X. The direction when the NIR filter is disposed in a device can thus be selected appropriately depending on the design.

Note that the NIR filter according to the present invention is not limited to an integrated structure. For example, in a solid-state imaging device having the NIR filter and an optical member including the solid-state image sensing device, in which the NIR filter and the solid-state image sensing device are disposed in order from the subject side or the side through which light of a light source enters, the NIR filter can be structured as follows. Specifically, in the solid-state imaging device, the NIR filter may be structured so that the near-infrared absorbing glass substrate and the dielectric multilayer film are provided in contact with each other, and the near-infrared absorbing layer is provided solely in the same optical path as the near-infrared absorbing glass substrate, or is provided to be contained in an optical member disposed in the same optical path as the near-infrared absorbing glass substrate.

Figure 8:
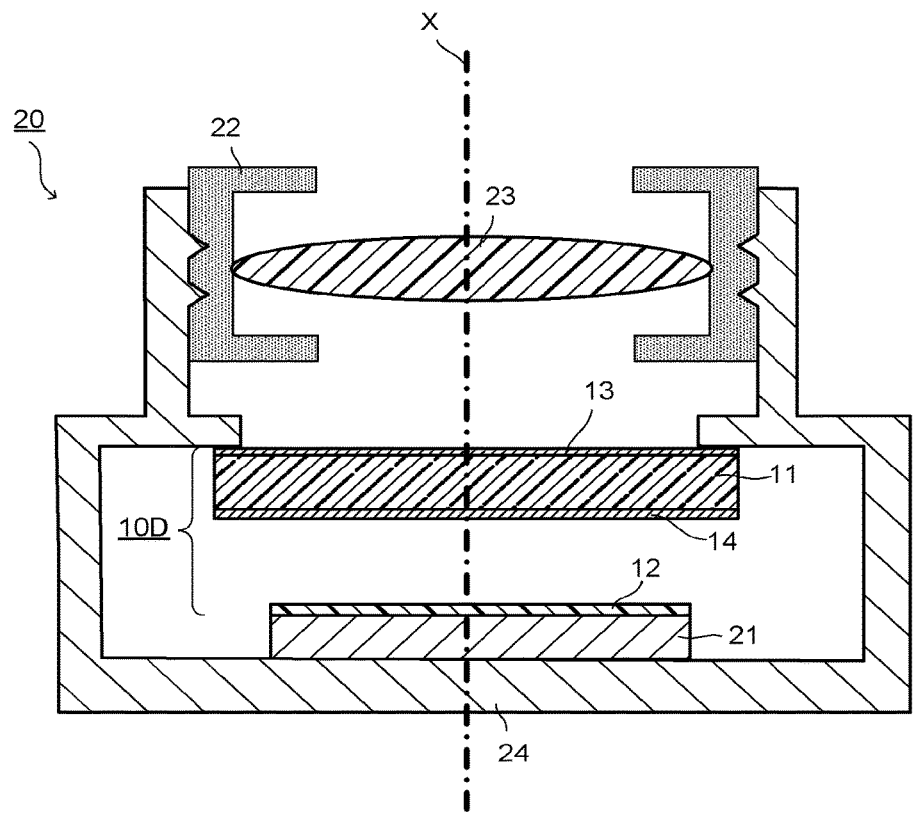
FIG. 8 is a schematic diagram illustrating an example of the near-infrared cut filter according to an embodiment of the present invention and an example of an embodiment of a solid-state imaging device according to the present invention using the same.

FIG. 8 illustrates another example of a cross-section of an NIR filter 10D and a solid-state imaging device using the same. In this NIR filter 10D, the near-infrared absorbing layer 12 is disposed in an optical member on a light receiving surface side of the solid-state image sensing device, which is a part separated from the near-infrared absorbing glass substrate 11. Examples of this optical member include, for example, an RGB color filter formed in every pixel, a micro-lens for condensing light, and the like. The near-infrared absorbing layer 12 may be disposed in an interface between a light receiving surface of the solid-state image sensing device and an RGB color filter, an interface between the RGB color filter and the micro-lens, or an interface between the micro-lens and air. Further, the near-infrared absorbing layer may be handled as an RGB color filter or a micro-lens containing dye (A) in the resin.

Figure 9:
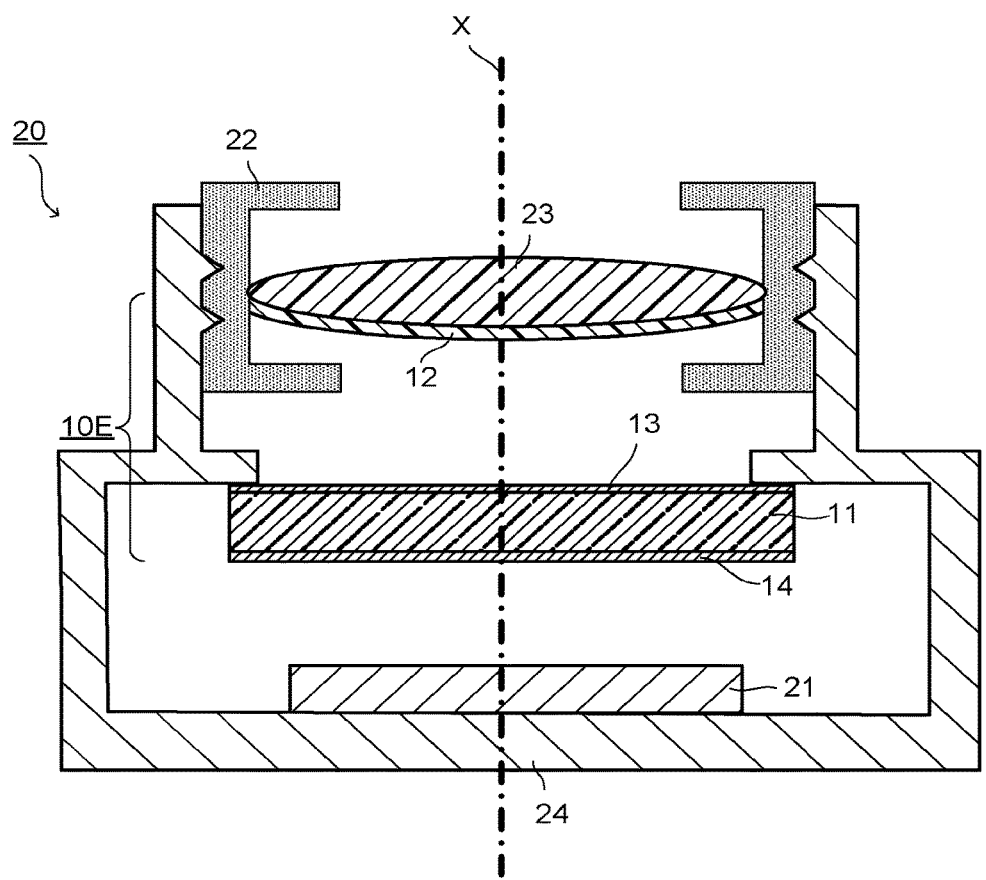
FIG. 9 is a schematic diagram illustrating an example of the near-infrared cut filter according to an embodiment of the present invention and an example of an embodiment of the solid-state imaging device according to the present invention using the same.

FIG. 9 illustrates another example of a cross-section of an NIR filter 10E and a solid-state imaging device using the same. In this NIR filter 10E, the near-infrared absorbing layer 12 is disposed in an air interface of an imaging lens 23. The imaging lens 23 is constituted of a plurality of lenses, and there is a plurality of air interfaces. Thus, the near-infrared absorbing layer 12 may be disposed on a surface where there is small influence of resolutions of the imaging lens 23, and the like. Further, the near-infrared absorbing layer may be handled as an imaging lens in which the imaging lens 23 contains a resin and the dye (A) is contained in the resin. Thus, the near-infrared absorbing layer in the NIR filter may be structured to function as an optical member.

Figure 10:
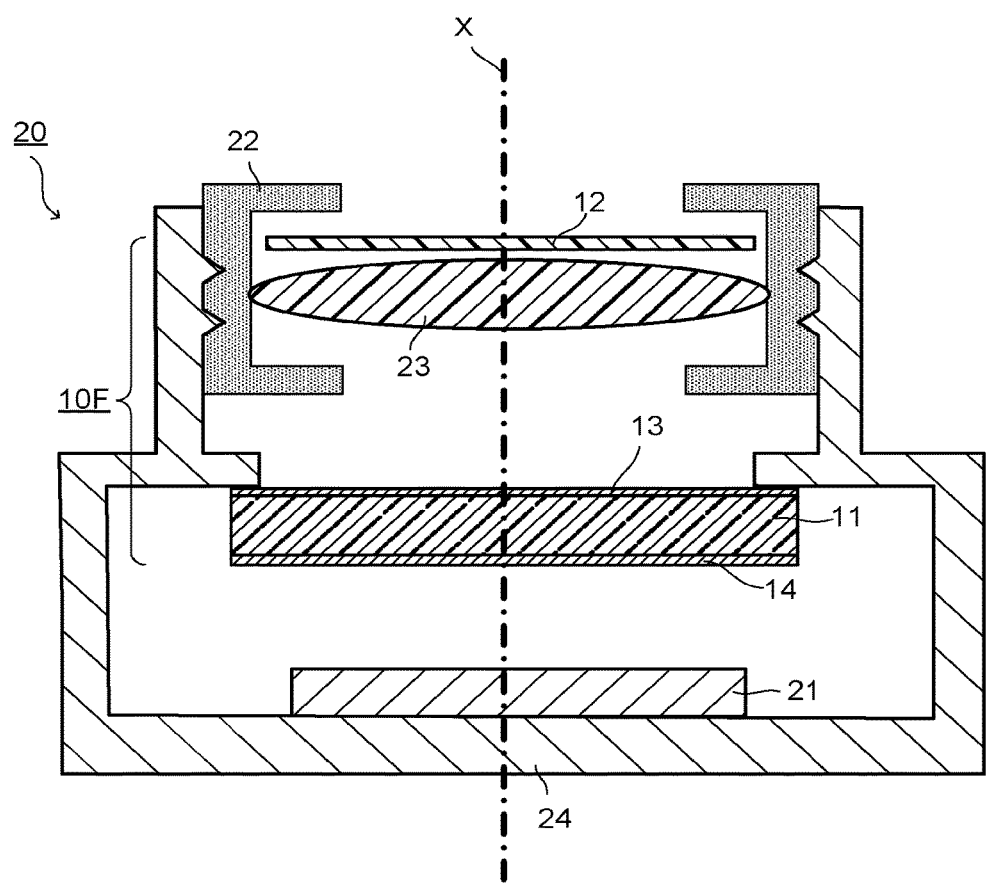
FIG. 10 is a schematic diagram illustrating an example of the near-infrared cut filter according to an embodiment of the present invention and an example of an embodiment of the solid-state imaging device according to the present invention using the same.

FIG. 10 illustrates another example of a cross-sectional view of an NIR filter 10F and a solid-state imaging device using the same. In this NIR filter 10F, the near-infrared absorbing layer 12 is disposed in an incident surface on the subject side of a lens unit 22. Note that for the lens unit of the imaging device, there are many design examples in which an incident surface on the subject side is in an aperture diaphragm position. Accordingly, in the surrounding region of an aperture portion on the near-infrared absorbing layer 12, a light blocking film containing a black absorbing agent absorbing visible light and near-infrared light may be provided. This enables to block unwanted high-angle incident light which leads to decrease in resolution of the imaging lens.

The solid-state imaging device according to the present invention is a solid-state imaging device with high sensitivity which uses, in a near-infrared cut filter with an excellent near-infrared blocking property in which the near-infrared absorbing glass, the near-infrared absorbing layer containing the near-infrared absorbing dye, and the dielectric multilayer film are effectively used, the NIR filter according to the present invention structured such that maximum transmittance at a relatively large incident angle of 31 to 60 degrees is 50% or less with respect to light of a specific wavelength region (775 to 900 nm) of a near-infrared region, thereby reducing or preventing occurrence of a phenomenon that an object which did not exist on an original subject appears in a taken image.

EXAMPLES

The present invention will be explained in further detail by using examples.

Example 1

An NIR filter A having a cross-section similar to FIG. 3 was produced. Note that measurement of all optical properties of components and the NIR filter A illustrated below was performed by using the spectrophotometer U4100 made by Hitachi High-Tech Science Corporation.

(Formation of a Dielectric Multilayer Film with a Near-Infrared Reflective Property as the First Dielectric Multilayer Film)

A fluorophosphate glass substrate NF-50TX (hereinafter referred to as a "glass substrate A") made by Asahi Glass Co., Ltd. of 76 mm×76 mm×0.214 mmt was cleaned for 10 minutes in an ultrasonic washing machine by using a hydrofluoroether-based solvent ASAHIKLIN (registered trademark) AE-3000 (product name) made by Asahi Glass Co., Ltd. Regarding the cleaned glass substrate A, absorptance at an angle of 0 degree of light with a wavelength of from 775 to 900 nm was measured, and it was 87.3% to 89.5%. Further, the maximum absorption wavelength $\lambda_{Gmax}$ was substantially 840 nm, and transmittance T ($\lambda_{Gmax}$) was substantially 9%.

On one main surface of the glass substrate A obtained and cleaned above, a dielectric multilayer film with a near-infrared reflective property (hereinafter referred to as a "dielectric multilayer film R") was formed as a first dielectric multilayer film with 40 layers in total (total layer thickness: 5950 nm), in which high-refractive index films and low-refractive index films were alternately formed beginning with a high-refractive index film by using an IAD vacuum deposition device. Note that TiO$_2$ was used as a high-refractive index material, and SiO$_2$ was used as a low-refractive index material.

Further, at the same time, as a specimen for transmission measurement of the above dielectric multilayer film R, a dielectric multilayer film R similar to the above was formed on a borosilicate glass D263Teco glass substrate made by Schott having a difference in refractive index of 0.01 or less from the NF-50TX with respect to light with a wavelength of from 775 to 900 nm.

Figure 5:
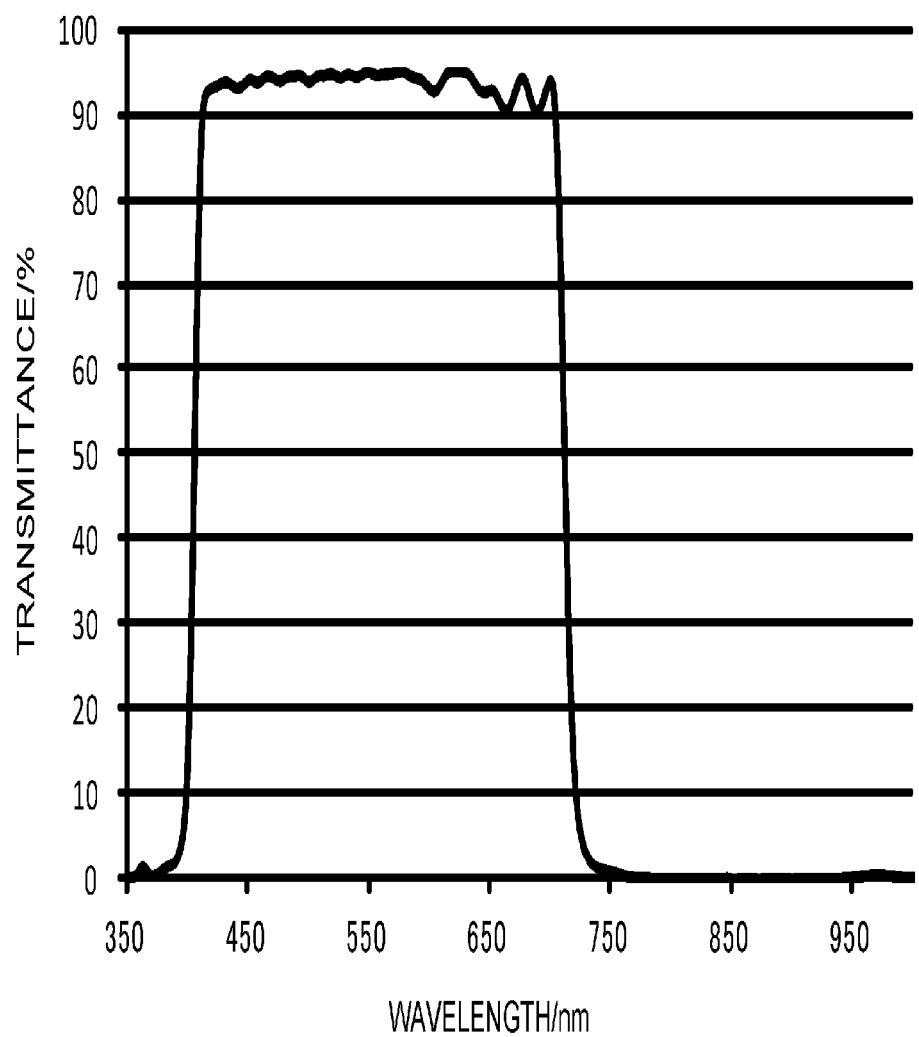
FIG. 5 is a view illustrating a transmission spectrum of a dielectric multilayer film with a near-infrared reflective property used for a near-infrared cut filter of an example.

In the specimen for transmittance measurement obtained above, transmittance of light at an incident angle of 0 degree in a wavelength of from 350 to 1000 nm was measured. FIG. 5 illustrates an obtained transmission spectrum (350 to 1000 nm). In the obtained measurement results, maximum transmittance with respect to light with a wavelength of from 800 to 900 nm was 0.10%. Further, in the specimen for transmittance measurement obtained above, transmittance of light at an incident angle of 31 to 60 degrees in a wavelength of from 775 to 900 nm was measured, and the maximum transmittance was 6.2%.

Further, this specimen exhibited average transmittance with a wavelength of from 430 to 660 nm of 95%, transmittance of a wavelength of from approximately 709 to 1000 nm or more of 50% or less, transmittance of a wavelength of from 714 to 1000 nm or more of 20% or less, and transmittance of a wavelength of from 718 to 1000 nm or more of 10% or less, with respect to light at an incident angle of 0 degree.

Moreover, in the specimen, on the short wavelength side of the near-infrared reflecting band, wavelengths with which transmittance becomes 50%, 20% and 10% with respect to light at an incident angle of 0 degree were $\lambda Sh(R0\_T50\%)$ =709 nm, $\lambda Sh(R0\_T20\%)$=714 nm, and $\lambda Sh(R0\_T10\%)$ =718 nm. Further, in the specimen, wavelengths with which transmittance becomes 50%, 20% and 10% with respect to s polarized light at an incident angle of 30 degrees were $\lambda Sh(R30\_Ts50\%)$=674 nm, $\lambda Sh(R30\_Ts20\%)$=679 nm, and $\lambda Sh(R30\_Ts10\%)$=682 nm.

(Formation of Dielectric Layers)

The glass substrate A having the dielectric multilayer film R obtained above was cleaned again for 20 minutes with the ultrasonic washing machine by using the hydrofluoroether-based solvent ASAHIKLIN (registered trademark) AE-3000 made by Asahi Glass Co., Ltd. On the surface opposite to the side of the glass substrate A having the dielectric multilayer film R obtained and cleaned above, dielectric layers constituted of two layers, a layer of 30 nm constituted of Al$_2$O$_3$ and a layer of 170 nm constituted of SiO$_2$, were formed in this order by using a vacuum deposition device. The refractive index of the formed layer constituted of Al$_2$O$_3$ was 1.60, and the refractive index of the formed layer constituted of SiO$_2$ was 1.45.

(Formation of a Near-Infrared Absorbing Layer)

In a 41.25 mass % cyclohexanone solution of a fluorene-ring containing polyester (made by Osaka Gas Chemicals Co. Ltd., product name: OKP-850, refractive index: 1.65) as a polyester resin, a squarylium-based dye (chemical compound (F11-2), $\lambda_{max}$: 717 nm (however, OKP-850 was used as a transparent resin at the time of measurement)) as an NIR absorbing dye was mixed by a ratio of 9 parts by mass relative to 100 parts by mass of the polyester resin, and a merocyanine-based dye (chemical compound (M-2), $\lambda_{max}$ (UV) measured by dissolving in dichloromethane: 396 nm, $\lambda_{L90}$–$\lambda_{L50}$:9 nm) as an ultraviolet absorber was mixed by a ratio of 4.5 parts by mass relative to 100 parts by mass of the polyester resin. Thereafter, it was stirred and dissolved at room temperature to obtain a coating liquid.

The obtained coating liquid was applied by a die coating method by using an applicator with a gap of 30 μm on a dielectric layer of the above-obtained glass substrate A having the dielectric multilayer film R and the dielectric layer on both main surfaces, and dried by heating at 100° C. for 5 minutes to form a near-infrared absorbing layer with a film thickness of 800 nm, thereby obtaining a stack in which the dielectric multilayer film R, the glass substrate A, the dielectric layer, and the near-infrared absorbing layer are stacked in this order.

Further, as a specimen for transmittance measurement of the NIR absorbing dye, a near-infrared absorbing layer was formed similarly to the above on one surface of the D263Teco substrate. In the obtained specimen, transmittance $T(\lambda_{max})$ of a near-infrared absorbing layer in which a reflection loss of the air interface was corrected was 0.2%. That is, since $T(\lambda_{Gmax})$=9%, $T(\lambda_{max})$=0.2%, it is in the relation of $T(\lambda_{Gmax})>T(\lambda_{max})$.

Note that wavelengths with which transmittance becomes 50%, 20%, and 10% on the short wavelength side of the wavelength $\lambda_{max}$ were λSh(D_T50%)=647 nm, λSh(D_T20%)=674 nm, and λSh(D_T10%)=682 nm. Further, wavelengths with which transmittance becomes 50%, 20%, and 10% on the long wavelength side of the wavelength $\lambda_{max}$ were λLo(D_T50%)=754 nm, λLo(D_T20%)=746 nm, and λLo(D_T10%)=743 nm.

Thus, in the dielectric multilayer film obtained with this design, the wavelength λSh(R0_T50%)=709 nm, and the wavelength λSh(R30_Ts50%)=674 nm, and in the near-infrared absorbing layer, the wavelength λSh(D_T20%)=674 nm, and the wavelength λLo(D_T20%)=746 nm. Therefore, the design satisfies the relation of the formula (1), λSh(D_T20%)≤λSh(R30_Ts50%)<λSh(R0_T50%)≤λLo(D_T20%). That is, this design achieved transmission of 10% or less with respect to light at an incident angle of 0 to 30 degrees in a wavelength of from 674 to 709 nm.

Further, this design also satisfies the condition corresponding to X=10, Y=20 of the formula (3) since λSh(R30_Ts10%)=682 nm and λSh(R0_T10%)=718 nm. That is, this design achieved transmission of 2% or less with respect to light at an incident angle of 0 to 30 degrees in a wavelength of from 682 to 718 nm.

(Formation of an Anti-Reflection Film (Dielectric Multilayer Film with a Low Reflective Property) as a Second Dielectric Multilayer Film)

On the near-infrared absorbing layer of the stack obtained above, an anti-reflection film with respect to visible light (dielectric multilayer film with a low reflective property) (hereinafter referred to as a "dielectric multilayer film AR") was formed as a second dielectric multilayer film with 7 layers in total (total layer thickness: 340 nm), in which low-refractive index films and high-refractive index films were alternately formed beginning with a low-refractive index film by using the IAD vacuum deposition device. Note that $TiO_2$ was used as the high-refractive index material, and $SiO_2$ was used as the low-refractive index material. Thus, the NIR filter A of Example 1 was obtained.

Regarding the NIR filter A, with respect to the surface opposite to the surface of the glass substrate A on which the dielectric layers, the near-infrared absorbing layer, and the dielectric multilayer film AR were formed, the dielectric multilayer film R formed on this surface was removed by using a sandblast, and a black resin was applied, thereby producing a specimen for reflectance measurement in which positive reflection of this surface is lowered to the degree that it can be ignored. In this specimen, reflectance on the surface of the dielectric multilayer film AR was measured when the surface of the dielectric multilayer film AR was irradiated with light with a wavelength of from 430 to 600 nm at an incident angle of 5 degrees, and the maximum reflectance was 1.15%.

(Evaluation of the NIR Filter)

In the NIR filter A produced above, transmittance at an incident angle of 0 degree, 30 degrees, 31 degrees, 40 degrees, 50 degrees, and 60 degrees were measured. From measurement results, the following optical properties were obtained.

Figure 6:
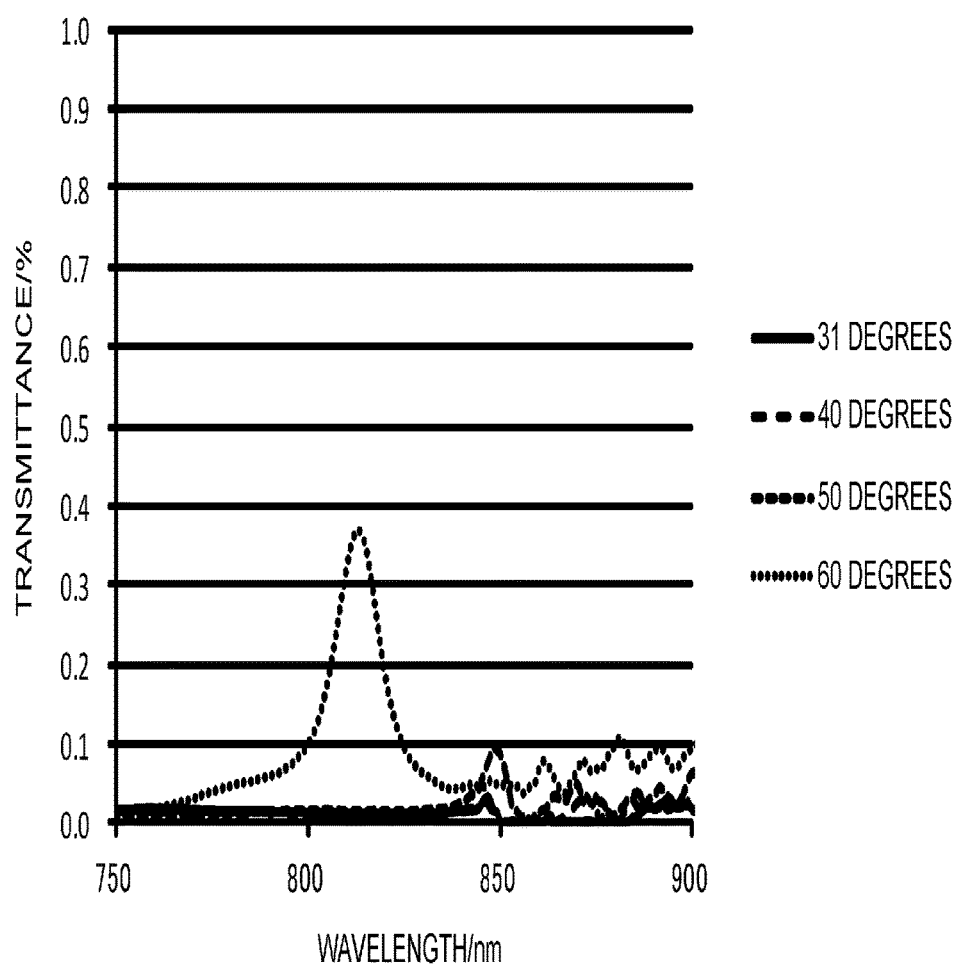
FIG. 6 is a chart illustrating a difference of a transmission spectrum when the near-infrared cut filter of the example is irradiated with light at a changed incident angle (31 to 60 degrees).

The maximum value of transmittance with respect to light at an incident angle of 31 to 60 degrees with a wavelength of from 775 to 900 nm of the NIR filter A produced above was 0.37%. Note that FIG. 6 illustrates transmittance with respect to light at an incident angle of 31 degrees, 40 degrees, 50 degrees, and 60 degrees with a wavelength of from 750 to 900 nm of the NIR filter A.

Figure 7A:
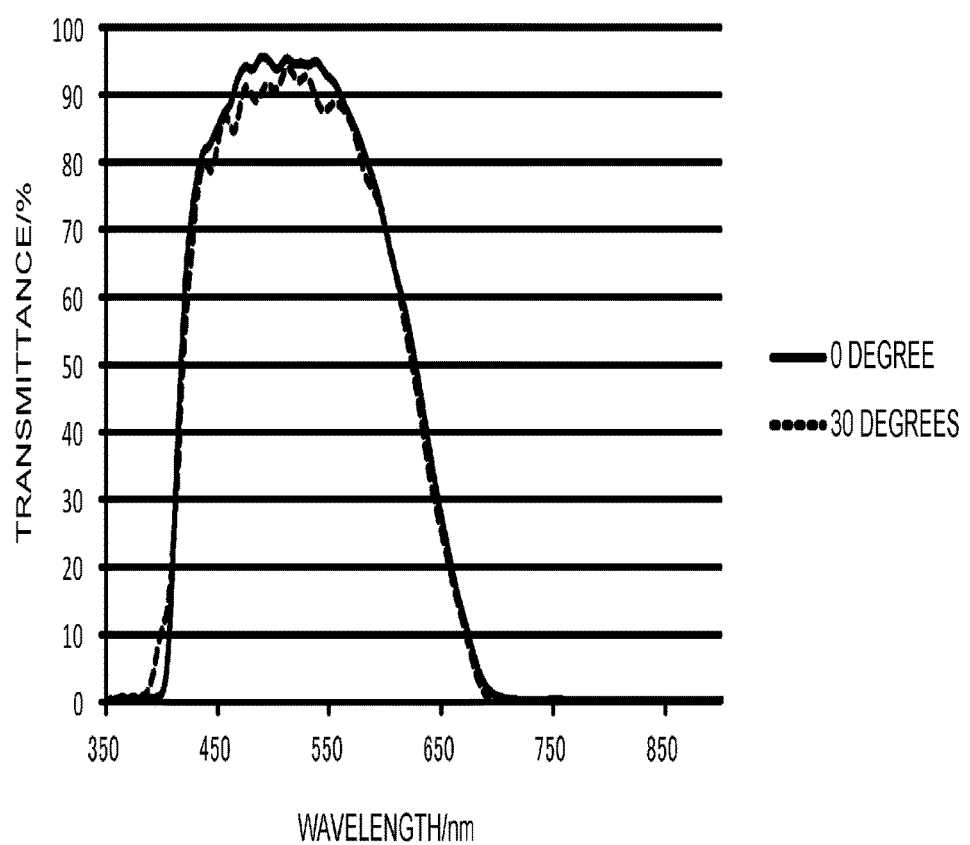
FIG. 7A is a chart illustrating a difference in transmission spectrum when the near-infrared cut filter of the example is irradiated with light at a changed incident angle (0 degree, 30 degrees).
Figure 7B:
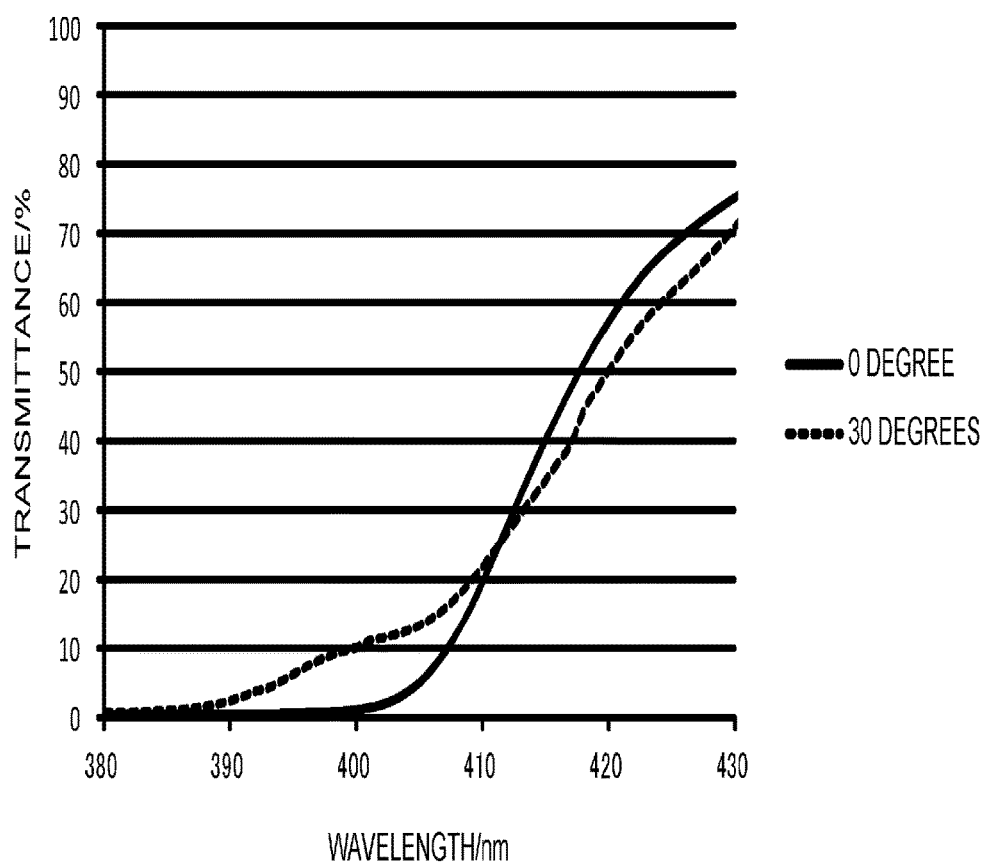
FIG. 7B is a chart illustrating a difference in transmission spectrum when the near-infrared cut filter of the example is irradiated with light at a changed incident angle (0 degree, 30 degrees).
Figure 7C:
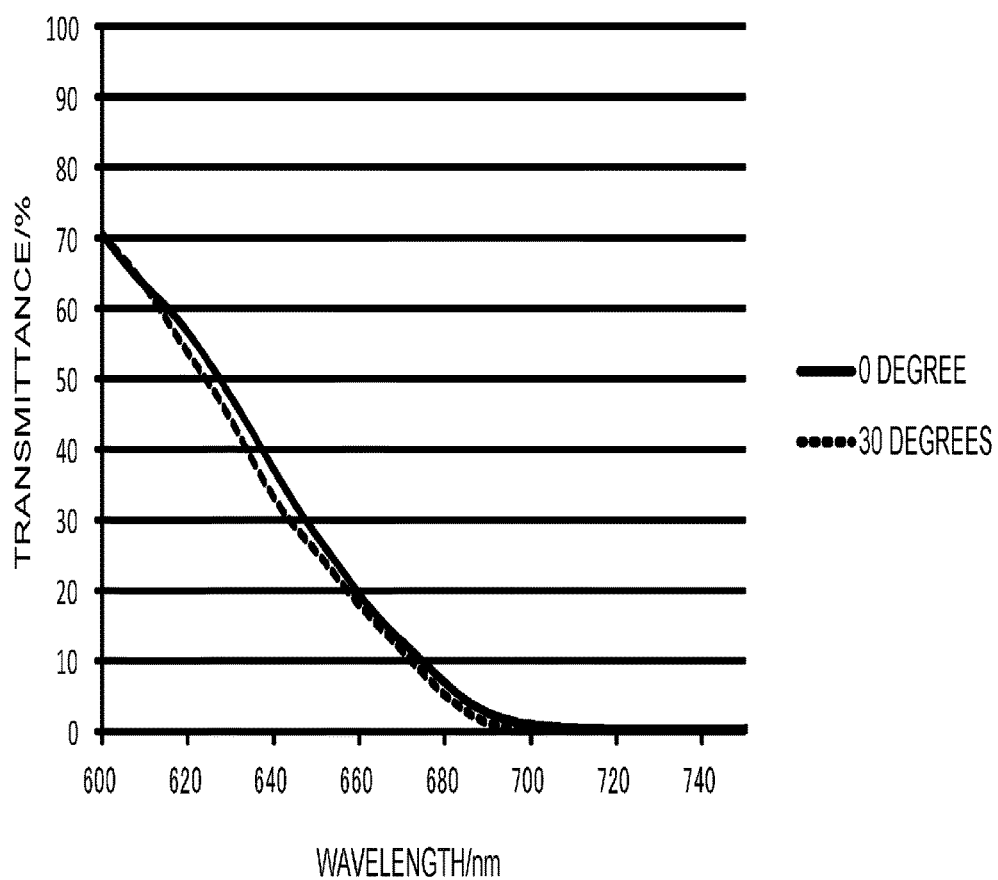
FIG. 7C is a chart illustrating a difference in transmission spectrum when the near-infrared cut filter of the example is irradiated with light while at a changed incident angle (0 degree, 30 degrees).

FIG. 7A to FIG. 7C illustrate results of measurement of transmittance at incident angles of 0 degree and 30 degrees of the NIR filter A. FIG. 7A illustrates a measurement result with a wavelength of from 350 to 900 nm, FIG. 7B illustrates a measurement result with a wavelength of from 380 to 430 nm, and FIG. 7C illustrates a measurement result with a wavelength of from 600 to 750 nm.

The average value of transmittance with respect to light at an incident angle of 0 degree in a wavelength of from 450 to 550 nm of the produced NIR filter A was 92.0%. The average value of transmittance with respect to light at an incident angle of 0 degree in a wavelength of from 650 to 720 nm of the produced NIR filter A was 7.9%.

The NIR filter A produced above had, in the region of a wavelength longer than a wavelength of 600 nm, a wavelength $\lambda_0$(NIR) with which transmittance of light at an incident angle of 0 degree becomes 50% and a wavelength $\lambda_{30}$(NIR) with which transmittance of light at an incident angle of 30 degrees becomes 50%, and the absolute value of the difference between the wavelengths $|\lambda_0(NIR)-\lambda_{30}(NIR)|$ was 2.3 nm. The average value of the absolute value of the difference between transmittance with respect to light at an incident angle of 0 degree and transmittance with respect to light at an incident angle of 30 degrees in a wavelength of from 600 to 750 nm of the produced NIR filter A was 1.8%.

The average value of transmittance with respect to light at an incident angle of 0 degree in a wavelength of from 430 to 450 nm of the produced NIR filter A was 81.2%. The average value of transmittance with respect to light at an incident angle of 0 degree in a wavelength of from 350 to 390 nm of the produced NIR filter A was 0.2%.

The NIR filter A produced above had, in the region of a wavelength shorter than a wavelength of 450 nm, a wavelength $\lambda_0$(UV) with which transmittance of light at an incident angle of 0 degree becomes 50% and a wavelength $\lambda_{30}$(UV) with which transmittance of light at an incident angle of 30 degrees becomes 50%, and the absolute value of the difference between the wavelengths $|\lambda_0(UV)-\lambda_{30}(UV)|$ was 1.5 nm. The average value of the absolute value of the difference between transmittance with respect to light at an incident angle of 0 degree and transmittance with respect to light at an incident angle of 30 degrees in a wavelength of from 380 to 430 nm of the produced NIR filter A was 4.5%.

Further, in the NIR filter A, λ(T85%), λ(T45%) and λ(T5%) with which transmittance becomes 85%, 45% and 5% with respect to light at incident angles of 0 degree and 30 degrees in a wavelength of from 550 to 720 nm were as follows. λ(T85%), λ(T45%) and λ(T5%) with respect to light at an incident angle of 0 degree were 574 nm, 633 nm and 683 nm, respectively. Further, λ(T85%), λ(T45%) and λ(T5%) with respect to light at incident angles of 30 degrees were 572 nm, 630 nm and 680 nm, respectively. From the above results, in the NIR filter A, {λ(T45%)−λ(T85%)}=58 to 59 nm and {λ(T5%)−λ(T45%)}=50 to 51 nm, which satisfy the formula (2).

The NIR filter A produced above was used to produce a solid-state imaging device, and an image was taken while allowing intense light to be incident from part of the visual field. No disturbance of image which is conceivably due to stray light was confirmed in the obtained image.

Example 2

In Example 1, an NIR filter B (Example 2) was produced under the same conditions as Example 1 except that NF-50TX used as the near-infrared absorbing glass substrate was replaced with a fluorophosphate glass substrate NF-50T (hereinafter referred to as a "glass substrate B") made by Asahi Glass Co., Ltd. of 76 mm×76 mm×0.30 mmt.

Note that in the glass substrate B cleaned in the same manner as in Example 1, absorptance at an incident angle of 0 degree of light with a wavelength of from 775 to 900 nm was measured by using the spectrophotometer U4100 made by Hitachi High-Tech Science Corporation, and the result was were 89.6 to 91.1%.

Evaluation of all optical properties of the obtained NIR filter B was performed in the same manner as in Example 1 by using the spectrophotometer U4100 made by Hitachi High-Tech Science Corporation. Results are as follows.

Regarding the NIR filter B, with respect to the surface opposite to the surface of the glass substrate B on which the dielectric layers, the near-infrared absorbing layer, and the dielectric multilayer film AR were formed, the dielectric multilayer film R formed on this surface was removed by using a sandblast, and a black resin was applied, thereby producing a specimen for reflectance measurement in which positive reflection of this surface is lowered to the degree that it can be ignored. In this specimen, reflectance on the surface of the dielectric multilayer film AR was measured when the surface of the dielectric multilayer film AR was irradiated with light with a wavelength of from 430 to 600 nm at an incident angle of 5 degrees, and the maximum reflectance was 1.1%.

The maximum value of transmittance with respect to light at an incident angle of 31 to 60 degrees in a wavelength of from 775 to 900 nm of the NIR filter B produced above was 0.15%. The average value of transmittance with respect to light at an incident angle of 0 degree in a wavelength of from 450 to 550 nm of the produced NIR filter B was 91.5%. The average value of transmittance with respect to light at an incident angle of 0 degree in a wavelength of from 650 to 720 nm of the produced NIR filter B was 6.5%.

The NIR filter B produced above had, in the region of a wavelength longer than a wavelength of 600 nm, a wavelength $\lambda_0(NIR)$ with which transmittance of light at an incident angle of 0 degree becomes 50% and a wavelength $\lambda_{30}(NIR)$ with which transmittance of light at an incident angle of 30 degrees becomes 50%, and the absolute value of the difference between the wavelengths $|\lambda_0(NIR)-\lambda_{30}(NIR)|$ was 2.4 nm. The average value of the absolute value of the difference between transmittance with respect to light at an incident angle of 0 degree and transmittance with respect to light at an incident angle of 30 degrees in a wavelength of from 600 to 750 nm of the produced NIR filter B was 1.9%.

The average value of transmittance with respect to light at an incident angle of 0 degree in a wavelength of from 430 to 450 nm of the produced NIR filter B was 82.7%. The average value of transmittance with respect to light at an incident angle of 0 degree in a wavelength of from 350 to 390 nm of the produced NIR filter B was 0.1%.

The NIR filter B produced above had, in the region of a wavelength shorter than a wavelength of 450 nm, a wavelength $\lambda_0(UV)$ with which transmittance of light at an incident angle of 0 degree becomes 50% and a wavelength $\lambda_{30}(UV)$ with which transmittance of light at an incident angle of 30 degrees becomes 50%, and the absolute value of the difference between the wavelengths $|\lambda_0(UV)-\lambda_{30}(UV)|$ was 1.6 nm. The average value of the absolute value of the difference between transmittance with respect to light at an incident angle of 0 degree and transmittance with respect to light at an incident angle of 30 degrees in a wavelength of from 380 to 430 nm of the produced NIR filter B was 4.6%.

The NIR filter B produced above was used to produce a solid-state imaging device, and an image was taken while allowing intense light to be incident from part of the visual field. No disturbance of image which is conceivably due to stray light was confirmed in the obtained image.

The NIR filters according to the present invention have a good near-infrared blocking property and hence are useful for an imaging device such as a digital still camera, a display device such as a plasma display, a window glass for vehicle (such as automobile), lamp, and the like.

What is claimed is:

1. A near-infrared cut filter comprising:
 a stack comprising:
  a near-infrared absorbing glass substrate; and
  a near-infrared absorbing layer provided on at least one main surface of the near-infrared absorbing glass substrate and comprising a near-infrared absorbing dye and a transparent resin; and
 a dielectric multilayer film provided on at least one main surface of the stack, wherein
 the near-infrared absorbing glass substrate has a maximum absorption wavelength $\lambda_{Gmax}$ in a wavelength of from 775 to 900 nm in an absorption spectrum of a wavelength of from 400 to 1100 nm at an incident angle of 0 degree,
 the near-infrared absorbing dye has a maximum absorption wavelength $\lambda_{max}$ at a wavelength of from 650 to 750 nm,
 the dielectric multilayer film has a near-infrared reflective property,
 transmittance $\lambda(\lambda_{max})$ in $\lambda_{max}$ of the near-infrared absorbing layer is lower than transmittance $T(\lambda_{Gmax})$ in $\lambda_{Gmax}$ of the near-infrared absorbing glass,
 transmittance $T(\lambda_{max})$ of the near-infrared absorbing layer is 5% or less,
 transmittance $T(\lambda_{Gmax})$ of the near-infrared absorbing glass substrate is 50% or less,
 the dielectric multilayer film has a near-infrared reflecting band in which average transmittance of light with a wavelength of from 430 to 660 nm is 90% or more, and in which transmittance is 20% or less in a wavelength of from 700 to 1200 nm,
 an average value of the near-infrared cut filter of transmittance of light with a wavelength of 450 to 550 nm is 80% or more, and
 maximum transmittance of the near-infrared cut filter at an incident angle of 31 to 60 degrees with respect to light with a wavelength of from 775 to 900 nm is 50% or less.

2. The near-infrared cut filter according to claim 1, wherein the near-infrared absorbing glass substrate has absorptance at an incident angle of 0 degree with respect to light with a wavelength of from 775 to 900 nm of 75% or more.

3. The near-infrared cut filter according to claim 1, wherein the dielectric multilayer film comprises a dielectric multilayer film with a near-infrared reflective property, the film having maximum transmittance of 1% or less at an incident angle of 0 degree with respect to light with a wavelength of from 800 to 900 nm, and maximum transmittance of 3% or more at an incident angle of 31 to 60 degrees with respect to light with a wavelength of from 775 to 900 nm.

4. The near-infrared cut filter according to claim 3, wherein the near-infrared absorbing layer is provided on one main surface of the near-infrared absorbing glass substrate, and the dielectric multilayer film with a near-infrared reflective property is provided on another main surface of the near-infrared absorbing glass substrate.

5. The near-infrared cut filter according to claim 1, wherein $$\lambda Sh(D\_T20\%) \leq \lambda Sh(R30\_Ts50\%) \leq \lambda Sh(R0\_T50\%) \leq \lambda Lo(D\_T20\%) \qquad \text{Formula (1)}$$

is satisfied,
provided that a wavelength with which transmittance of light at an incident angle of 0 degree becomes 50% on a short wavelength side of the near-infrared reflecting band of the dielectric multilayer film is $\lambda Sh$ (R0_T50%), a wavelength with which transmittance of s polarization component becomes 50% in light at an incident angle of 30 degrees is $\lambda Sh$(R30_Ts50%), a wavelength with which transmittance becomes 20% on a short wavelength side of the $\lambda_{max}$ of the near-infrared absorbing layer is $\lambda Sh$(D_T20%), and a wavelength with which transmittance becomes 20% on a long wavelength side of the $\lambda_{max}$ is $\lambda Lo$(D_T20%).

6. The near-infrared cut filter according to claim 1, wherein wavelength $\lambda$(T85%), wavelength $\lambda$(T45%), and wavelength $\lambda$(T5%) with which transmittance of light at an incident angle of 0 degree in a wavelength of from 550 to 720 nm becomes 85%, 45%, and 5%, respectively, satisfy $$\{\lambda(T45\%)-\lambda(T85\%)\} \geq \{\lambda(T5\%)-\lambda(T45\%)\} \qquad \text{Formula (2).}$$

7. The near-infrared cut filter according to claim 1, wherein on the at least one main surface of the near-infrared absorbing glass substrate, reflectance at an incident angle of 5 degree with respect to light with a wavelength of from 430 to 600 nm is 2% or less, which is measured excluding reflection on an interface and a surface opposite to the at least one main surface of the near-infrared absorbing glass substrate.

8. The near-infrared cut filter according to claim 1, wherein the dielectric multilayer film is provided on the near-infrared absorbing layer, and has dielectric film in contact with the near-infrared absorbing layer, and a refractive index of the dielectric film is 1.4 or more and 1.7 or less.

9. The near-infrared cut filter according to claim 1, having a wavelength $\lambda_0$(NIR) with which transmittance at an incident angle of 0 degree becomes 50% and a wavelength $\lambda_{30}$(NIR) with which transmittance at an incident angle of 30 degrees becomes 50% in a region of a wavelength longer than 600 nm, wherein an absolute value of a difference between the wavelengths $|\lambda_0(\text{NIR})-\lambda_{30}(\text{NIR})|$ is 5 nm or less.

10. The near-infrared cut filter according to claim 1, wherein an average value of an absolute value of a difference between transmittance at an incident angle of 0 degree and transmittance at an incident angle of 30 degrees is 3% or less in light with a wavelength of from 600 to 750 nm.

11. The near-infrared cut filter according to claim 1, wherein the near-infrared absorbing dye comprises at least one selected from the group consisting of a cyanine-based compound, a phthalocyanine-based compound, a naphthalocyanine-based compound, a dithiol metal complex-based compound, a diimonium-based compound, a polymethine-based compound, a phthalide compound, a naphthoquinone-based compound, an anthraquinone-based compound, an indophenol-based compound and a squarylium-based compound.

12. The near-infrared cut filter according to claim 1, further comprising an ultraviolet absorbing layer comprising an ultraviolet absorber and a transparent resin, wherein an average value of transmittance of the near-infrared cut filter at an incident angle of 0 degree is 70% or more in a wavelength of from 430 to 450 nm, and an average value of transmittance of the near-infrared cut filter at an incident angle of 0 degree is 5% or less in a wavelength of from 350 to 390 nm.

13. A solid-state imaging device comprising the near-infrared cut filter according to claim 1 and an optical member comprising a solid-state image sensing device, wherein the near-infrared cut filter and the solid-state image sensing device are disposed in order from a side of object of shooting or a side through which light from a light source enters.

14. A near-infrared cut filter comprising:
a stack comprising:
a near-infrared absorbing glass substrate;
a near-infrared absorbing layer provided on at least one main surface of the near-infrared absorbing glass substrate and comprising a near-infrared absorbing dye and a transparent resin; and
a dielectric layer with a thickness of 5 nm or more provided between the near-infrared absorbing glass substrate and the near-infrared absorbing layer; and
a dielectric multilayer film provided on at least one main surface of the stack, wherein
the dielectric layer comprises an alkali barrier film comprising at least one material selected from $SiO_2$, $SiO_x$ (where $0.8 \leq x < 2$) and $Al_2O_3$ and
maximum transmittance of the near-infrared cut filter at an incident angle of 31 to 60 degrees with respect to light with a wavelength of from 775 to 900 nm is 50% or less.

15. A near-infrared cut filter comprising:
a stack comprising:
a near-infrared absorbing glass substrate;
a near-infrared absorbing layer provided on at least one main surface of the near-infrared absorbing glass substrate and comprising a near-infrared absorbing dye and a transparent resin; and
a dielectric layer with a thickness of 5 nm or more provided between the near-infrared absorbing glass substrate and the near-infrared absorbing layer; and
a dielectric multilayer film provided on at least one main surface of the stack, wherein
the dielectric layer has an adhesive film provided on the near-infrared absorbing glass substrate side and an alkali barrier film provided on the near-infrared absorbing layer side,
the adhesive film comprises $Al_2O_3$, and the alkali barrier film comprises $SiO_2$ or $SiO_x$ (where $0.8 \leq x < 2$), and maximum transmittance of the near-infrared cut filter at an incident angle of 31 to 60 degrees with respect to light with a wavelength of from 775 to 900 nm is 50% or less.

16. A near-infrared cut filter comprising:
a stack comprising:
   a near-infrared absorbing glass substrate; and
   a near-infrared absorbing layer provided on at least one main surface of the near-infrared absorbing glass substrate and comprising a near-infrared absorbing dye, an ultraviolet absorber, and a transparent resin; and
a dielectric multilayer film provided on at least one main surface of the stack, wherein
an average value of transmittance of the near-infrared cut filter at an incident angle at 0 degree is 70% or more in a wavelength of from 430 to 450 nm,
an average value of transmittance of the near-infrared cut filter at an incident angle at 0 degree is 5% or less in a wavelength of from 350 to 390 nm, and
the ultraviolet absorber satisfies requirements (iv-1) and (iv-2):
(iv-1) the ultraviolet absorber has at least one maximum absorption wavelength in a region of a wavelength of 415 nm or less in a light absorption spectrum of a wavelength of from 350 to 800 nm measured after dissolved in dichloromethane, and a longest maximum absorption wavelength $\lambda_{max}(UV)$ having a longest wavelength among the at least one maximum absorption wavelength is in a wavelength of from 360 to 415 nm; and
(iv-2) when transmittance in the longest maximum absorption wavelength $\lambda_{max}(UV)$ is 10% in a spectral transmittance curve measured after dissolved in dichloromethane, a difference $\lambda_{L90}-\lambda_{L50}$ between a wavelength $\lambda_{L90}$ and a wavelength $\lambda_{L50}$ is 13 nm or less, provided that $\lambda_{L90}$ is a wavelength with which transmittance becomes 90% in a region of a wavelength longer than the longest maximum absorption wavelength $\lambda_{max}(UV)$ and $\lambda_{L50}$ is a wavelength with which transmittance becomes 50% in a region of a wavelength longer than the longest maximum absorption wavelength $\lambda_{max}(UV)$.

17. The near-infrared cut filter according to claim 16, wherein the ultraviolet absorber comprises at least one selected from the group consisting of oxazole-based dye, merocyanine-based dye, cyanine-based dye, naphthalimide-based dye, oxadiazole-based dye, oxazine-based dye, oxazolidine-based dye, naphthalic acid-based dye, styryl-based dye, anthracene-based dye, cyclic carbonyl-based dye and triazole-based dye.

18. The near-infrared cut filter according to claim 16, having a wavelength $\lambda_0(UV)$ with which transmittance of light at an incident angle of 0 degree becomes 50% and a wavelength $\lambda_{30}(UV)$ with which transmittance of light at an incident angle of 30 degrees becomes 50% in a region of a wavelength shorter than 450 nm, wherein an absolute value of a difference between the wavelengths $|\lambda_0(UV)-\lambda_{30}(UV)|$ is 5 nm or less.

19. The near-infrared cut filter according to claim 16, wherein an average of absolute value of the difference between transmittance of light at an incident angle of 0 degree and transmittance of light at an incident angle of 30 degrees is 8% or less in a wavelength of from 380 to 430 nm.

* * * * *